(12) United States Patent
Ishitsuka et al.

(10) Patent No.: US 10,566,105 B2
(45) Date of Patent: Feb. 18, 2020

(54) METHOD FOR PRODUCING CHARGE TRANSPORT FILM

(75) Inventors: Kenichi Ishitsuka, Tsukuba (JP); Shigeaki Funyuu, Tsuchiura (JP); Yousuke Hoshi, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 13/642,522

(22) PCT Filed: Apr. 20, 2011

(86) PCT No.: PCT/JP2011/059711
§ 371 (c)(1),
(2), (4) Date: Oct. 20, 2012

(87) PCT Pub. No.: WO2011/132702
PCT Pub. Date: Oct. 27, 2011

(65) Prior Publication Data
US 2013/0037753 A1 Feb. 14, 2013

(30) Foreign Application Priority Data
Apr. 22, 2010 (JP) .................................. 2010-099035

(51) Int. Cl.
*H01L 51/00* (2006.01)
*H01B 1/12* (2006.01)
(Continued)

(52) U.S. Cl.
CPC .............. *H01B 1/122* (2013.01); *C08K 5/42* (2013.01); *C08K 5/435* (2013.01); *C08L 65/00* (2013.01);
(Continued)

(58) Field of Classification Search
CPC ...................................... H01B 1/12
(Continued)

(56) References Cited

U.S. PATENT DOCUMENTS 3,820,999 A * 6/1974 Tsuji et al. .............. C08F 20/60
430/227
4,031,036 A * 6/1977 Koshar ......................... 526/220
(Continued)

FOREIGN PATENT DOCUMENTS

CN      1930921 A     3/2007
CN    101578719    11/2009
(Continued)

OTHER PUBLICATIONS

JP2001-264991, machine translation.*
(Continued)

*Primary Examiner* — William D Young
(74) *Attorney, Agent, or Firm* — Fitch, Even, Tabin & Flannery, L.L.P.

(57) ABSTRACT

Disclosed is an organic electronic material comprising charge transporting compounds and ionic compounds having electron-accepting properties and high solubility in a solvent. The organic electronic material is characterized by comprising charge transporting compounds and ionic compounds, and in that at least one of the ionic compounds is any one kind of compounds represented by general formulas (1b)-(3b). (In the formulas $Y^1$-$Y^6$ each independently represent a divalent linking group, $R^1$-$R^6$ each independently represent an electron-attracting organic substituent (these structures can further have substituents and hetero-atoms, and $R^1$, $R^2$ and $R^3$, or, $R^4$-$R^6$ can respectively combine and become a ring shape or a polymer shape) and $L^+$ represents a monovalent cation.)

$$L^+ \ [O-Y^1-R^1]^- \quad (1b)$$

(Continued)

-continued

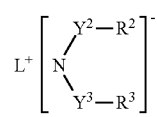 (2b)

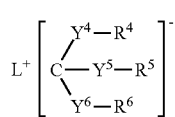

(3b)

6 Claims, 1 Drawing Sheet

(51) Int. Cl.
C08K 5/435 (2006.01)
C08L 65/00 (2006.01)
C08K 5/42 (2006.01)
C09D 11/52 (2014.01)
H01L 51/50 (2006.01)

(52) U.S. Cl.
CPC .......... C09D 11/52 (2013.01); H01L 51/0039 (2013.01); H01L 51/0043 (2013.01); C08G 2261/1412 (2013.01); C08G 2261/1644 (2013.01); C08G 2261/3142 (2013.01); C08G 2261/3162 (2013.01); C08G 2261/411 (2013.01); C08G 2261/512 (2013.01); C08G 2261/5222 (2013.01); C08G 2261/76 (2013.01); C08G 2261/95 (2013.01); H01L 51/0085 (2013.01); H01L 51/5016 (2013.01); H01L 51/5036 (2013.01); H01L 51/5048 (2013.01); H01L 2251/308 (2013.01)

(58) Field of Classification Search
USPC ...................................................... 252/500
See application file for complete search history.

(56) References Cited

U.S. PATENT DOCUMENTS

| | | | | |
|---|---|---|---|---|
| 4,069,055 | A * | 1/1978 | Crivello | C07C 381/12 430/280.1 |
| 4,250,311 | A * | 2/1981 | Crivello | C07F 9/902 546/9 |
| 4,983,481 | A * | 1/1991 | Yu | G03G 5/10 430/123.43 |
| 5,518,824 | A * | 5/1996 | Funhoff et al. | 428/690 |
| 5,554,664 | A * | 9/1996 | Lamanna | C08F 2/50 522/25 |
| 6,008,265 | A * | 12/1999 | Vallee et al. | 522/25 |
| 6,008,267 | A | 12/1999 | Vallee et al. | |
| 7,618,683 | B2 * | 11/2009 | Tsuchimura | C09D 11/101 427/466 |
| 2007/0207341 | A1 | 9/2007 | Iida et al. | |
| 2009/0269688 | A1 * | 10/2009 | Yoshimoto | C07C 251/22 430/58.15 |
| 2010/0090590 | A1 | 4/2010 | Ogata et al. | |

FOREIGN PATENT DOCUMENTS

| | | |
|---|---|---|
| EP | 1501337 A1 | 1/2005 |
| EP | 1679336 A1 | 7/2006 |
| EP | 1725079 A1 | 11/2006 |
| GB | 2460402 A | 12/2009 |
| JP | 57-209931 A | 12/1982 |
| JP | 60-203628 A | 10/1985 |
| JP | 2-043202 | 2/1990 |
| JP | 2-268173 A | 11/1990 |
| JP | 4-327574 A | 11/1992 |
| JP | 5-105692 A | 4/1993 |
| JP | 5-132461 A | 5/1993 |
| JP | 5-222111 A | 8/1993 |
| JP | 5-222112 A | 8/1993 |
| JP | 5-255256 A | 10/1993 |
| JP | 5-262813 A | 10/1993 |
| JP | 6-157624 A | 6/1994 |
| JP | 7 043854 | 2/1995 |
| JP | 7-043901 | 2/1995 |
| JP | 7-082283 | 3/1995 |
| JP | 7-109303 A | 4/1995 |
| JP | 2519480 B2 | 7/1996 |
| JP | 9-202873 A | 8/1997 |
| JP | 9-221652 A | 8/1997 |
| JP | 9-328507 A | 12/1997 |
| JP | 10-101718 A | 4/1998 |
| JP | 10-226658 | 8/1998 |
| JP | 10-226707 | 8/1998 |
| JP | H11-501909 A | 2/1999 |
| JP | 11-251067 A | 9/1999 |
| JP | 11-283750 | 10/1999 |
| JP | 2001-264991 * | 1/2001 |
| JP | 2002-139836 | 5/2002 |
| JP | 2002-202601 | 7/2002 |
| JP | 2002-214768 | 7/2002 |
| JP | 2003-031365 | 1/2003 |
| JP | 2003-215791 | 7/2003 |
| JP | 3748491 B2 | 2/2006 |
| JP | 2006-233162 | 9/2006 |
| JP | 2007-059320 | 3/2007 |
| JP | 2007-119763 | 5/2007 |
| JP | 2007-238777 A | 9/2007 |
| JP | 3985020 B2 | 10/2007 |
| JP | 4023204 B2 | 12/2007 |
| JP | 2008-214330 A | 9/2008 |
| JP | 2008-227483 A | 9/2008 |
| JP | 2008-256754 | 10/2008 |
| JP | 2009-242391 A | 10/2009 |
| JP | 2009-267392 A | 11/2009 |
| JP | 2010-034496 A | 2/2010 |
| JP | 2011-504650 A | 2/2011 |
| JP | 2011-516695 A | 5/2011 |
| JP | 6064892 B2 | 1/2017 |
| WO | WO 03/094578 A1 | 11/2003 |
| WO | WO 2005/042621 A1 | 5/2005 |
| WO | WO 2005/089024 A1 | 9/2005 |
| WO | WO 2005089024 A1 | 9/2005 |
| WO | WO 2008/010487 A1 | 1/2008 |
| WO | WO 2008/099926 A1 | 8/2008 |
| WO | 2009/049744 | 4/2009 |
| WO | 2009/049744 A1 | 4/2009 |
| WO | 2009/126918 A1 | 10/2009 |

OTHER PUBLICATIONS

Kunida et al, JP-2001-264991, machine translation provided by applicant.*
Office Action from the Korean Patent Office in the counterpart application No. 10-2012-7028465 dated Jan. 23, 2014, 10 pages in Korean with 16 pages of English translation.
International Search Report, issued from the International Bureau, in corresponding International Application No. PCT/JP2011/059711, dated Jul. 5, 2011, 2 pages in Japanese and 4 pages in its English translation.
Office Action from the Japanese Patent Office in counterpart Japanese Patent Application No. 2012-511683, dated Oct. 29, 2013, 3 pages in Japanese with 6 pages of English translation.
Y. Goto et al., "All-Wet-Process Organic Electroluminescent Device Using Electron Transporting and Alcohol-Soluble Organic Semiconductor," IDW '04 Proceedings of the 11th International Display Workshop, 2004, pp. 1343-1346.
H. Yan et al., "High-Performance Hole-Transport Layers for Polymer Light-Emitting Diodes. Implementation of Organosiloxane Cross-Linking Chemistry in Polymeric Electroluminescent Devices," J. Am. Chem. Soc. 2005, vol. 127, pp. 3172-3183.

(56) References Cited

OTHER PUBLICATIONS

E. Bacher et al., "Synthesis and Characterization of Photo-Cross-Linkable Hole-Conducting Polymers," Macromolecules, 2005, vol. 38, pp. 1640-1647.

M.S. Liu et al., "Thermally Cross-Linkable Hole-Transporting Materials for Improving Hole Injection in Multilayer Blue-Emitting Phosphorescent Polymer Light-Emitting Diodes," Macromolecules, 2008, vol. 41, pp. 9570-9580.

T. Hino et al., "Cationic Ring-Opening Polymerization of an Epoxide by Tropylium Salts as Thermal- and Photolatent Initiators," Journal of Polymer Science: Part A: Polymer Chemistry, 2004, vol. 42, pp. 2166-2170.

Preliminary Report on Patentability and Written Opinion of the International Searching Authority of International Application No. PCT/JP2011/059711 dated Dec. 20, 2012.

Office Action from Taiwanese Patent Office in counterpart Taiwanese Application No. 100114106, dated Oct. 7, 2013, pp. 1-6 in Taiwanese, pp. 1-6 in its English translation.

Chinese Official Action dated Sep. 11, 2014, for CN Application No. 201180020248.9.

Supplementary Partial European Search Report, dated Feb. 18, 2015 (5 pages), for EP App. No. 11772035.

Korean Official Action dated Nov. 6, 2014, for KR Application No. 10-2014-7020699.

Japanese Official Action dated Jun. 17, 2014, for JP Application No. 2012-511683.

Official Action dated Apr. 14, 2015, in the counterpart Japanese Application No. 2013-266953.

Communication dated Jun. 24, 2015, in connection with European Application No. 11772035.9.

Office Action dated Jul. 21, 2015, for Chinese Application No. 201180020248.9, with English language translation thereof; 16 pages.

Office Action dated Dec. 1, 2015, for Japanese Application No. 2013-266953, together with English language translation thereof.

Kim, TaeYoung, et al., Poly(3,4-ethylenedioxythiophene) Derived from Poly(ionic liquid) for the Use as a Hole-Injecting Material in Organic Light-Emitting Diodes, Macromolecular Rapid Communications, Germany, WILEY-VCH Verlag GmbH & Co., 2009, No. 30, pp. 1477-1482.

Office Action dated Jul. 5, 2016, for Japanese Application No. 2013-266953, together with English language translation thereof.

Notice of Reasons for Refusal dated Aug. 29, 2017, for Japanese Application No. 2016-182732, together with English language translation thereof.

* cited by examiner

METHOD FOR PRODUCING CHARGE TRANSPORT FILM

TECHNICAL FIELD

The present invention relates to an organic electronic material, a polymerization initiator and a thermal polymerization initiator, an ink composition, an organic thin film and a production method for the same, an organic electronic element, an organic electroluminescent element (hereinafter, also referred to as an organic EL element), a lighting device, a display element, and a display device.

BACKGROUND ART

An organic electronic element is an element which performs an electrical operation by using an organic substance, and is expected to be able to exhibit features such as energy saving, low price, and flexibility. Thus, organic electronic elements are attracting public attention as a technology that replaces conventional inorganic semiconductors containing silicon as a main component.

Examples of the organic electronic element include organic EL elements, organic photoelectric conversion elements, and organic transistors.

Among the organic electronic elements, attention is being paid to organic EL elements for the application as a large-sized solid state light source, for example, as substitutes for incandescent lamps and gas filled lamps. Furthermore, attention is also paid to the organic EL elements as the most promising self-luminescent display devices that substitute liquid crystal displays (LCD) in the field of flat panel display (FPD), and thus productization of organic EL elements is underway.

In recent years, there has been attempt to use mixtures of charge transporting compounds and electron accepting compounds, for the purpose of improving the light emission efficiency and service life of organic EL elements.

For example, Patent Literature 1 discloses that an organic electroluminescent element capable of low voltage driving is obtained by mixing a hole transporting polymer compound with tris(4-bromophenylaminium hexachloroantimonate: TBPAH) as an electron accepting compound.

Furthermore, Patent Literature 2 discloses that a hole-transporting compound is used as a mixture with iron(III) chloride ($FeCl_3$) as an electron accepting compound by a vacuum deposition method.

Patent Literature 3 discloses a hole transporting polymer compound is mixed with tris(pentafluorophenyl)borane (PPB) as an electron accepting compound by a wet film forming method, and the mixture is used to form a hole injection layer.

As such, it is contemplated that it is important to produce a compound formed from a radical cation of a charge transporting compound and a counter anion, which is produced by mixing a charge transporting compound with an electron-accepting compound.

Furthermore, Patent Literature 4 discloses a composition containing a particular aminium cation radical as a composition for charge-transporting film.

However, these literatures do not describe the purport of utilizing the ionic compounds related to the present invention as an electron-accepting compound.

On the other hand, organic EL elements are roughly classified into two classes of low molecular weight type organic EL elements and polymer type organic EL elements, based on the materials used and the film forming method.

Polymer type organic EL elements are such that the organic materials are composed of polymeric materials, and the polymer type organic. EL elements are capable of simple film formation such as printing or inkjetting, as compared with low molecular weight type organic EL elements which require film formation in a vacuum system. Therefore, polymer type organic EL elements are elements that are indispensable for the large-screen organic EL display devices of the future.

Active research has been hitherto conducted in relation to low molecular weight organic EL elements as well as polymer type organic EL elements; however, low light emission efficiency and short element service life still remain as serious problems. As one measure to be taken to address these problems, low molecular weight type organic EL elements adopt multilayering.

FIG. 1 illustrates an example of a multilayered organic EL element. In FIG. 1, a layer that is in charge of light emission is designated as a light emitting layer 1, and when the organic EL element has other layers, a layer that is in contact with the positive electrode 2 is designated as a hole injection layer 3, while a layer that is in contact with the negative electrode 4 is designated as an electron injection layer 5. Furthermore, when another layer is present between the light emitting layer 1 and the hole injection layer 3, the layer is designated as a hole transport layer 6, and when another layer is present between the light emitting layer 1 and the electron injection layer 5, the layer is designated as an electron transport layer 7. Meanwhile, in FIG. 1, reference numeral 8 represents a substrate.

Since film formation is carried out by a vapor deposition method in a low molecular weight type organic EL element, multilayering can be easily achieved by performing vapor deposition while sequentially changing the compounds used. On the other hand, since film formation is carried out by using a wet process such as printing or inkjetting in a polymer type organic EL element, there is a problem that when an upper layer is applied, the lower layer is dissolved out. Therefore, multilayering in a polymer type organic EL element is difficult to achieve as compared in a low molecular weight organic EL element, and the effects of enhancing the light emission efficiency and improving the service life may not be obtained.

In order to cope with this problem, several methods have been hitherto proposed. One of them is a method of utilizing the difference in the solubility. For example, use can be made of an element having a two-layer structure composed of a hole injection layer formed from water-soluble poly-thiophene:polystyrenesulfonic acid (PEDOT:PSS), and a light emitting layer formed by using an aromatic organic solvent such as toluene. In this case, since the PEDOT:PSS layer is not dissolved in the aromatic solvent such as toluene, it is possible to produce a two-layer structure.

Furthermore, Non-Patent Literature 1 suggests an element having a three-layer structure utilizing compounds having greatly different solubilities.

Furthermore, Patent Literature 5 discloses an element having a three-layer structure in which a layer called interlayer layer is introduced on the PEDOT:PSS layer.

Also, in order to overcome such problems, Non-Patent Literatures 2 to 4 and Patent Literature 6 disclose methods of changing the solubility of compounds by utilizing a polymerization reaction of a siloxane compound, an oxetane group, a vinyl group or the like, and thereby insolubilizing the thin film in the solvent.

These methods for promoting multilayering are important; however, there are problems that when water-soluble PEDOT:PSS is used, it is necessary to remove any moisture remaining in the thin film, that when it is attempted to utilize the difference in solubility, there are limitations on the materials that can be used, or that the siloxane compound is unstable to moisture in air. Also there is a problem that the element characteristics are not satisfactory.

In order to utilize the polymerization reaction, it is necessary to add an appropriate polymerization initiator which undergoes reaction and degradation due to stimulation such as light or heat, and generates an acid, a base, a radical or the like.

Patent Literature 7, Patent Literature 8, and Patent Literature 9 disclose photoacid generators or initiators, each containing fluorine atoms.

However, these literatures lack descriptions on an organic electronic material which uses a photoacid generator or initiator containing fluorine atoms.

CITATION LIST

Patent Literature

Patent Literature 1: JP 3748491 B1
Patent Literature 2: JP 11-251067 A
Patent Literature 3: JP 4023204 B1
Patent Literature 4: JP 2006-233162 A
Patent Literature 5: JP 2007-119763 A
Patent Literature 6: WO 2008/010487
Patent Literature 7: JP 2003-215791 A
Patent Literature 8: JP 2009-242391 A
Patent Literature 9: JP 3985020 B1

Non-Patent Literature

Non-Patent Literature 1: Y. Goto, T. Hayashida, M. Noto, IDW '04 Proceedings of the 11$^{th}$ International Display Workshop, 1343-1346 (2004)
Non-Patent Literature 2: H. Yan, P. Lee, N. R. Armstrong, A. Graham, G. A. Evemenko, P. Dutta, T. J. Marks, J. Am. Chem. Soc., 127, 3172-4183 (2005)
Non-Patent Literature 3: E. Bacher, M. Bayerl, P. Rudati, N. Reckfuss, C. David, K. Meerholz, O, Nuyken, Macromolecules, 38, 1640 (2005)
Non-Patent Literature 4: M. S. Liu, Y. H. Niu, J. W. Ka, H. L. Yip, F. Huang, J. Luo, T. D. Wong, A. K. Y. Jen, Macromolecules, 41, 9570 (2008)

SUMMARY OF INVENTION

Technical Problem

For the purpose of increasing the efficiency of organic EL elements and lengthening the long-term service life of the elements, it is preferable to make the organic layers into a mutilayer system and to separate the functions of the respective layers. However, in order to make the organic layers into a multilayer system by using a wet process which allows easy film formation even for large-sized devices, it is necessary to prevent the lower layer from being dissolved at the time of forming an upper layer as described above. Thus, a change in the solubility in a solvent achieved by utilizing a polymerization reaction has been used.

Furthermore, in order to lower the driving voltage of the organic EL elements, attempts have been made to mix a charge transporting compound with an electron accepting compound, but the characteristics are still not satisfactory.

Furthermore, a significant number of electron accepting compounds have low solubility in solvents and are difficult to handle.

In view of the problems described above, it is an object of the present invention to provide an organic electronic materials which is capable of stably and easily forming a thin film or easily implementing multilayering of organic thin film layers, and is useful for enhancing the productivity for organic electronic elements, particularly polymer type organic EL elements; an ink composition containing the organic electronic material; and an organic thin film formed from the organic electronic material and the ink composition.

Furthermore, it is another object of the present invention to provide an organic electronic element, an organic EL element, a lighting device, and a display element, which all have a lower driving voltage and a longer light emission lifetime than the conventional elements.

Solution to Problem

The inventors of the present invention conducted a thorough investigation, and as a result, the inventors found that an organic electronic material containing charge transporting compounds and ionic compounds, a polymerization initiator containing an ionic compound, an ink composition containing the organic electronic material, and an organic thin film formed by using the organic electronic material or the ink composition, are useful for increasing the efficiency of an organic EL element and lengthening the long-term service life of the organic EL element, thus completing the present invention.

That is, the present invention is characterized by the following items (1) to (28).

(1) An organic electronic material comprising charge transporting compounds and ionic compounds, at least one of the ionic compounds being any one of compounds represented by the following formulas (1b) to (3b):

[Chemical Formula 1]

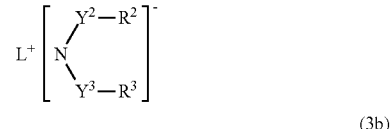

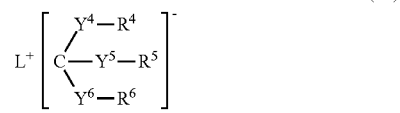

wherein $Y^1$ to $Y^6$ each independently represent a divalent linking group; $R^1$ to $R^6$ each independently represent an electron-withdrawing organic substituent (this substituent may further have a substituent or a heteroatom in the structure, and $R^1$, $R^2$ and $R^3$, or $R^4$ to $R^6$ may be respectively joined to form a ring form or a polymer form); and $L^+$ represents a monovalent cation.

(2) The organic electronic material according to the above item (1), wherein the ionic compounds each have a halogen atom.
(3) The organic electronic material according to the above item (1) or (2), wherein the ionic compounds each have one selected from the group consisting of a perfluoroalkyl group, a perfluoroalkylsulfonyl group, a perfluoroalkyloxysulfonyl group, a perfluoroarylsulfonyl group, a perfluoroaryloxysulfonyl group, a perfluoroacyl group, a perfluoroalkoxycarbonyl group, a perfluoroacyloxy group, a perfluoroaryloxycarbonyl group, a perfluoroalkenyl group and a perfluoroalkynyl group, each of which may be linear chain, branched or cyclic, with 1 to 20 carbon atoms, and may contain a heteroatom.
(4) The organic electronic material according to any one of the above items (1) to (3), wherein $Y^1$ to $Y^6$ each represent any one of the following formulas (4b) to (14b):

[Chemical Formula 2]

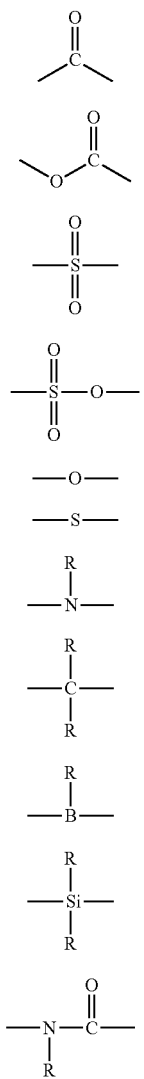

(4b)
(5b)
(6b)
(7b)
(8b)
(9b)
(10b)
(11b)
(12b)
(13b)
(14b)

wherein R represents an arbitrary organic group (the organic group may further have a substituent or a heteroatom in the structure).

(5) The organic electronic material according to any one of the above items (1) to (4), wherein $L^+$ in the formulas (1b) to (3b) is any one of cations represented by the following formulas (15b) to (17b):

[Chemical Formula 3]

 (15b)

 (16b)

 (17b)

wherein $R^{11}$ to $R^{34}$ each independently represent an arbitrary organic group, and any two or more adjacent groups among $R^{11}$ to $R^{34}$ may be joined to each other and form a ring; $A^1$ represents an element which belongs to Group 17 or Group 14 of the long form periodic table; $A^2$ represents an element which belongs to Group 16 or Group 14 of the long form periodic table; and $A^3$ represents an element which belong to Group 15 of the long form periodic table.
(6) The organic electronic material according to the above item (5), wherein $R^{11}$ to $R^{34}$ in the formulas (15b) to (17b) each independently represent an alkyl group, an alkenyl group, an alkynyl group, an aromatic hydrocarbon group or an aromatic heterocyclic group, all of which may be substituted.
(7) The organic electronic material according to the above item (5) or (6), wherein $A^1$ in the formula (15b) is a bromine atom, an iodine atom or a carbon atom; $A^2$ in the formula (16b) is an oxygen atom, a carbon atom, a sulfur atom or a selenium atom; and $A^3$ in the formula (17b) is a nitrogen atom, a phosphorus atom, an arsenic atom or an antimony atom.
(8) The organic electronic material according to any one of the above items (1) to (7), wherein the charge transporting compound includes at least one of an aromatic amine, a carbazole and a thiophene compound.
(9) The organic electronic material according to the above item (8), wherein the aromatic amine, carbazole or thiophene compound is a polymer or an oligomer.
(10) The organic electronic material according to the above item (9), wherein the number average molecular weight of the polymer or the oligomer is from 1,000 to 100,000.
(11) The organic electronic material according to the above item (9) or (10), wherein the polymer or the oligomer has at least one polymerizable substituent.
(12) The organic electronic material according to the above item (11), wherein the polymerizable substituent is any one of an oxetane group, an epoxy group, a vinyl group, a vinyl ether group, an acrylate group and a methacrylate group.
(13) The organic electronic material according to any one of the above items (1) to (12), wherein the ionic compounds function as polymerization initiators.
(14) A polymerization initiator comprising at least one of ionic compounds represented by the following formulas (1b) to (3b):

[Chemical Formula 4]

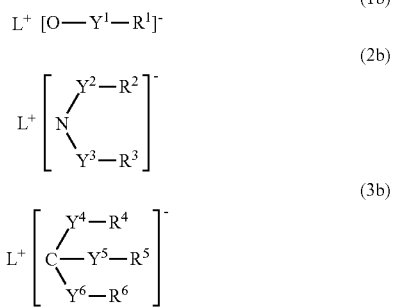

wherein $Y^1$ to $Y^6$ each independently represent a divalent linking group; $R^1$ to $R^6$ each independently represent an electron-withdrawing organic substituent (the substituent may further have a substituent or a heteroatom in the structure, and $R^1$, $R^2$ and $R^3$, or $R^4$ to $R^6$ may be respectively joined to form a ring form or a polymer form); and $L^+$ represents a monovalent cation.

(15) A thermal polymerization initiator comprising at least one of ionic compounds represented by the following formulas (1b) to (3b):

[Chemical Formula 5]

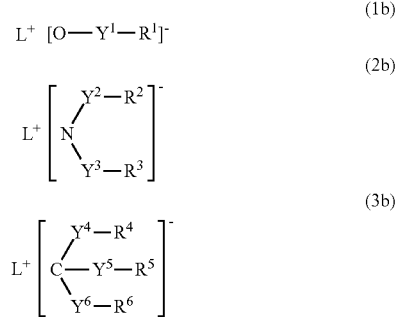

wherein $Y^1$ to $Y^6$ each independently represent a divalent linking group; $R^1$ to $R^6$ each independently represent an electron-withdrawing organic substituent (the substituent may further have a substituent or a heteroatom in the structure, and $R^1$, $R^2$ and $R^3$, or $R^4$ to $R^6$ may be respectively joined to form a ring form or a polymer form); and $L^+$ represents a monovalent cation.

(16) A method for producing an organic thin film, the method comprising imparting solvent resistance to the organic thin film by using the polymerization initiator according to the above item (14).

(17) An ink composition comprising the organic electronic material according to any one of the above items (1) to (12), and a solvent.

(18) An organic thin film formed by using the organic electronic material according to any one of the above items (1) to (12).

(19) An organic thin film formed by using the ink composition according to the above item (17).

(20) An electronic element comprising the organic thin film according to the above item (18) or (19).

(21) An organic electroluminescent element comprising the organic thin film according to the above item (18) or (19).

(22) The organic electroluminescent element according to the above item (21), wherein the organic thin film is a hole injection layer.

(23) The organic electroluminescent element according to the above item (21), wherein the organic thin film is a hole transport layer.

(24) The organic electroluminescent element according to any one of the above items (21) to (23), wherein the substrate is a flexible substrate.

(25) The organic electroluminescent element according to any one of the above items (21) to (23), wherein the substrate is a resin film.

(26) A display element comprising the organic electroluminescent element according to any one of the above items (21) to (25).

(27) A lighting device comprising the organic electroluminescent element according to any one of the above items (21) to (25).

(28) A display device comprising the lighting device according to the above item (27), and a liquid crystal element as a display unit.

Advantageous Effects of Invention

According to the present invention, an organic electronic material can be provided, which can form a thin film stably and easily, can have its solubility changed by a polymerization reaction so that multilayering of the organic thin film layers can be easily achieved, and is therefore very useful for enhancing the productivity for organic electronic elements, and particularly polymer type organic EL elements.

Furthermore, when the organic electronic material contains an ionic compound, an organic electronic element and an organic EL element which have a lower driving voltage and a longer light emission lifetime than the conventional elements, are provided.

DESCRIPTION OF EMBODIMENTS

Figure 1:
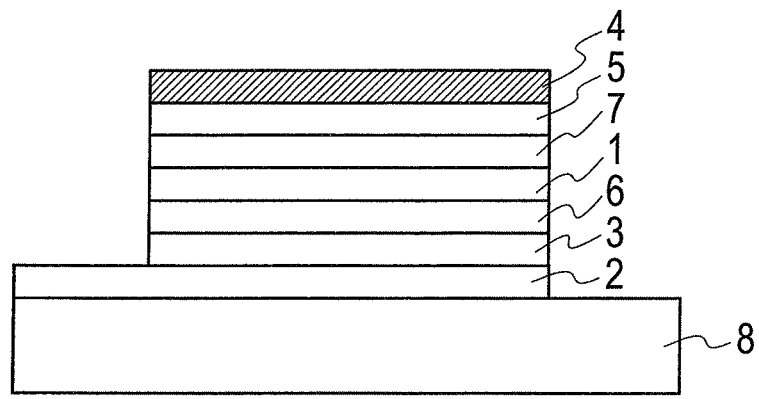
FIG. 1 is a schematic diagram illustrating an example of a multilayered organic EL element.

The organic electronic material of the present invention is characterized by containing charge transporting compounds and ionic compounds, at least one of the ionic compounds being one of the compounds represented by the formulas (1b) to (3b):

[Chemical Formula 6]

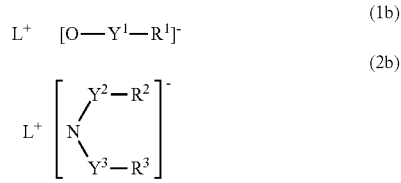

-continued

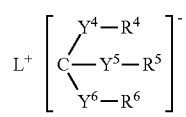
(3b)

where, $Y^1$ to $Y^6$ each independently represent a divalent linking group; $R^1$ to $R^6$ each independently represent an electron-withdrawing organic substituent (the substituent may further have a substituent or a heteroatom in such a structure, and $R^1$, $R^2$ and $R^3$, or $R^4$ to $R^6$ may be respectively joined to form a ring or a polymer); and $L^+$ represents a monovalent cation.

Here, according to the present invention, the term "ionic compound" means a compound composed of a cation and an anion, while the anion contains an electron-withdrawing organic substituent ($R^1$ to $R^6$ in the above formula). Examples of the organic substituent include a halogen atom such as a fluorine atom, a chlorine atom or a bromine atom; a cyano group, a thiocyano group, a nitro group; an alkylsulfonyl group such as a mesyl group; an arylsulfonyl group such as a tosyl group; an acyl group usually having from 1 to 12 carbon atoms, and preferably 6 or fewer carbon atoms, such as a formyl group, an acetyl group or a benzoyl group; an alkoxycarbonyl group usually having from 2 to 10 carbon atoms, and preferably 7 or fewer carbon atoms, such as a methoxycarbonyl group or an ethoxycabronyl group; an aryloxycarbonyl group having an aromatic hydrocarbon group or aromatic heterocyclic group usually having 3 or more, and preferably 4 or more, and 25 or fewer, and preferably 15 or fewer, carbon atoms, such as a phenoxycarbonyl group or a pyridyloxycarbonyl group; an acyloxy group usually having from 2 to 20 carbon atoms, such as an acetoxy group; an alkyloxysulfonyl group, an aryloxysulfonyl group; a haloalkyl, haloalkenyl or haloalkynyl group in which a linear, branched or cyclic alkyl, alkenyl or alkynyl group usually having from 1 to 10 carbon atoms, and preferably 6 or fewer carbon atoms, is substituted with a halogen atom such as a fluorine atom or a chlorine atom, such as a trifluoromethyl group or a pentafluoroethyl group; and a haloaryl group usually having from 6 to 20 carbon atoms, such as a pentafluorophenyl group. Among these, from the viewpoint of being capable of efficiently delocalizing negative charges, more preferred examples include groups obtained by substituting a portion or all of the hydrogen atoms of groups having hydrogen atoms among the organic groups, with halogen atoms, and examples thereof include a perfluoroalkyl group, a perfluoroalkylsulfonyl group, a perfluoroalkyloxysulfonyl group, a perfluoroarylsulfonyl group, a perfluoroaryloxysulfonyl group, a perfluoroacyl group, a perfluoroalkoxycarbonyl group, a perfluoroacyloxy group, a perfluoroaryloxycarbonyl group, a perfluoroalkenyl group, and a perfluoroalkynyl group, each of which may be linear, branched or cyclic, with 1 to 20 carbon atoms, and may contain a heteroatom. These groups are represented by the following Structural Formula Group (1), but are not limited to these.

Structural Formula Group (1)

[Chemical Formula 7]

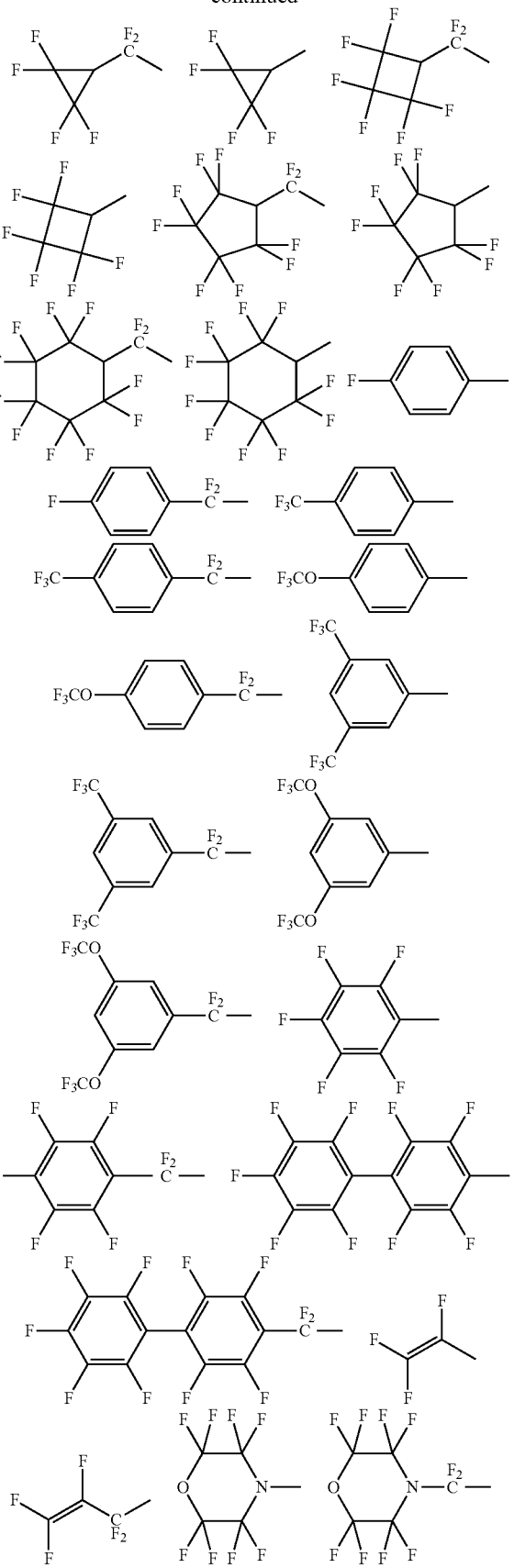

Furthermore, $Y^1$ to $Y^6$ in the formulas (1b) to (3b) each represent a divalent linking group, but are each preferably represented by any one of the following formulas (4b) to (14b).

[Chemical Formula 8]

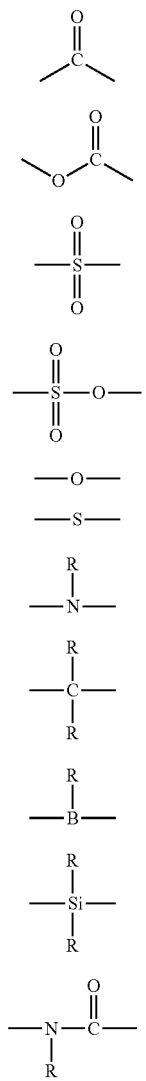

where, R represents an arbitrary organic group (may further have a substituent or a heteroatom in these structures).

From the viewpoints of an enhancement of the electron acceptability and the solubility in solvents, Rs in the formulas (10b) to (14b) are each independently preferably an alkyl group, an alkenyl group, an alkynyl group, an aromatic hydrocarbon group, or an aromatic heterocyclic group, which may be substituted, and more preferably an organic group having an electron-withdrawing substituent among the substituents described above, while examples of the organic group include the groups of the Structural Formula Group (1) described above.

Furthermore, the anion according to the present invention is preferably such that a negative charge is primarily on an oxygen atom, a nitrogen atom or a carbon atom, and although there are no particular limitations, the anion is more preferably such that the negative charge is on a nitrogen atom or a carbon atom. Most preferably, the anion is represented by the following formula (18b) or (19b).

[Chemical Formula 9]

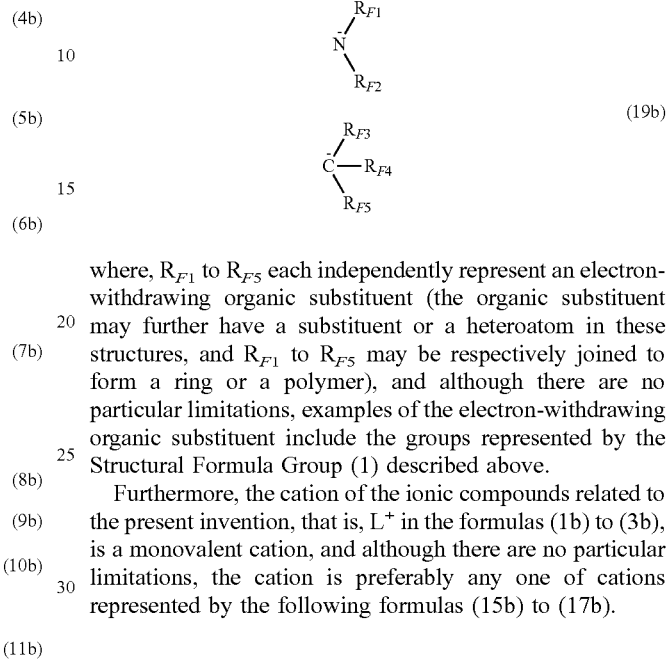

where, $R_{F1}$ to $R_{F5}$ each independently represent an electron-withdrawing organic substituent (the organic substituent may further have a substituent or a heteroatom in these structures, and $R_{F1}$ to $R_{F5}$ may be respectively joined to form a ring or a polymer), and although there are no particular limitations, examples of the electron-withdrawing organic substituent include the groups represented by the Structural Formula Group (1) described above.

Furthermore, the cation of the ionic compounds related to the present invention, that is, $L^+$ in the formulas (1b) to (3b), is a monovalent cation, and although there are no particular limitations, the cation is preferably any one of cations represented by the following formulas (15b) to (17b).

[Chemical Formula 10]

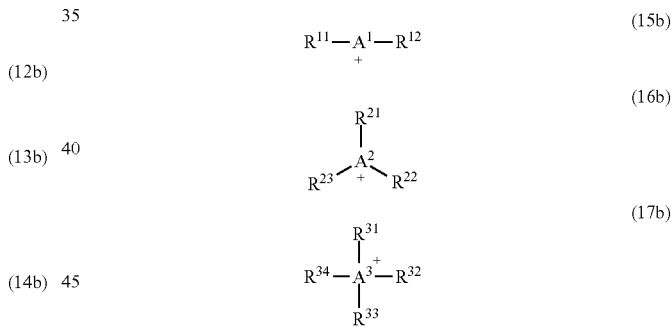

where, $R^{11}$ to $R^{34}$ each independently represent an arbitrary organic group, and any two or more adjacent groups among $R^{11}$ to $R^{34}$ may be joined to form a ring; $A^1$ represents an element which belongs to Group 17 or Group 14 of the long form periodic table; $A^2$ represents an element which belongs to Group 16 or Group 14 of the long form periodic table; and $A^3$ represents an element which belongs to Group 15 of the long form periodic table.

$R^{11}$ to $R^{34}$ in the formulas (15b) to (17b) are each independently preferably an alkyl group, an alkenyl group, an alkynyl group, an aromatic hydrocarbon group, or an aromatic heterocyclic group, all of which may be substituted, from the viewpoints of stability of the compound and solubility in solvents.

In view of the stability of the compound and the ease of synthesis and purification, $A^1$ in the formula (15b) is preferably a bromine atom, an iodine atom or a carbon atom; $A^2$ in the formula (16b) is preferably an oxygen atom, a carbon atom, a sulfur atom or a selenium atom, and $A^3$ in the formula (17b) is preferably a nitrogen atom, a phosphorus atom, an arsenic atom or an antimony atom.

That is, more preferred examples of the cation of the ionic compounds according to the present invention include iodonium, sulfonium, phosphonium, carbenium (trityl), anilinium, bismuthonium, ammonium, selenium, pyridinium, imidazolium, oxonium, quinolinium, pyrrolidinium, aminium, immonium, and tropylium.

Examples of the sulfoniums include triarylsulfoniums such as triphenylsulfonium, tri-p-tolylsulfonium, tri-o-tolylsulfonium, tris(4-methoxyphenyl)sulfonium, 1-naphthyldiphenylsulfonium, 2-naphthyldiphenylsulfonium, tris(4-fluorophenyl)sulfonium, tri-1-naphthylsulfonium, tri-2-naphthylsulfonium, tris(4-hydroxyphenyl)sulfonium, 4-(phenylthio)phenyldiphenylsulfonium, 4-(p-tolylthio)phenyldi-p-tolylsulfonium, 4-(4-methoxyphenylthio)phenylbis(4-methoxyphenyl)sulfonium, 4-(phenylthio)phenylbis(4-fluorophenyl)sulfonium, 4-(phenylthio)phenylbis(4-methoxyphenyl)sulfonium, 4-(phenylthio)phenyldi-p-tolylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, bis{4-[bis(4-methylphenyl)sulfonio]phenyl}sulfide, bis{4-[bis(4-methoxyphenyl)sulfonio]phenyl}sulfide, 4-(4-benzoyl-2-chlorophenylthio)phenylbis(4-fluorophenyl)sulfonium, 4-(4-benzoyl-2-chlorophenylthio)phenyldiphenylsulfonium, 4-(4-benzoylphenylthio)phenylbis(4-fluorophenyl)sulfonium, 4-(4-benzoylphenylthio)phenyldiphenylsulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(di-p-tolyl)sulfonio]thioxanthone, 2-[(diphenyl)sulfonio]thioxanthone, 4-[4-(4-tert-butylbenzoyl)phenylthio]phenyldi-p-tolylsulfonium, 4-[4-(4-tert-butylbenzoyl)phenylthio]phenyldiphenylsulfonium, 4-[4-(benzoylphenylthio)]phenyldi-p-tolylsulfonium, 4-[4-(benzoylphenylthio)]phenyldiphenylsulfonium, 5-(4-methoxyphenyl)thianthrenium, 5-phenylthianthrenium, 5-tolylthianthrenium, 5-(4-ethoxyphenyl)thianthrenium, and 5-(2,4,6-trimethylphenyl)thianthrenium; diarylsulfoniums such as diphenylphenacylsulfonium, diphenyl-4-nitrophenacylsulfonium, diphenylbenzylsulfonium, and diphenylmethylsulfonium; monoarylsulfoniums such as phenylmethylbenzylsulfonium, 4-hydroxyphenylmethylbenzylsulfonium, 4-methoxyphenylmethylbenzylsulfonium, 4-acetocarbonyloxyphenylmethylbenzylsulfonium, 2-naphthylmethylbenzylsulfonium, 2-naphthylmethyl(1-ethoxycarbonyl)ethylsulfonium, phenylmethylphenacylsulfonium, 4-hydroxyphenylmethylphenacylsulfonium, 4-methoxyphenylmethylphenacylsulfonium, 4-acetocarbonyloxyphenylmethylphenacylsulfonium, 2-naphthylmethylphenacylsulfonium, 2-naphthyloctadecylphenacylsulfonium, and 9-anthracenylmethylphenacylsulfonium; and trialkylsulfoniums such as dimethylphenacylsulfonium, phenacyltetrahydrothiophenium, dimethylbenzylsulfonium, benzyltetrahydrothiophenium, and octadecylmethylphenacylsulfonium. These compounds are described in the following literatures.

Literatures related to the triarylsulfoniums include U.S. Pat. Nos. 4,231,951, 4,256,828, JP 7-61964 A, JP 8-165290 A, JP 7-10914 A, JP 7-25922 A, JP 8-27208 A, JP 8-27209 A, JP 8-165290 A, JP 8-301991 A, JP 9-143212 A, JP 9-278813 A, JP 10-7680 A, JP 10-287643 A, JP 10-245378 A, JP 8-157510 A, JP 10-204083 A, JP 8-245566 A, JP 8-157451 A, JP 7-324069 A, JP 9-268205 A, JP 9-278935 A, JP 2001-288205 A, JP 11-80118 A, JP 10-182825 A, JP 10-330353 A, JP 10-152495 A, JP 5-239213 A, JP 7-333834 A, JP 9-12537 A, JP 8-325259 A, JP 8-160606 A, and JP 2000-186071 A (U.S. Pat. No. 6,368,769); literatures related to the diarylsulfoniums include JP 7-300504 A, JP 64-45357 A, and JP 64-29419 A; literatures related to the monoarylsulfoniums include JP 6-345726 A, JP 8-325225 A, JP 9-118663 A (U.S. Pat. No. 6,093,753), JP 2-196812 A, JP 2-1470 A, JP 2-196812 A, JP 3-237107 A, JP 3-17101 A, JP 6-228086 A, JP 10-152469 A, JP 7-300505 A, JP 2003-277353 A, and JP 2003-277352 A; and literatures related to the trialkylsulfoniums include JP 4-308563 A, JP 5-140210 A, JP 5-140209 A, JP 5-230189 A, JP 6-271532 A, JP 58-37003 A, JP 2-178303 A, JP 10-338688 A, JP 9-328506 A, JP 11-228534 A, JP 8-27102 A, JP 7-333834 A, JP 5-222167 A, JP 11-21307 A, JP 11-35613 A, and U.S. Pat. No. 6,031,014.

Examples of the iodonium ion include diphenyliodonium, di-p-tolyliodonium, bis(4-dodecylphenyl)iodonium, bis(4-methoxyphenyl)iodonium, (4-octyloxyphenyl)phenyliodonium, bis(4-decyloxyphenyl)iodonium, 4-(2-hydroxytetradecyloxy)phenylphenyliodonium, 4-isopropylphenyl(p-tolyl)iodonium, and isobutylphenyl(p-tolyl)iodonium. These ions are described in Macromolecules, 10, 1307 (1977), JP 6-184170 A, U.S. Pat. Nos. 4,256,828, 4,351,708, JP 56-135519 A, JP 58-38350 A, JP 10-195117 A, JP 2001-139539 A, JP 2000-510516 A, JP 2000-119306 A, and the like.

Examples of the selenium ion include triarylseleniums such as triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphthylselenium, tri-2-naphthylselenium, tris(4-hydroxyphenyl)selenium, 4-(phenylthio)phenyldiphenylselenium, and 4-(p-tolylthio)phenyldi-p-tolylselenium; diarylseleniums such as diphenylphenacylselenium, diphenylbenzylselenium, and diphenylmethylselenium; monoarylseleniums such as phenylmethylbenzylselenium, 4-hydroxyphenylmethylbenzylselenium, phenylmethylphenacylselenium, 4-hydroxyphenylmethylphenacylselenium, and 4-methoxyphenylmethylphenacylselenium; and trialkylseleniums such as dimethylphenacylselenium, phenacyltetrahydroselenophenium, dimethylbenzylselenium, benzyltetrahydroselenophenium, and octadecylmethylphenacylselenium; These are described in JP 50-151997 A, JP 50-151976 A, JP 53-22597 A, and the like.

Examples of the ammonium ion include tetraalkylammoniums such as tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, trimethylisobutylammonium, trimethyl-t-butylammonium, trimethyl-n-hexylammonium, dimethyldi-n-propylammonium, dimethyldiisopropylammonium, dimethyl-n-propylisopropylammonium, methyltri-n-propylammonium, and methyltriisopropylammonium; pyrrolidiniums such as N,N-dimethylpyrrolidinium, N-ethyl-N-methylpyrrolidinium, and N,N-diethylpyrrolidinium; imidazoliniums such as N,N'-dimethylimidazolinium, N,N'-diethylimidazolinium, N-ethyl-N'-methylimidazolinium, 1,2,3-trimethylimidazolinium, 1,3,4-trimethylimidazolinium, 1,3-diethyl-2-methylimidazolinium, 1,3-diethyl-4-methylimidazolinium, and 1,2,3,4-tetramethylimidazolinium; tetrahydropyrimidiniums such as N,N'-dimethyltetrahydropyrimidinium, N,N'-diethyltetrahydropyrimidinium, N-ethyl-N'-methyltetrahydropyrimidinium, and 1,2,3-trimethyltetrahydropyrimidinium; morpholiniums such as N,N'-dimethylmorpholinium, N-ethyl- N-methyhnorpholinium, and N,N-diethylmorpholinium; piperidiniums such as N,N-dimethylpiperidinium, N-ethyl-N'-methylpiperidinium, and N,N'-diethylpiperidinium; pyridiniums such as N-methylpyridinium, N-ethylpyridinium, N-n-propylpyridinium, N-isopropylpyridinium, N-n-butylpyridinium, N-benzylpyridinium, and N-phenacylpyridinium; imidazoliums such as N,N'-dimethylimidazolium, N-ethyl-N-methylimidazolium, N,N'-diethylimidazolium, 1,2-diethyl-3-methylimidazolium, 1,3-diethyl-2-methylimidazolium, and 1-methyl-3-n-proypl-2,4-dimethylimidazolium; quinoliums such as N-methylquinolium, N-ethylquinolium, N-n-propylquinolium, N-isopropylquinolium, N-n-butylquinolium, N-benzylquinolium, and N-phenacylquinolium; isoquinoliums such as N-methylisoquinolium, N-ethylisoquinolium, N-n-propylisoquinolium, N-isopropylisoquinolium, N-n-butylisoquinolium, N-benzylisoquinolium, and N-phenacylisoquinolium; thiazoniums such as benzylbenzothiazonium and phenacylbenzothiazonium; and acridiums such as benzylacridium and phenacylacridium.

These are described in U.S. Pat. No. 4,069,055, JP 2519480 B1, JP 5-222112 A, JP 5-222111 A, JP 5-262813 A, JP 5-255256 A, JP 7-109303 A, JP 10-101718 A, JP 2-268173 A, JP 9-328507 A, JP 5-132461 A, JP 9-221652 A, JP 7-43854 A, JP 7-43901 A, JP 5-262813 A, JP 4-327574 A, JP 2-43202 A, JP 60-203628 A, JP 57-209931 A, JP 9-221652 A, and the like.

Examples of the phosphonium ion include tetraarylphosphoniums such as tetraphenylphosphonium, tetra-p-tolylphosphonium, tetrakis(2-methoxyphenyl)phosphonium, tetrakis(3-methoxyphenyl)phosphonium, and tetrakis(4-methoxyphenyl)phosphonium; triarylphosphoniums such as triphenylbenzylphosphonium, triphenylphenacylphosphonium, triphenylmethylphosphonium, and triphenylbutylphosphonium; and tetraalkylphosphoniums such as triethylbenzylphosphonium, tributylbenzylphosphonium, tetraethylphosphonium, tetrabutylphosphonium, tetrahexylphosphonium, triethylphenacylphosphonium, and tributylphenacylphosphonium. These are described in JP 6-157624 A, JP 5-105692 A, JP 7-82283 A, JP 9-202873 A, and the like.

Examples of the oxonium ion include trimethyloxonium, triethyloxonium, tripropyloxonium, tributyloxonium, trihexyloxonium, triphenyloxonium, pyrylinium, chromenilium, and xanthylium.

The bismuthonium ions are described in, for example, JP 2008-0214330 A.

The tropylium ions are described in, for example, J. Polym. Sci. Part A; Polym. Chem., 42, 2166 (2004).

Here, according to the present invention, the term "charge transporting compound" means a compound having a charge transporting unit.

Here, the "charge transporting unit" according to the present invention is an atomic group having an ability to transport holes or electrons, and hereinafter, the details thereof will be described.

The charge transporting unit may have an ability to transport holes or electrons, and although there are no particular limitations, the charge transporting unit is preferably an amine having an aromatic ring, a carbazole, or a thiophene. For example, units having partial structures represented by the following formulas (1) to (58) are preferred.

[Chemical Formula 11]

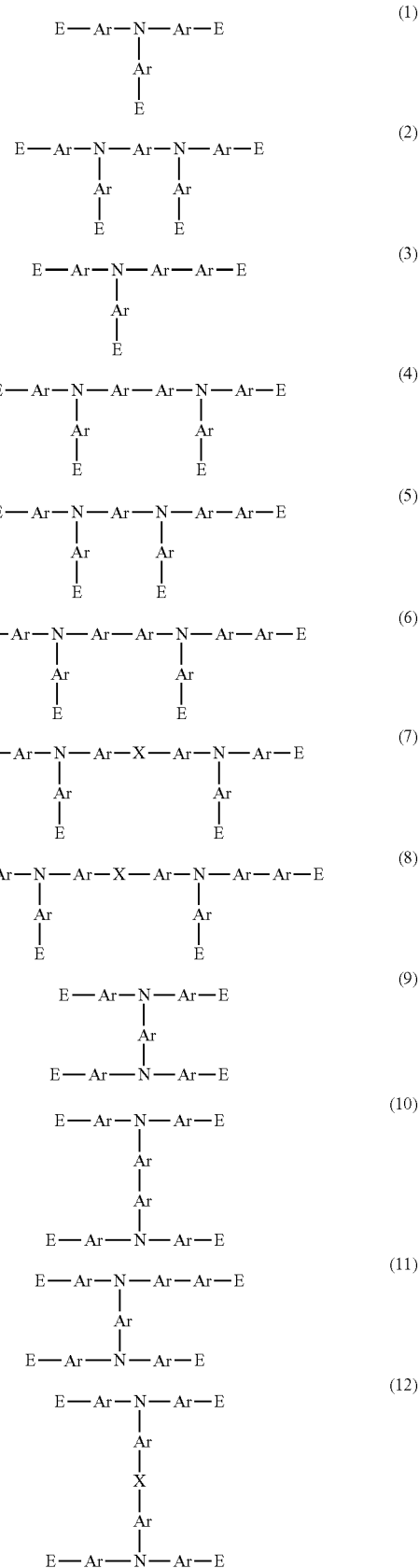

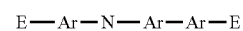
(13)
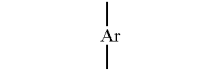
(14)
[Chemical Formula 12]
(15)
(16)
(17)
(18)
(19)
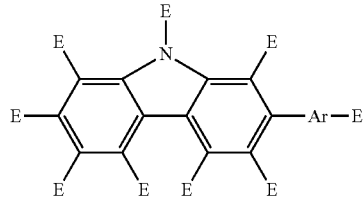
(20)
(21)
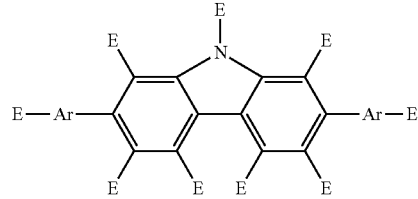
(22)
(23)
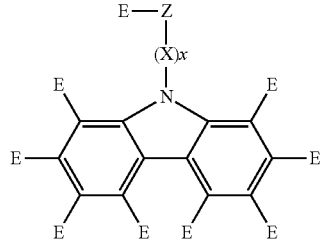
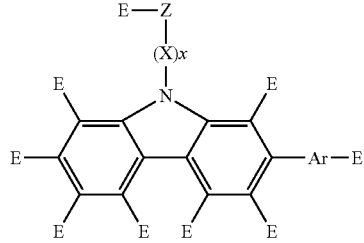
(24)
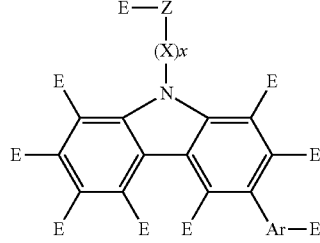
(25)
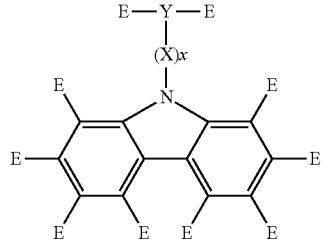

(26) 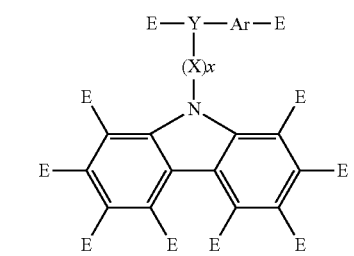
(27) 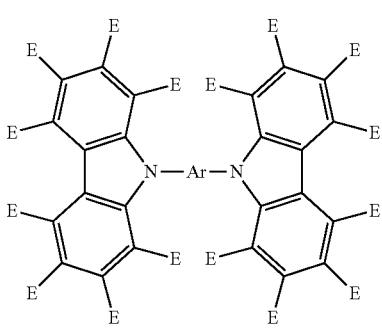
(28) 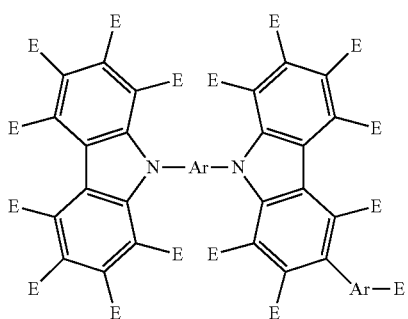
(29) 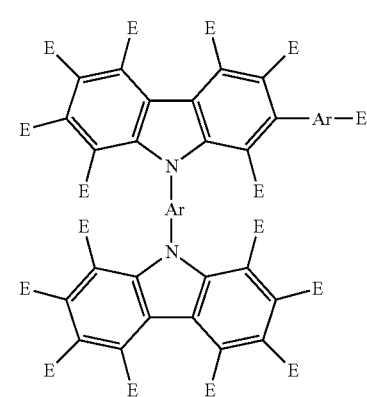
(30) 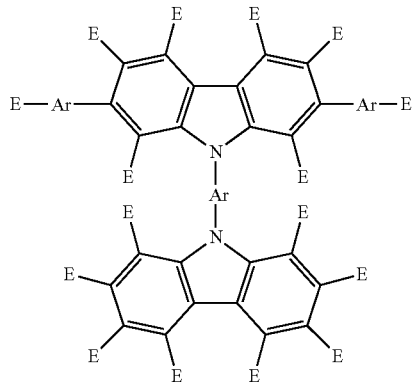
(31) 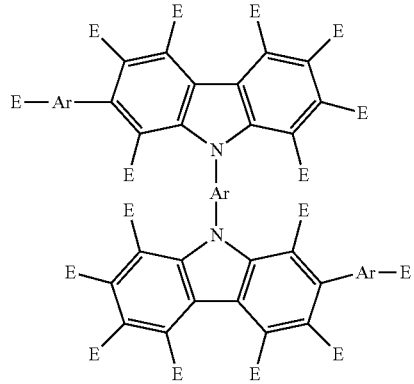
[Chemical Formula 13]
(32) 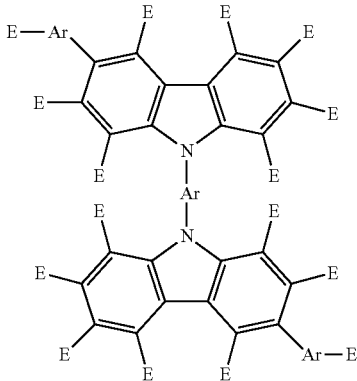
(33) 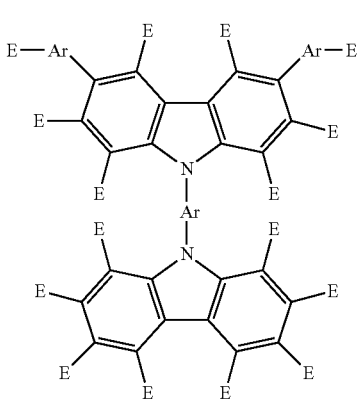

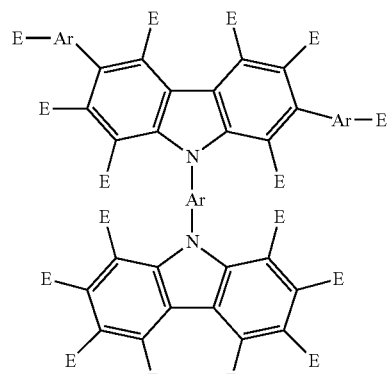
(34)
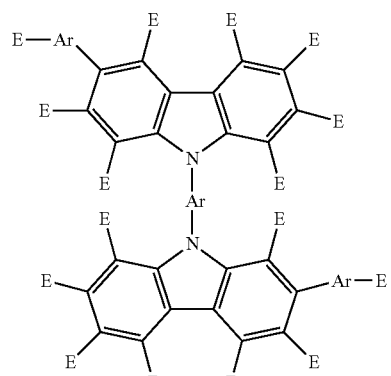
(35)
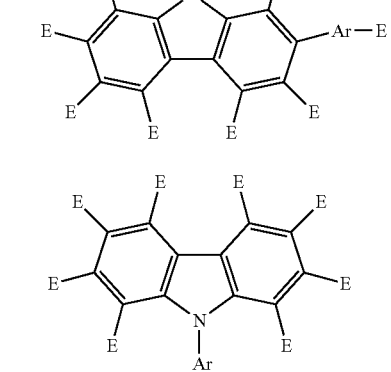
(36)
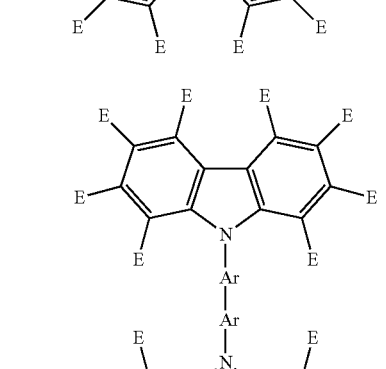
(37)
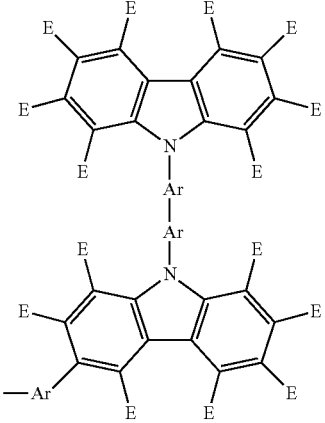
(38)
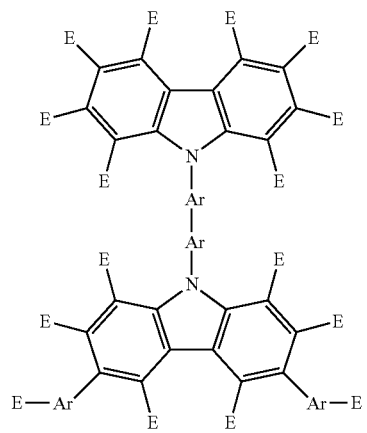
(39)
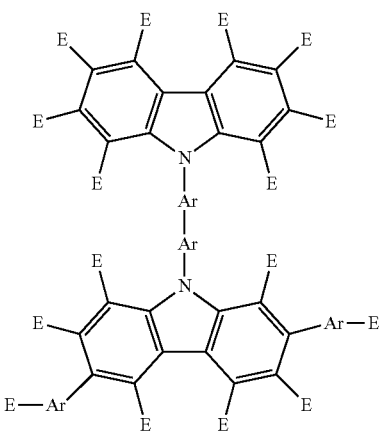
(40)

[Chemical Formula 14]
(41)
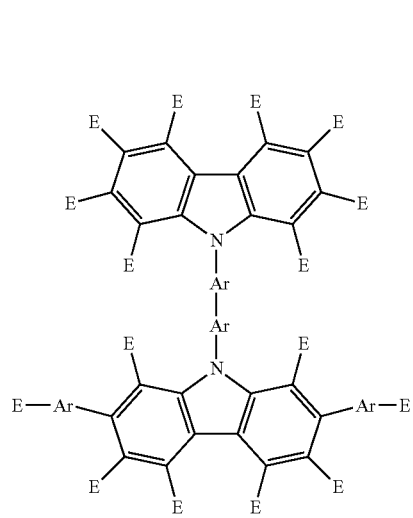
(42)
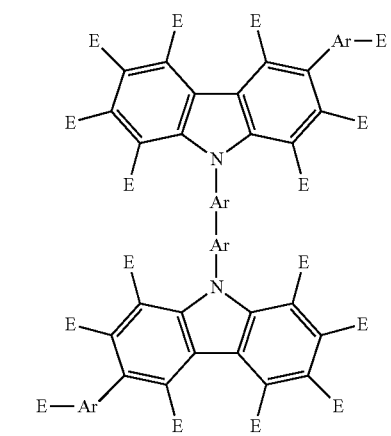
(43)
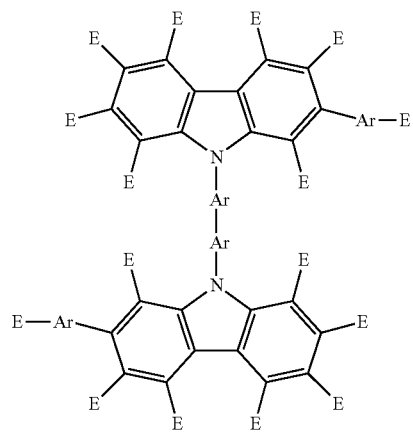
(44)
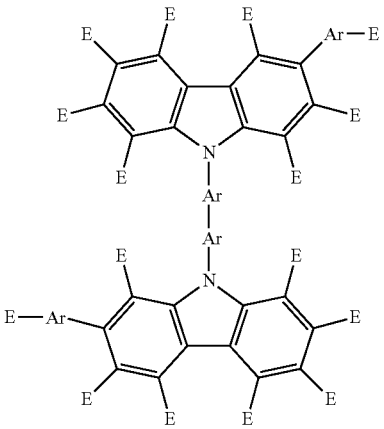
(45)
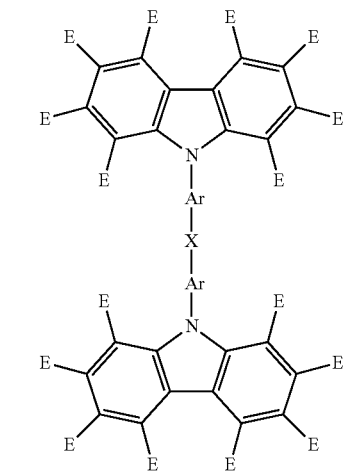
(46)
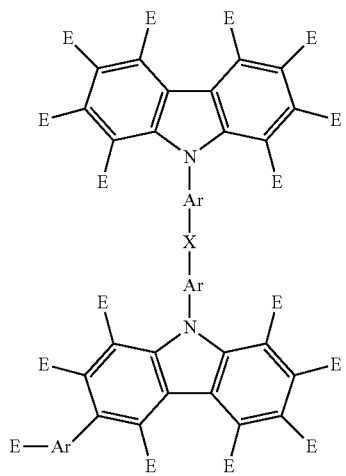

[Chemical Formula 15]
(47)
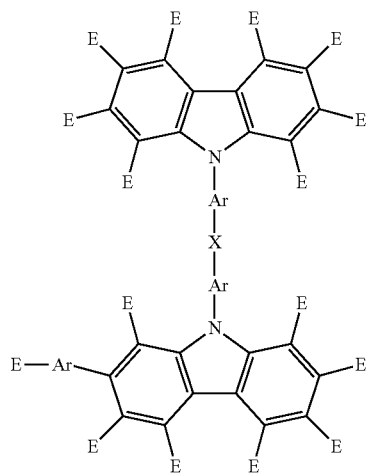
(48)
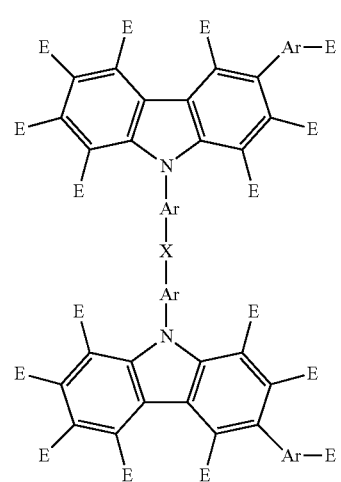
(49)
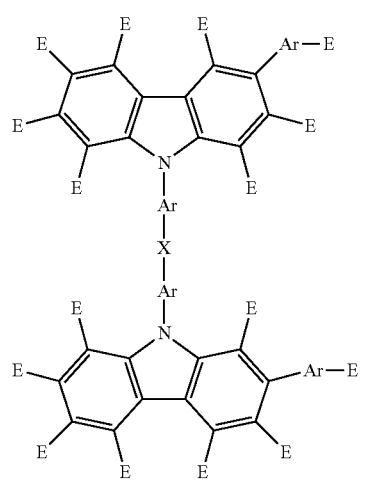
(50)
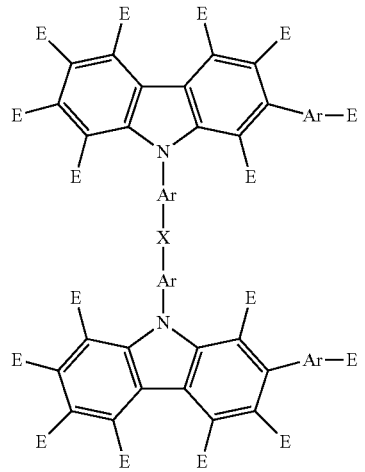
(51)
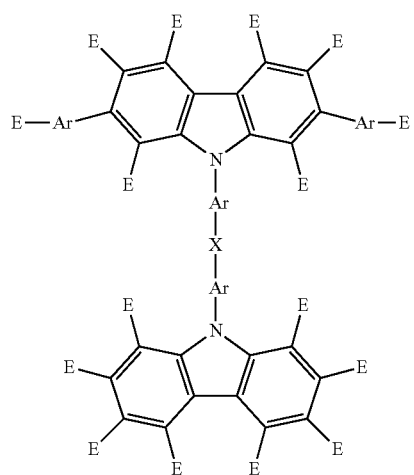
(52)
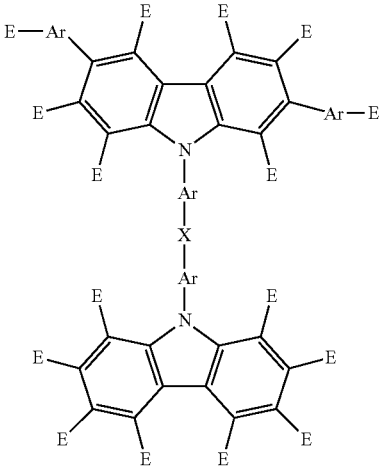

-continued

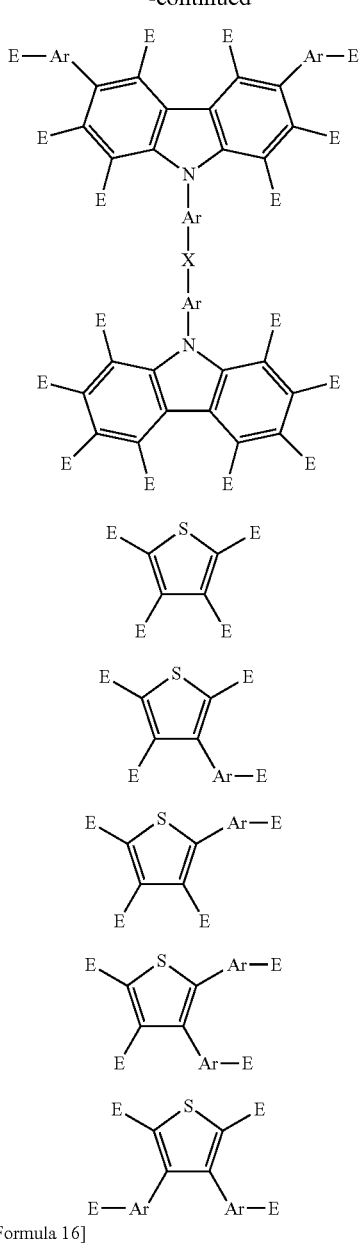

[Chemical Formula 16]

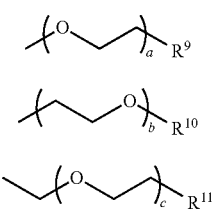

wherein E's each independently represent —R$^1$, —OR$^2$, —SR$^3$, —OCOR$^4$, —COOR$^5$, —SiR$^6$R$^7$R$^8$, any one of groups represented by formulas (59) to (61) (provided that R$^1$ to R$^{11}$ each represent a hydrogen atom, a linear, cyclic or branched alkyl group having 1 to 22 carbon atoms, or an aryl group or heteroaryl group having 2 to 30 carbon atoms; a, b and c each represent an integer of 1 or greater; herein, the aryl group means an atomic group obtained by removing one hydrogen atom from an aromatic hydrocarbon, and may be substituted; the heteroaryl group means an atomic group obtained by removing one hydrogen atom from an aromatic compound having heteroatoms, and may be substituted), or any one of the groups represented by Substituent Group (A) to Substituent Group (N). Ar's each independently represent an arylene group or heteroarylene group having 2 to 30 carbon atoms. The arylene group means an atomic group obtained by removing two hydrogen atoms from an aromatic hydrocarbon, and may be substituted. Examples thereof include phenylene, biphenyldiyl, terphenyldiyl, naphthalenediyl, anthracenediyl, tetracenediyl, fluorenediyl, and phenanthrenediyl. The heteroaryl group means an atomic group obtained by removing two hydrogen atoms from an aromatic compound having heteroatoms, and may be substituted. Examples thereof include pyridinediyl, pyrazinediyl, quinolinediyl, isoquinolinediyl, acridinediyl, phenanthrolinediyl, furanediyl, pyrrolediyl, thiophenediyl, oxazolediyl, oxadiazolediyl, thiadiazolediyl, triazolediyl, benzoxazolediyl, benzoxadiazolediyl, benzothiadiazolediyl, benzotriazolediyl, and benzothiophenediyl. X's and Z's each independently represent a divalent linking group, and although there are no particular limitations, a group obtained by further removing one hydrogen atom from a group of R having one or more hydrogen atoms, or groups represented by the Linker Group (A) that will be described below are preferred. x represents an integer from 0 to 2. Y represents the trivalent linking groups described above, and represents a group obtained by removing two hydrogen atoms from a group of R having two or more hydrogen atoms.

Substituent Group (A)

[Chemical Formula 17]

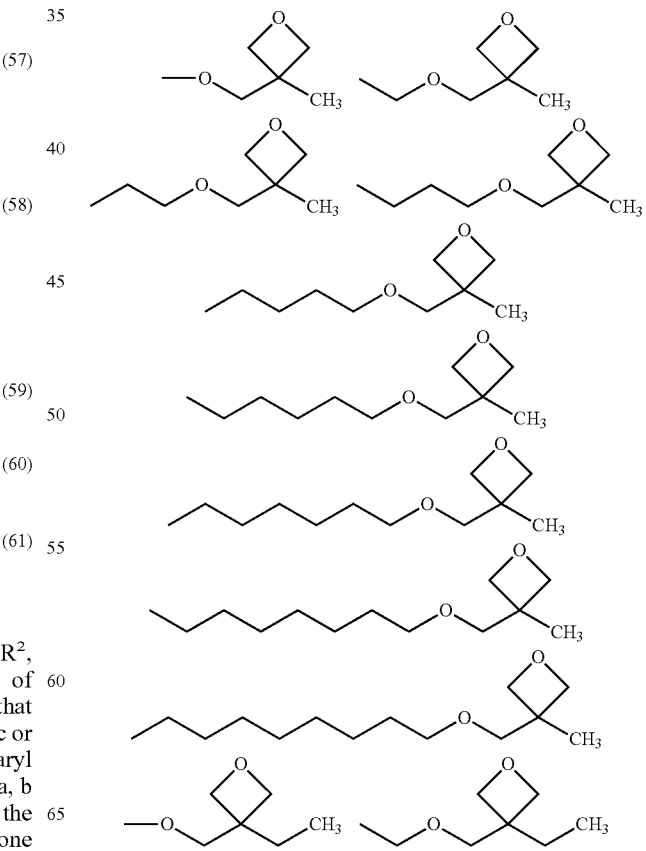

-continued
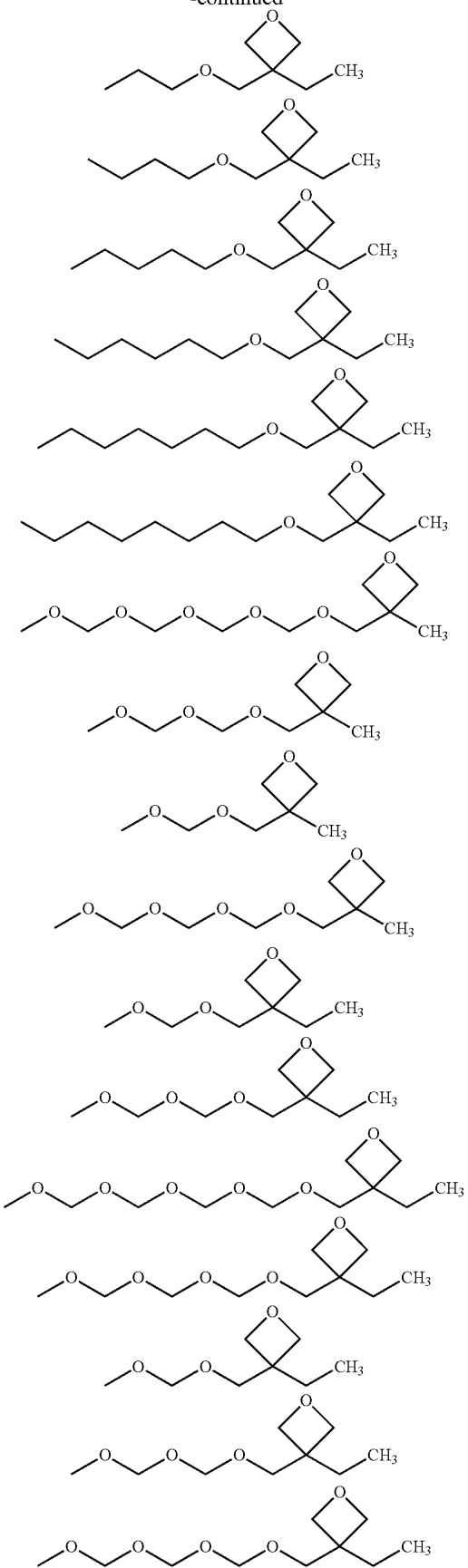
-continued
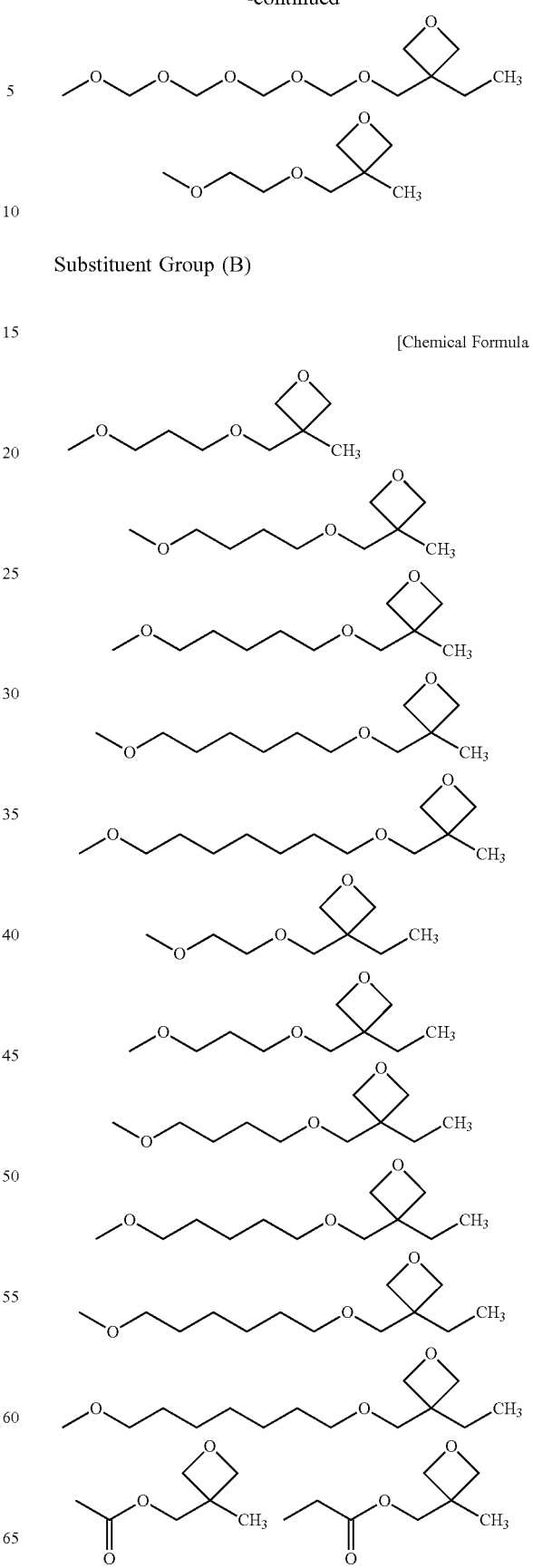
Substituent Group (B)
[Chemical Formula 18]

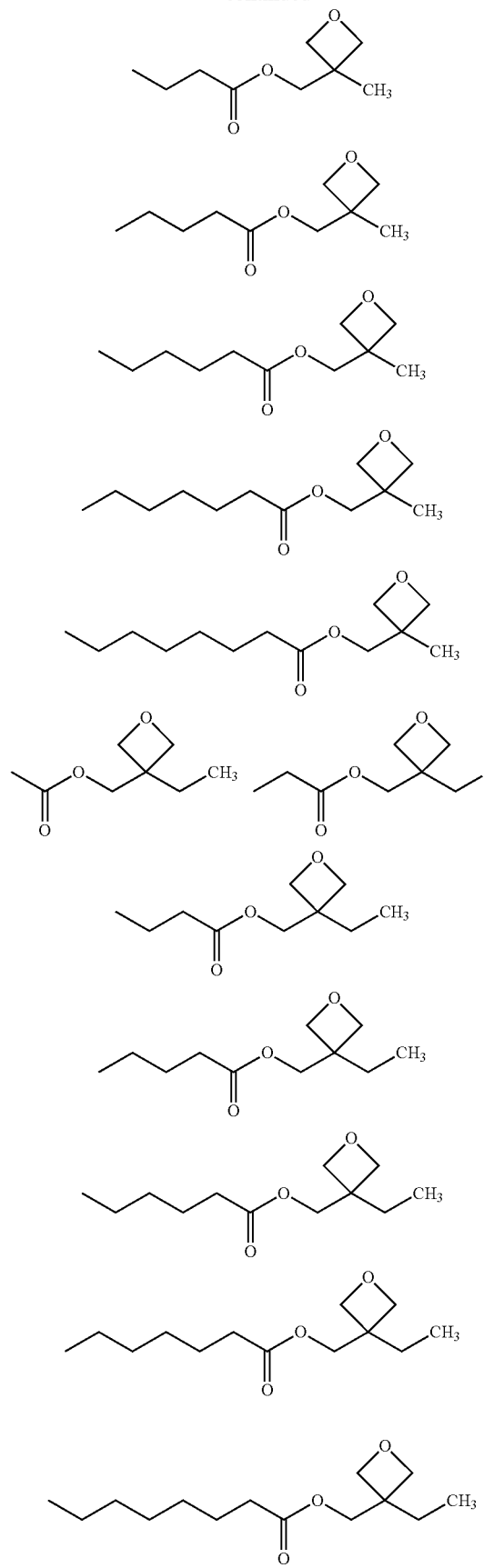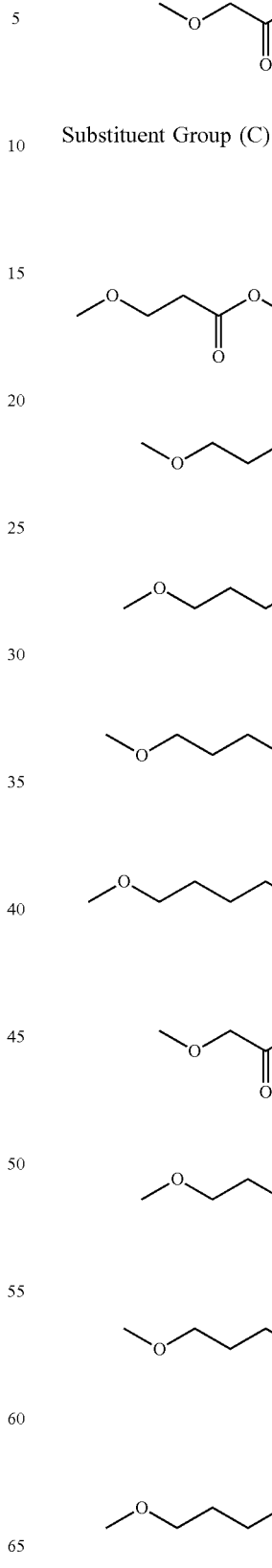
Substituent Group (C)
[Chemical Formula 19]

-continued
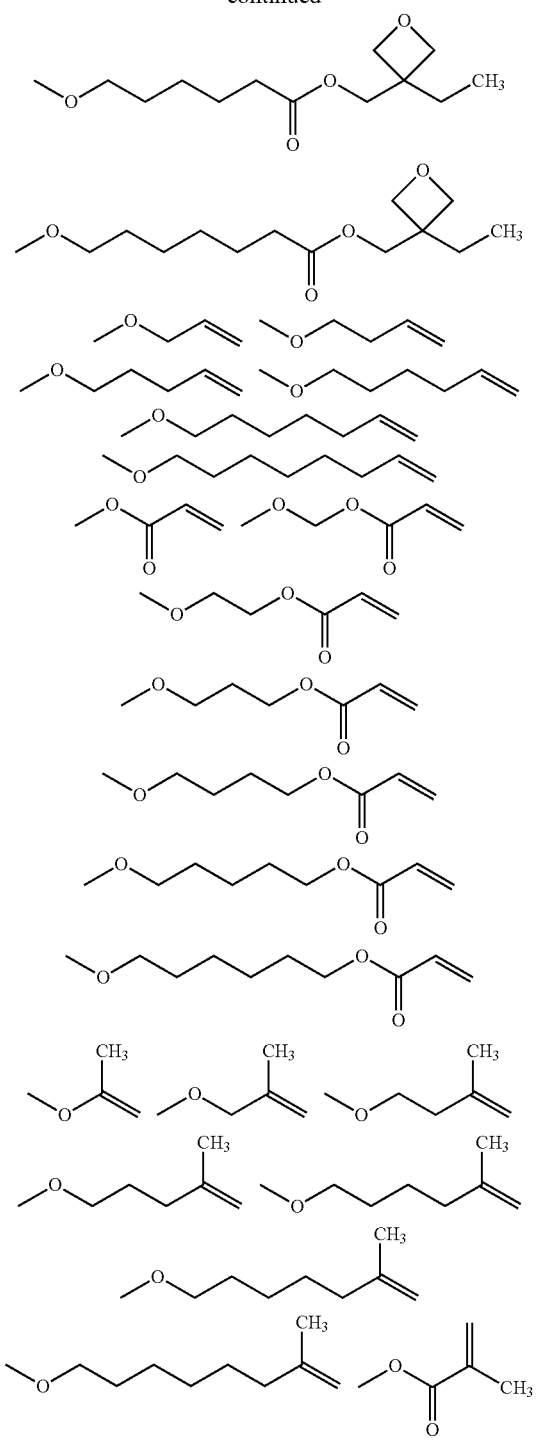
Substituent Group (D)
[Chemical Formula 20]
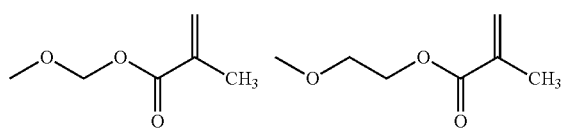
-continued
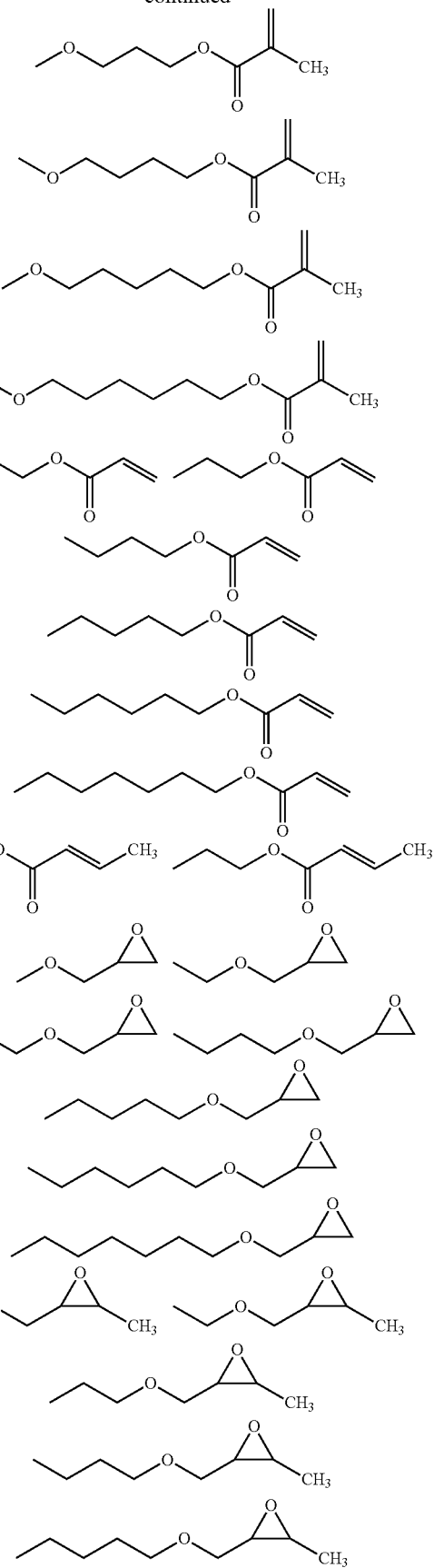

-continued
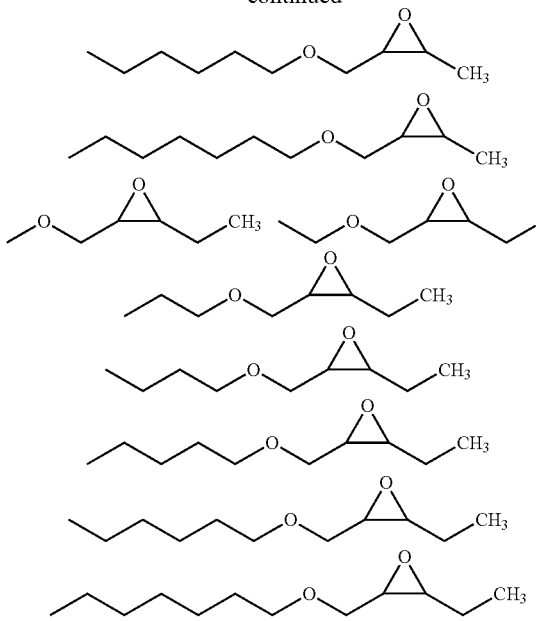
Substituent Group (E)
[Chemical Formula 21]
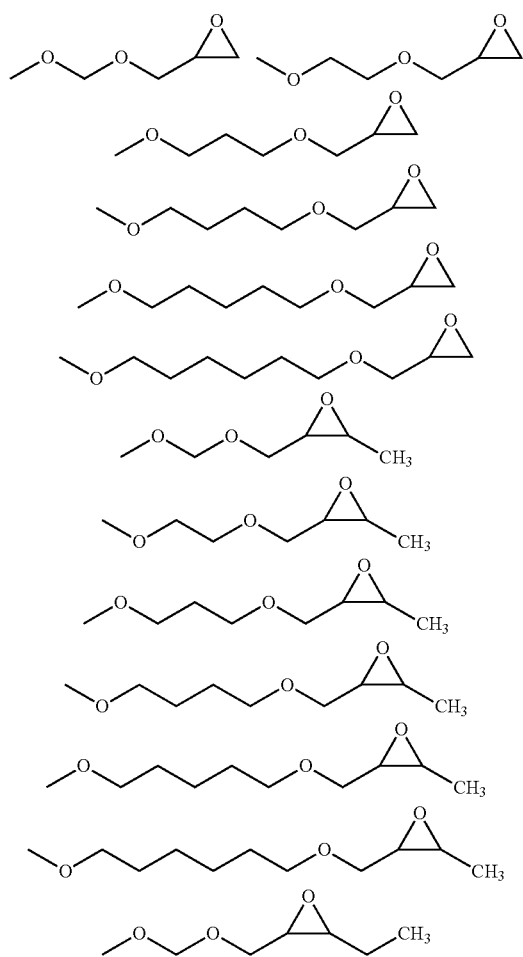
-continued
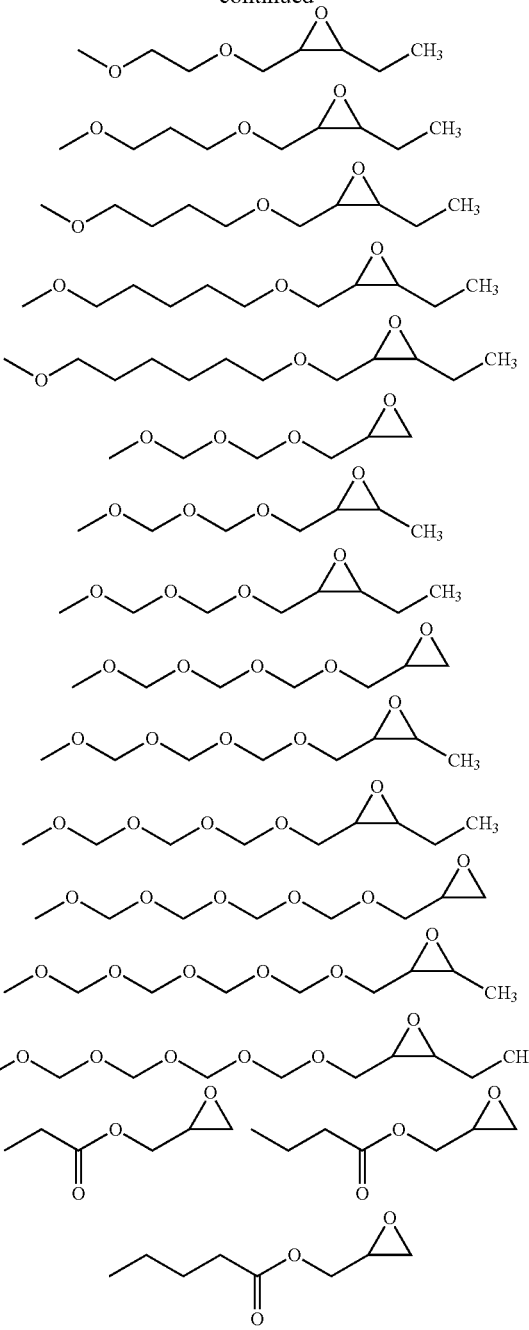
Substituent Group (F)
[Chemical Formula 22]
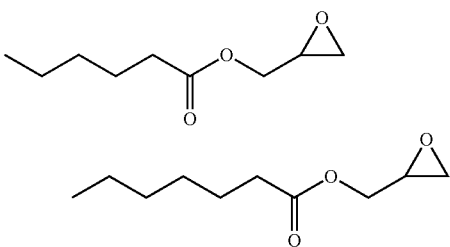

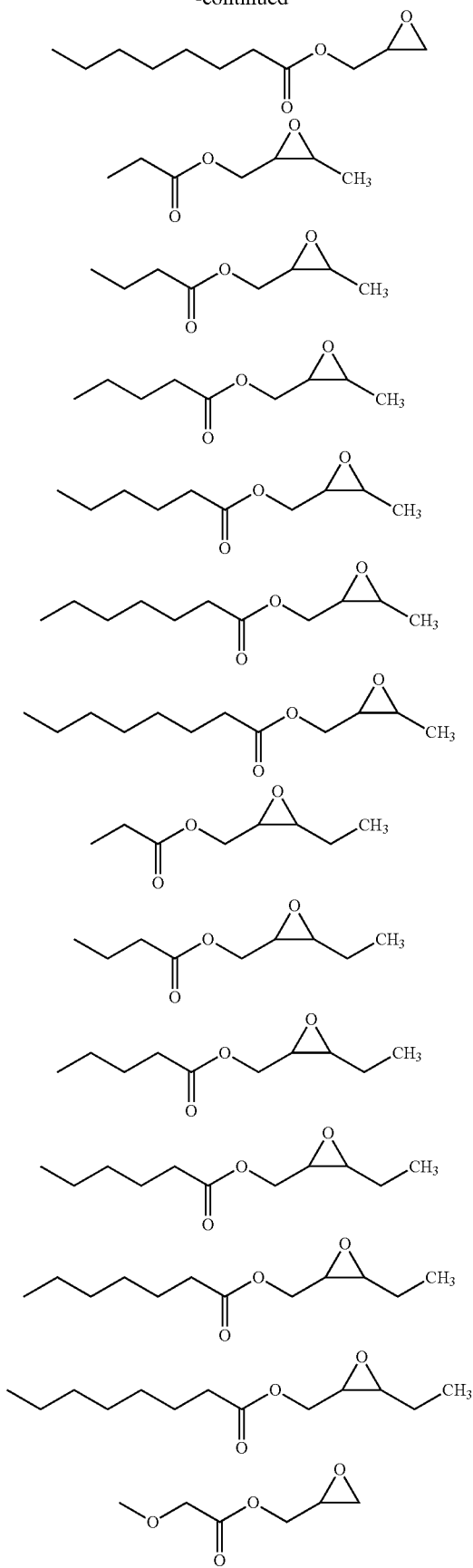
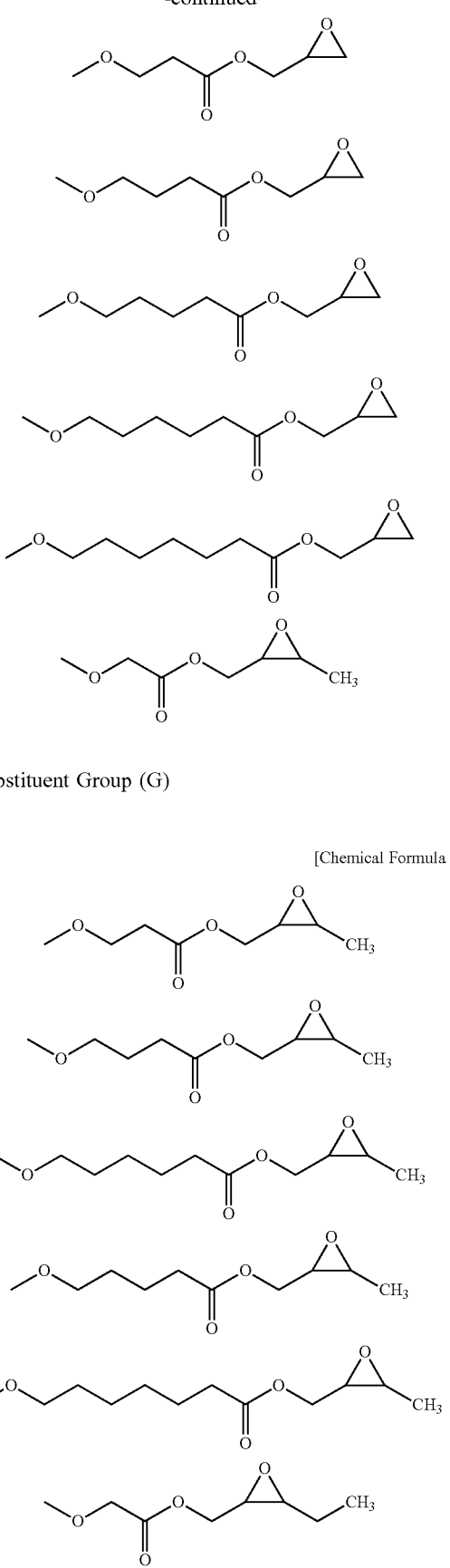
Substituent Group (G)
[Chemical Formula 23]

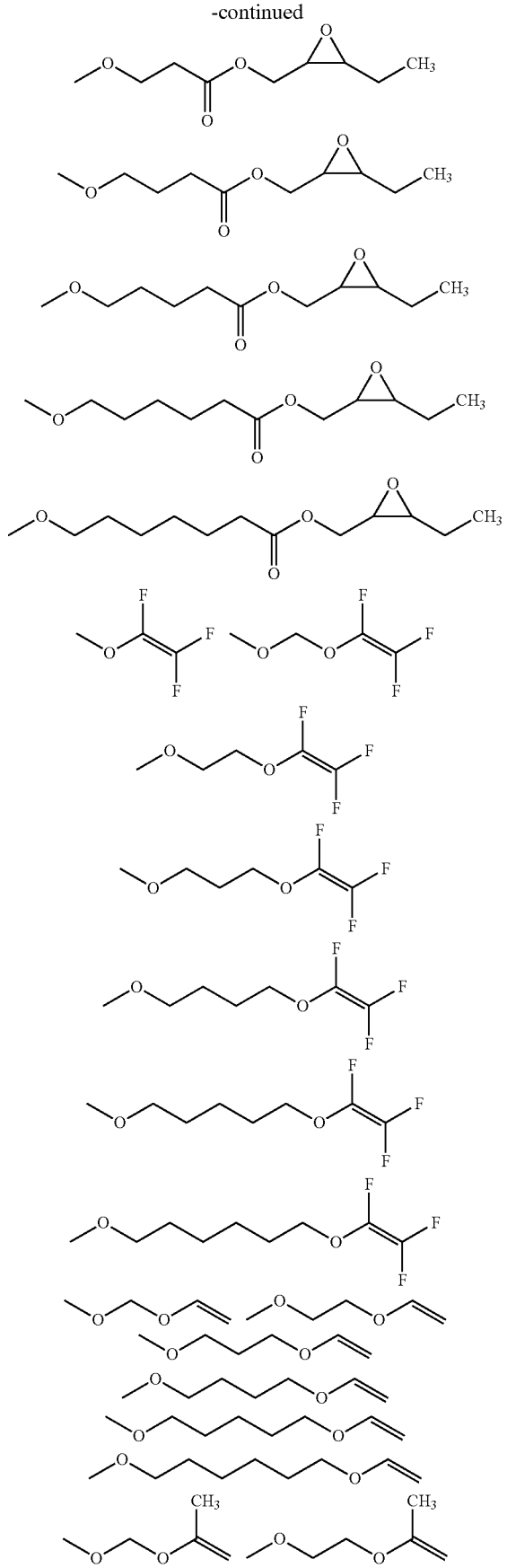
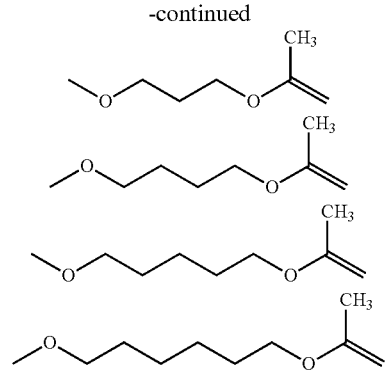
Substituent Group (H)
[Chemical Formula 24]
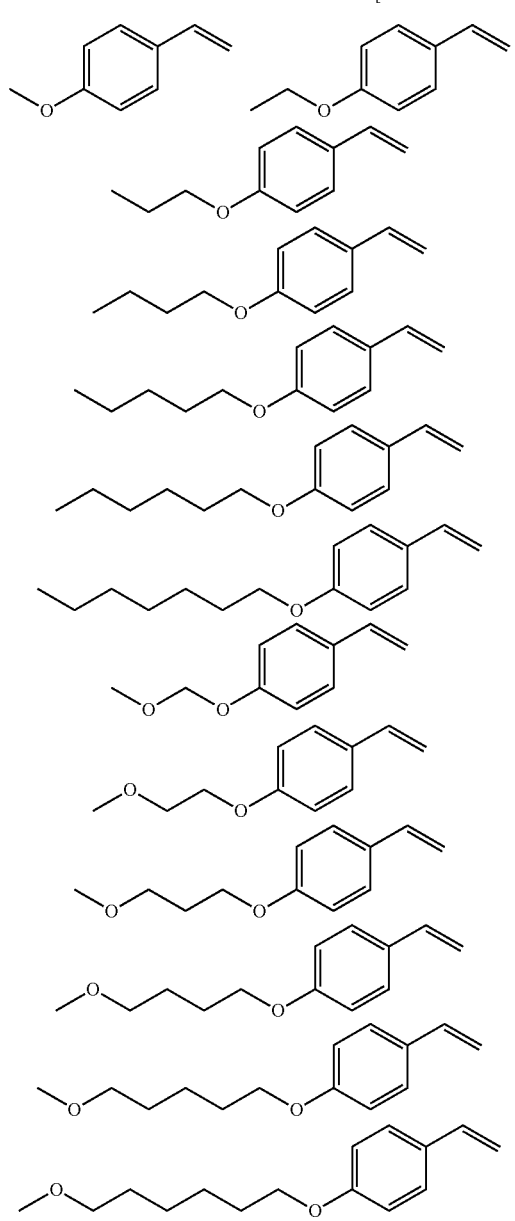

-continued
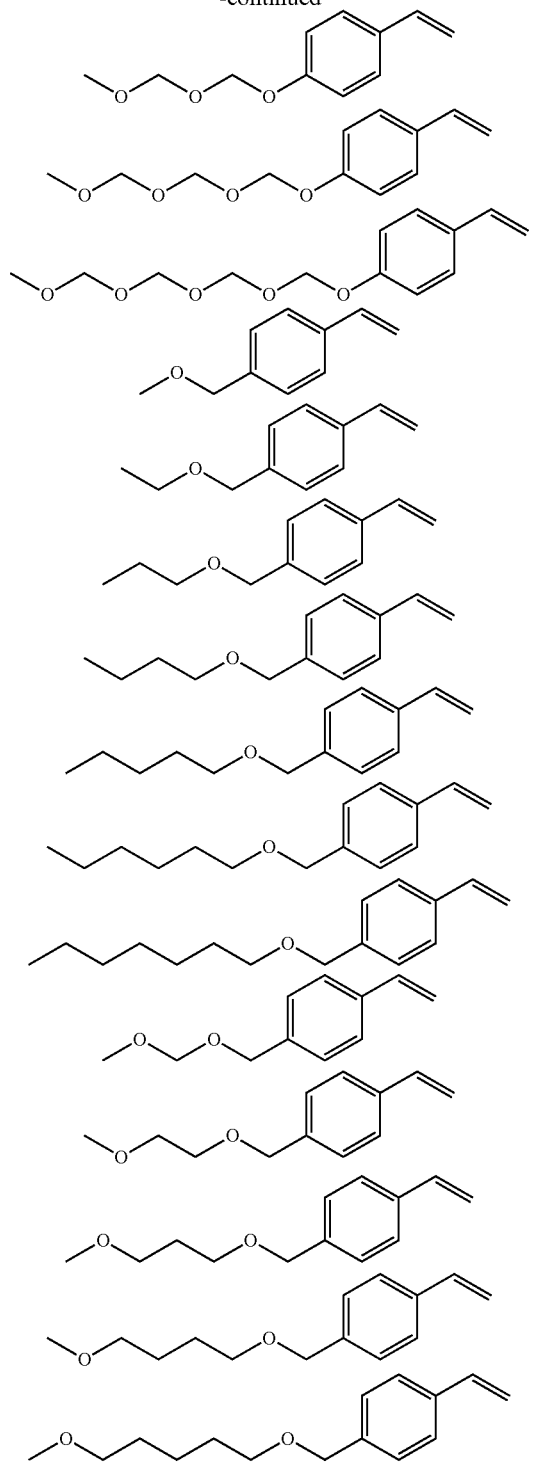
Substituent Group (I)
[Chemical Formula 25]
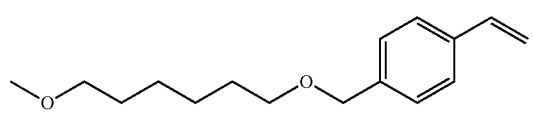
-continued
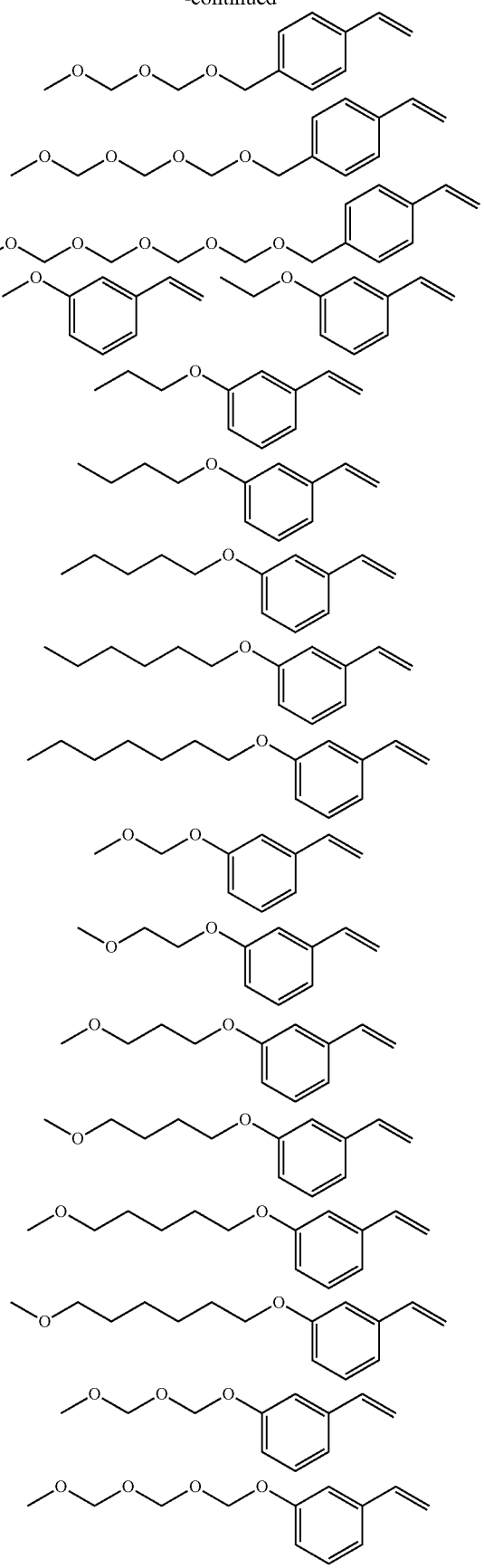

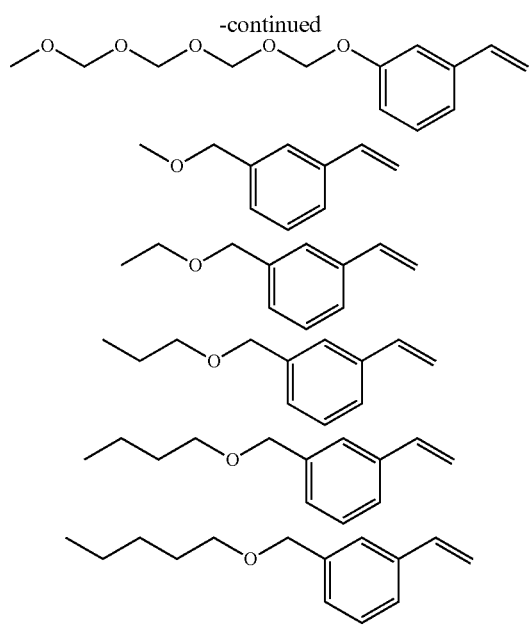
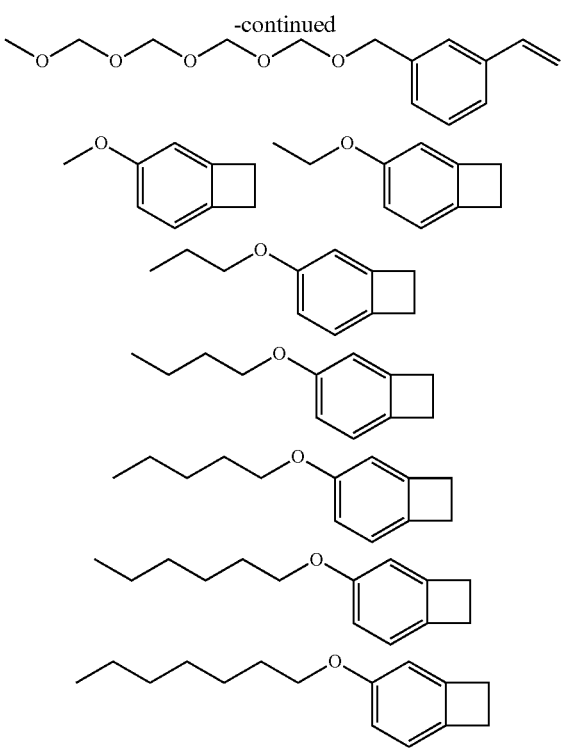
Substituent Group (J)
[Chemical Formula 26]
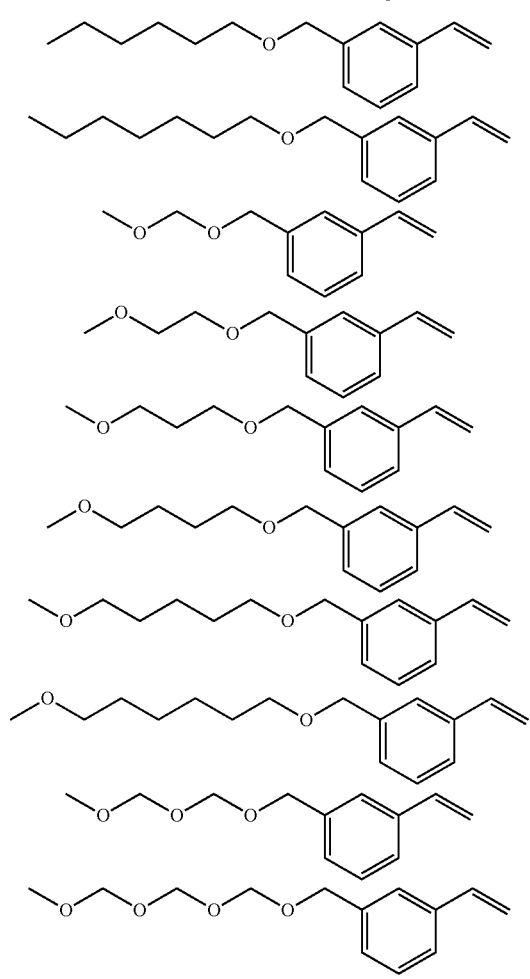
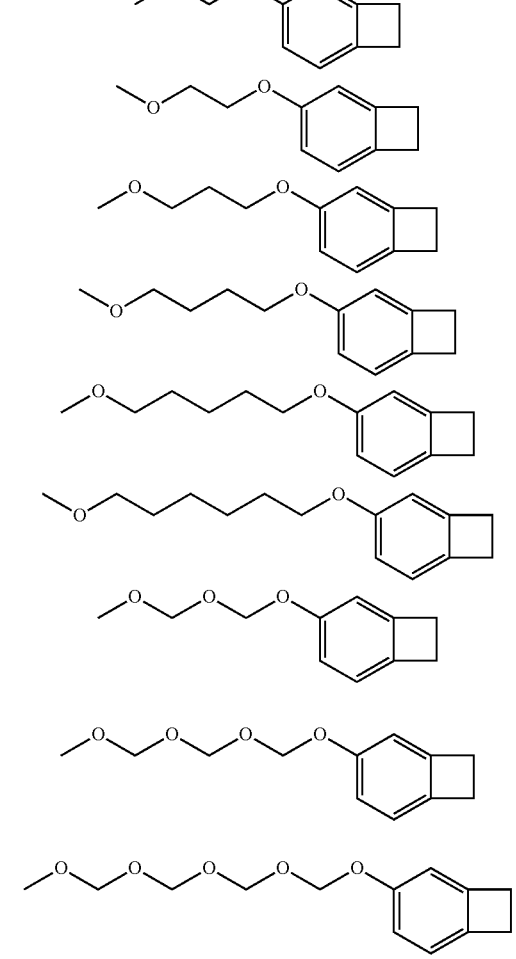

Substituent Group (K)
[Chemical Formula 27]
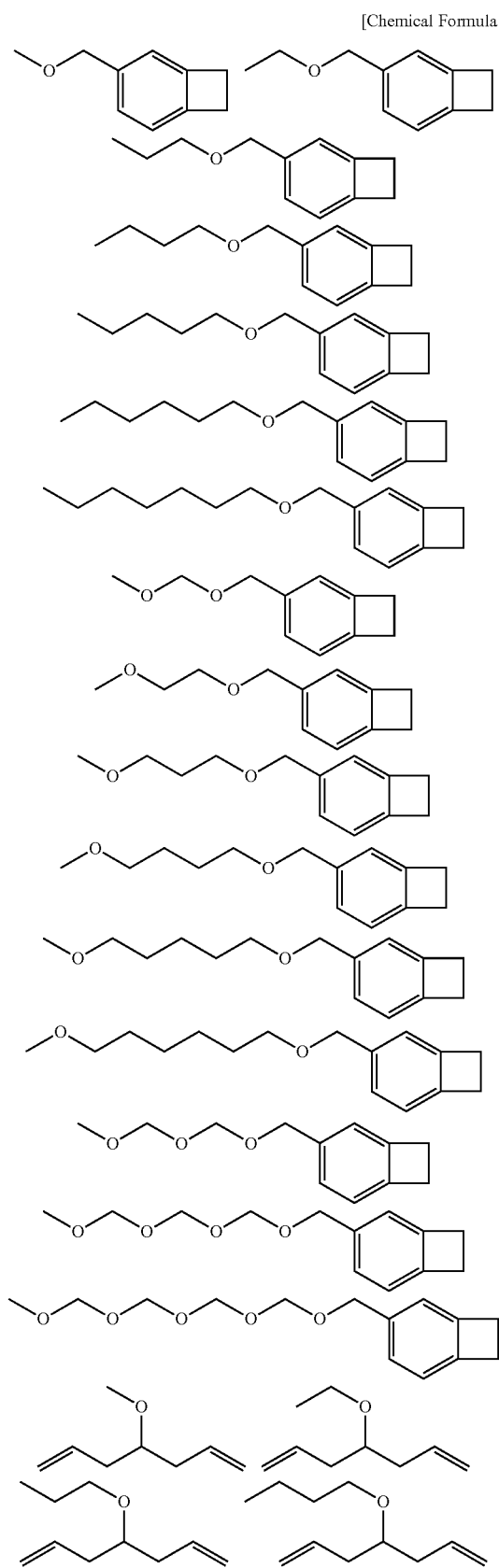
Substituent Group (L)
[Chemical Formula 28]
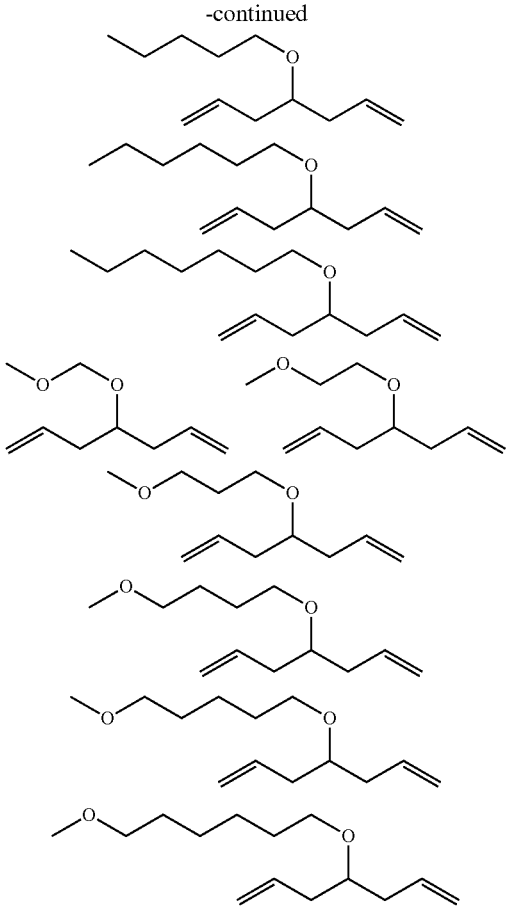
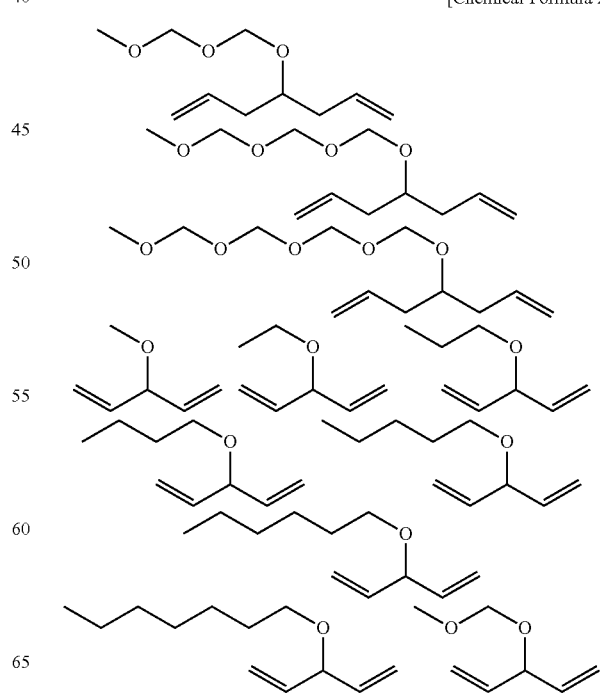

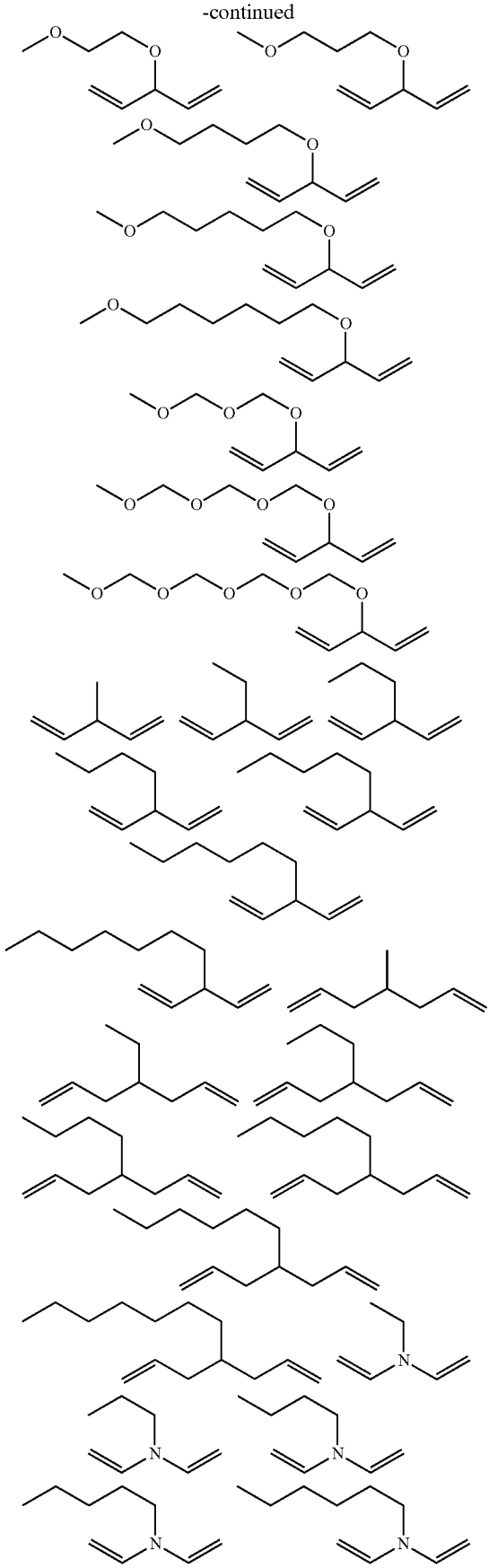
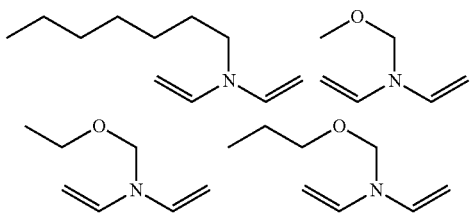
Substituent Group (M)
[Chemical Formula 29]
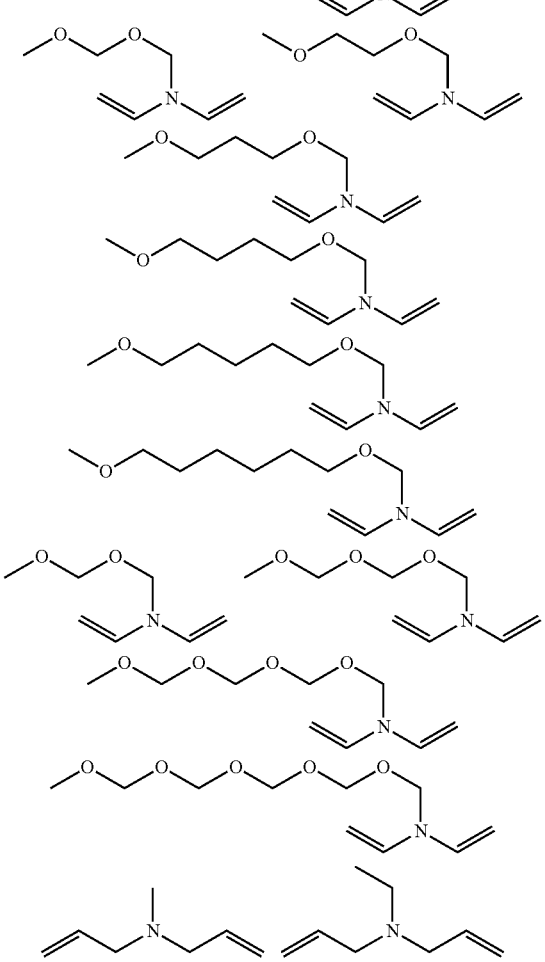

49
-continued
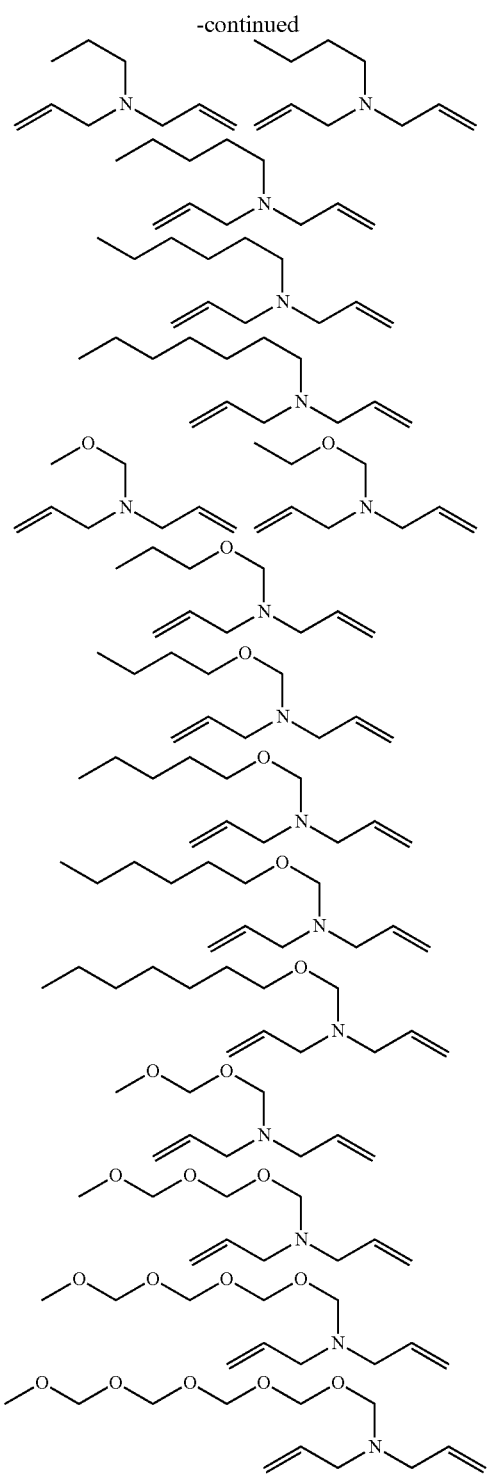
Substituent Group (N)
[Chemical Formula 30]
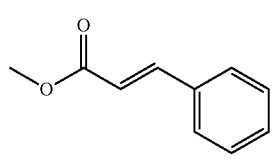
50
-continued
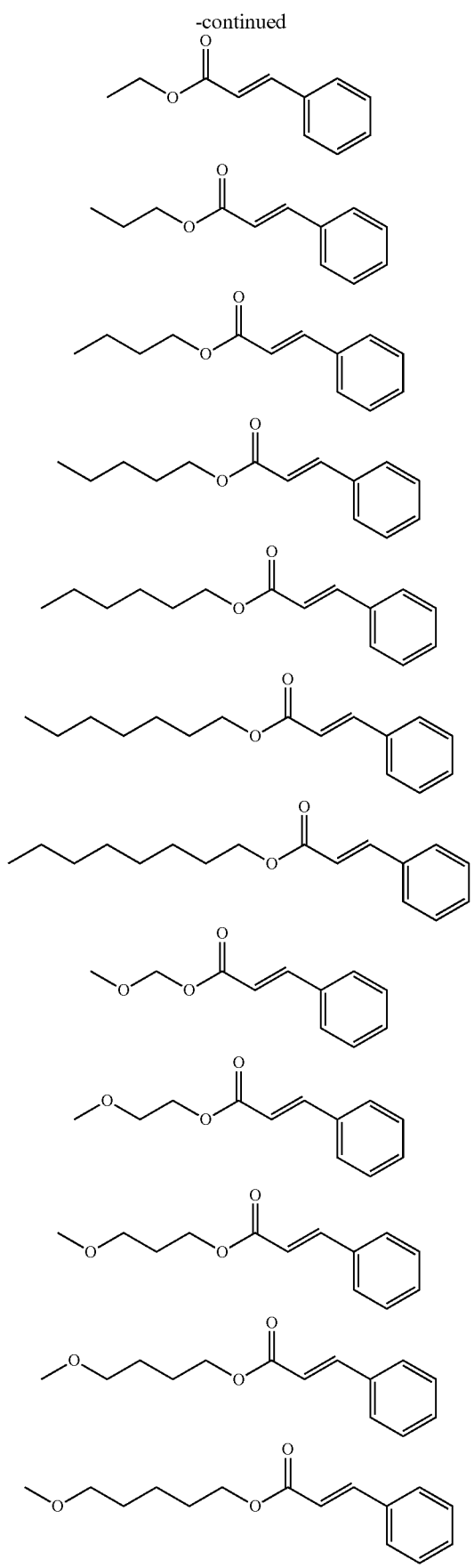

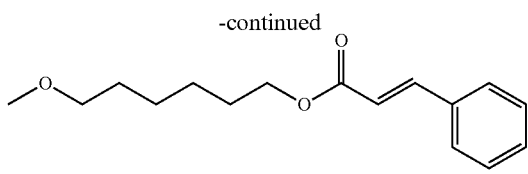

Linker Group (A)

[Chemical Formula 31]

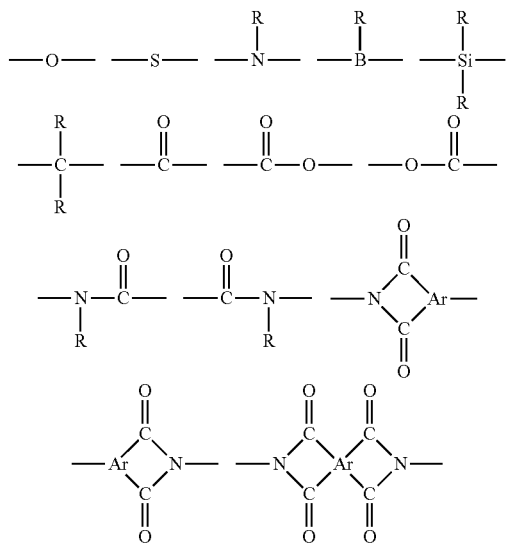

Furthermore, the charge transporting compound according to the present invention may be a commercially available product, or may be synthesized by a method that is known to those skilled in the art, and there are no particular limitations.

Also, the ionic compound according to the present invention is preferably an onium salt from the viewpoint of enhancing charge transportability.

Here, the onium salt according to the present invention means, for example, a compound formed from a cation such as a sulfonium ion, an iodonium ion, a selenium ion, an ammonium ion, a phosphonium ion, an oxonium ion or a bismuthonium ion, and a counter anion. Examples of the anion include halogen ions such as $F^-$, $Cl^-$, $Br^-$ and $I^-$; $OH^-$; $ClO_4^-$; sulfonic acid ions such as $FSO_3^-$, $ClSO_3^-$, $CH_3SO_3^-$, $C_6H_5SO_3^-$ and $CF_3SO_3^-$; sulfuric acid ions such as $HSO_4^-$ and $SO_4^{2-}$; carbonic acid ions such as $HCO_3^-$ and $CO_3^{2-}$; phosphoric acid ions such as $H_2PO_4^-$, $HPO_4^{2-}$ and $PO_4^{3-}$; fluorophosphoric acid ions such as $PF_6^-$ and $PF_5OH^-$; boric acid ions such as $BF_4^-$, $B(C_6F_5)_4^-$ and $B(C_6H_4CF_3)_4^-$; $AlCl_4^-$; $BiF_6^-$; fluoroantimonic acid ions such as $SbF_6^-$ and $SbF_5OH^-$; and fluoroarsenic acid ions such as $AsF_6^-$ and $AsF_5OH^-$.

The examples of the cation described above are the same as the examples described previous for the formulas (8b) to (10b).

Furthermore, the charge transporting compound according to the present invention preferably includes at least one of aromatic amine, carbazole and thiophene compounds in order to have highly efficient charge transportability.

Also, according to the present invention, these charge transporting compounds are preferably polymers or oligomers, from the viewpoints of solubility and film forming properties.

When the charge transporting compound is a polymer or an oligomer, the number average molecular weight is preferably from 1,000 to 1,000,000, from the viewpoints of solubility in solvents and film forming properties. The number average molecular weight is more preferably from 2,000 to 900,000, and even more preferably from 3,000 to 800,000. If the number average molecular weight is smaller than 1,000, the compound is easily crystallized, and the film forming properties deteriorate. Also, if the number average molecular weight is greater than 1,000,000, solubility in solvents is decreases, and it is difficult to prepare a coating solution or a coating ink.

Furthermore, the polymer or oligomer preferably contains any one of repeating units represented by the following formulas (1a) to (84a).

[Chemical Formula 32]

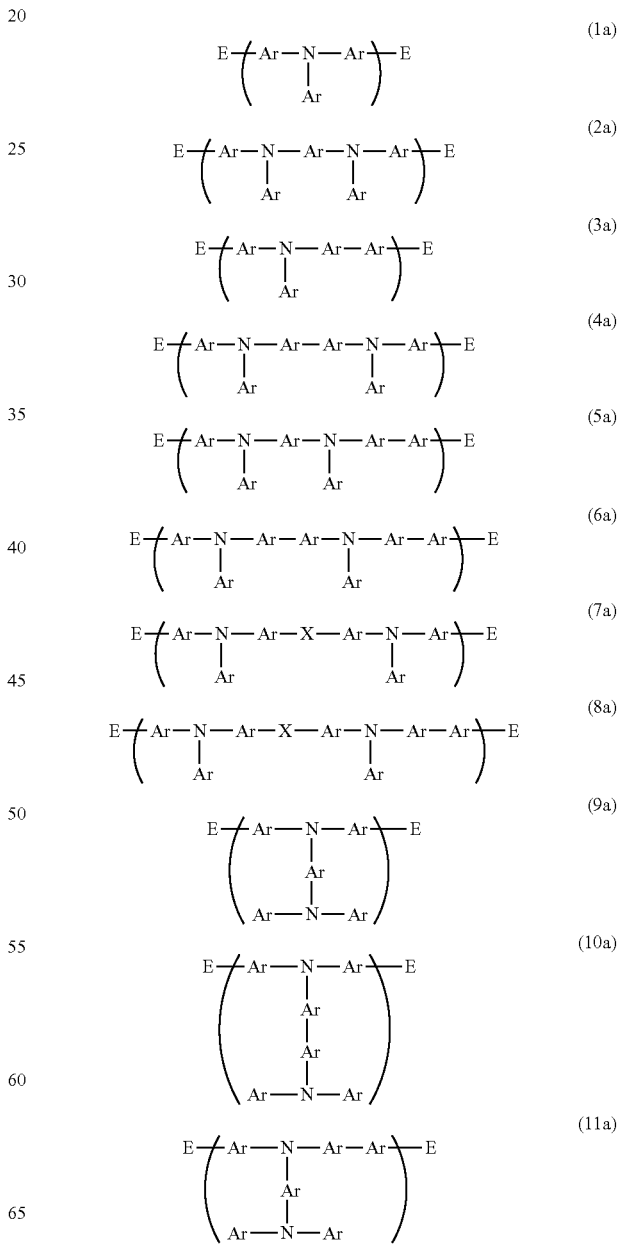

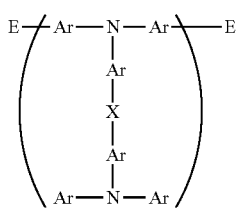
(12a)
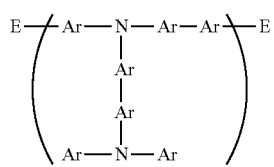
(13a)
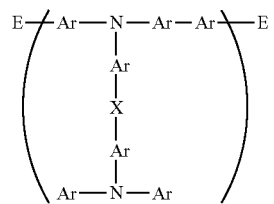
(14a)
[Chemical Formula 33]
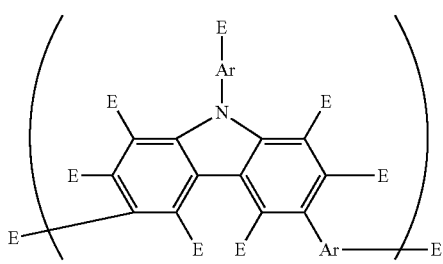
(18a)
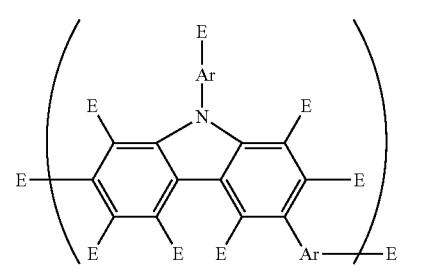
(19a)
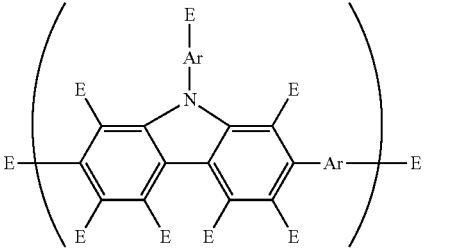
(20a)
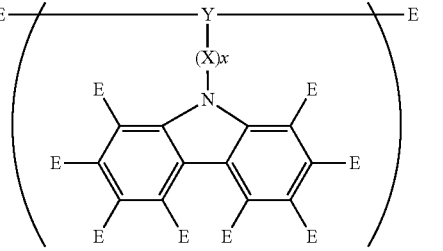
(21a)
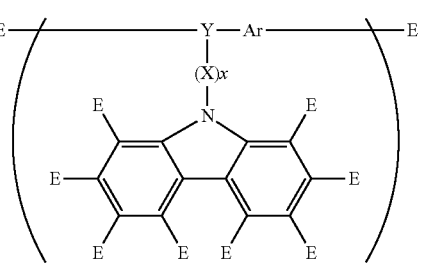
(22a)
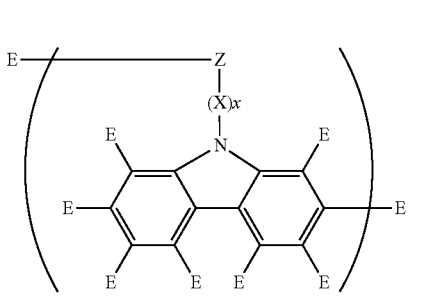
(23a)
(15a)
(16a)
(17a)

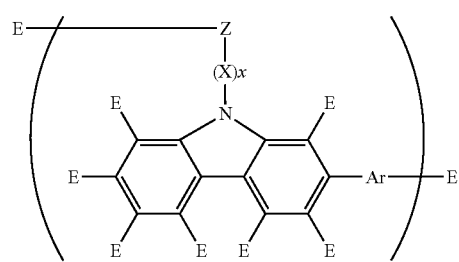
(24a)
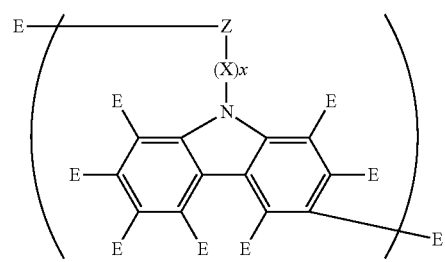
(25a)
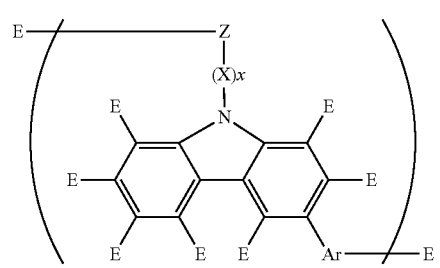
(26a)
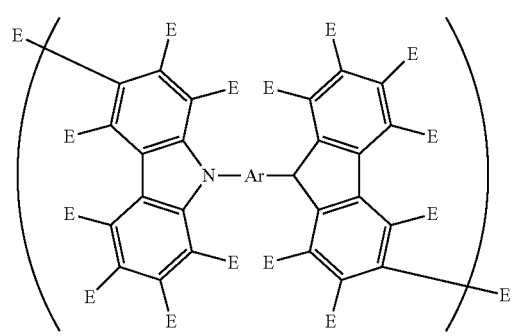
(27a)
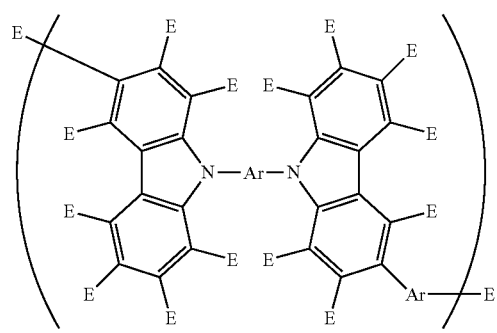
(28a)
[Chemical Formula 34]
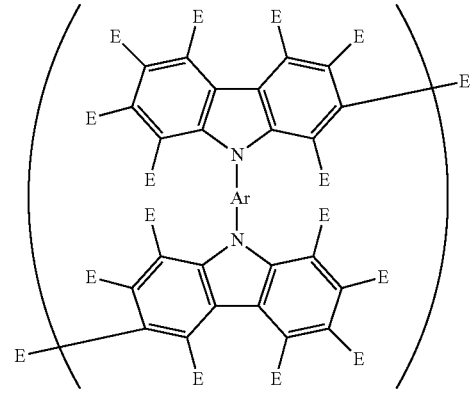
(29a)
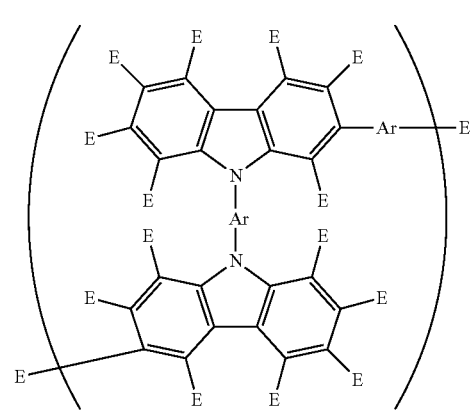
(30a)
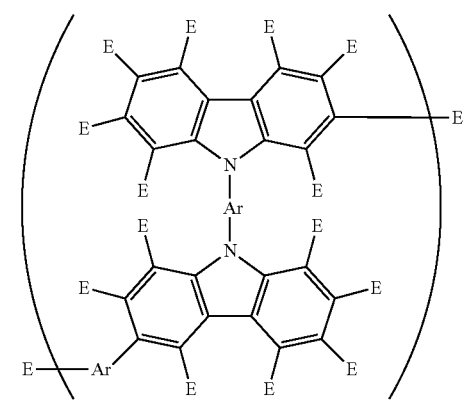
(31a)
(32a)

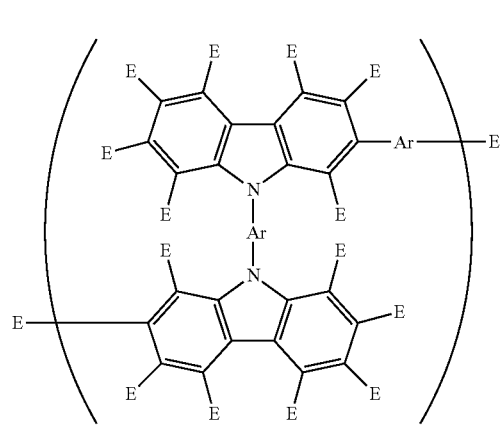 (33a)
[Chemical Formula 35]
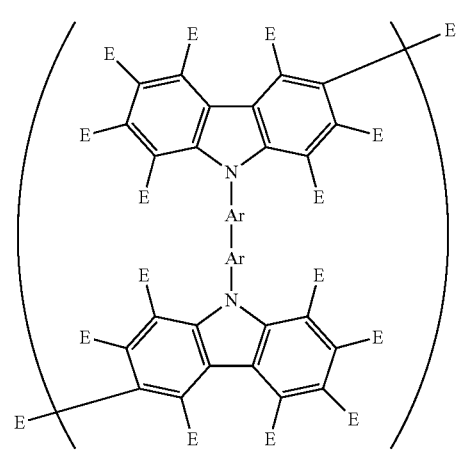 (34a)
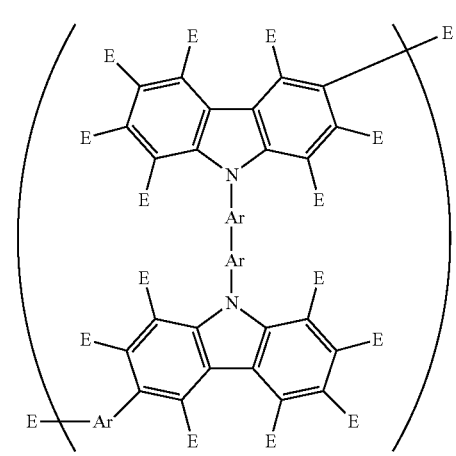 (35a)
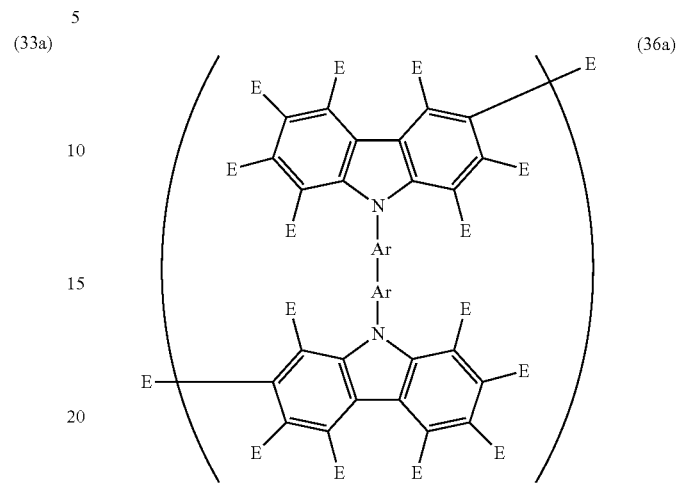 (36a)
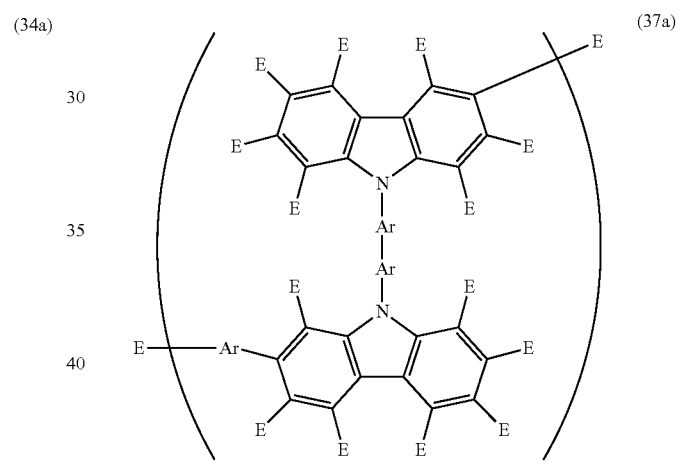 (37a)
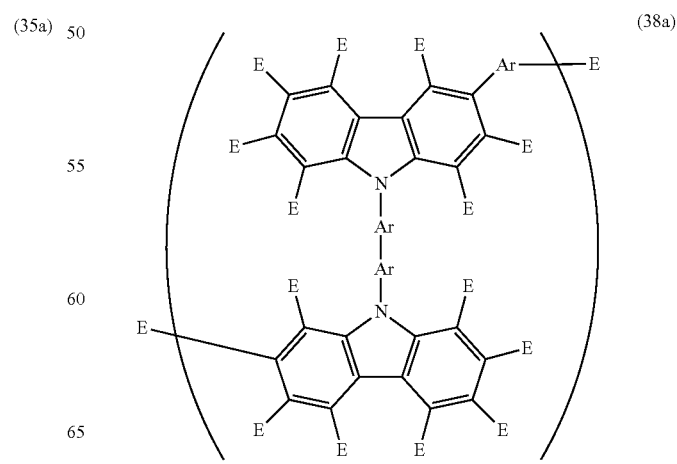 (38a)

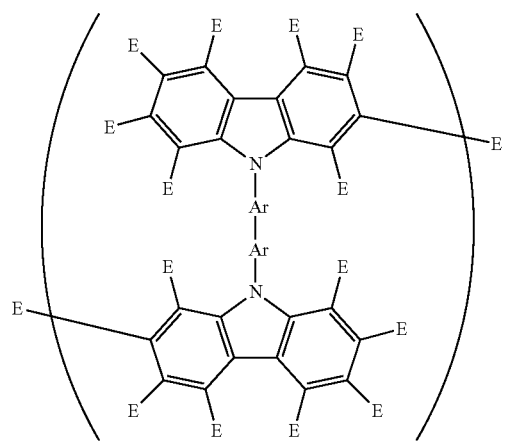
(39a)
[Chemical Formula 36]
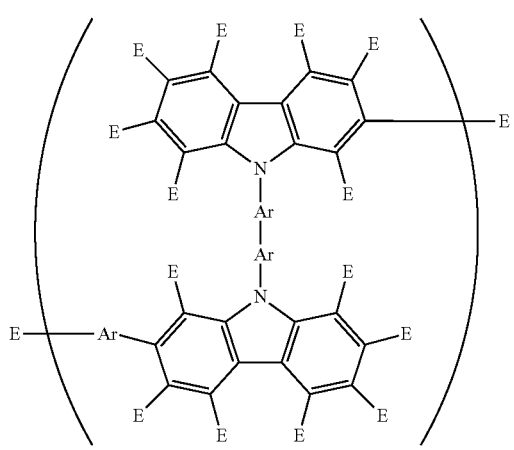
(40a)
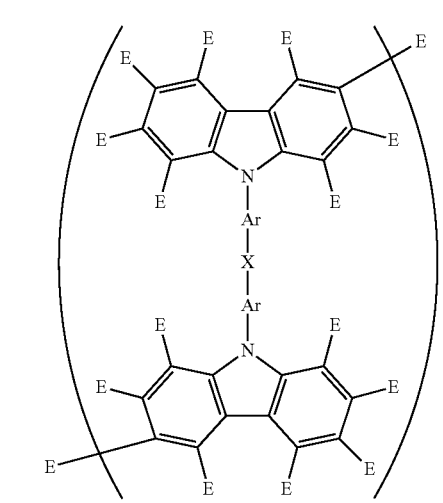
(41a)
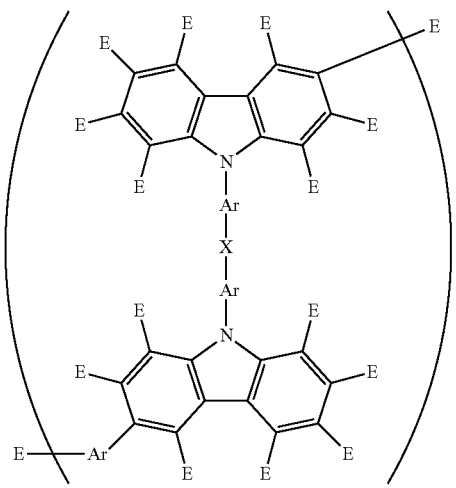
(42a)
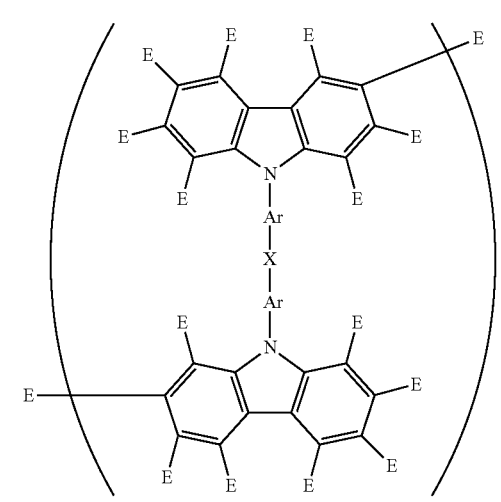
(43a)
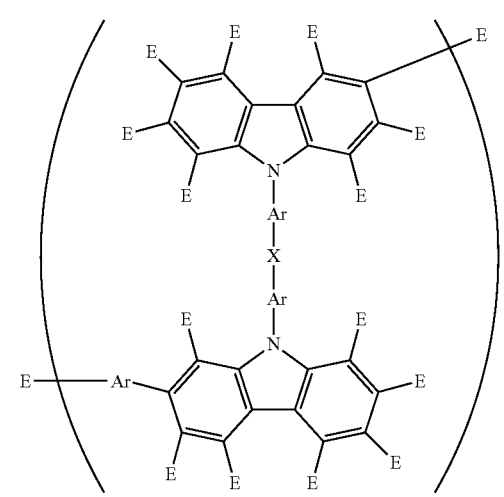
(44a)

[Chemical Formula 37]
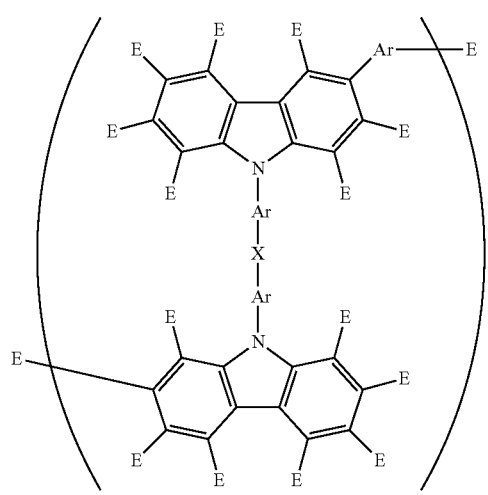
(45a)
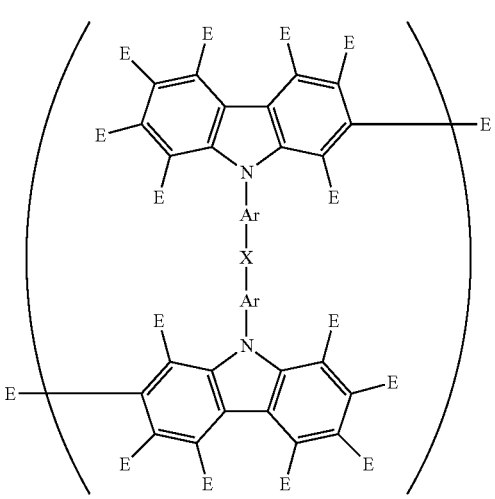
(46a)
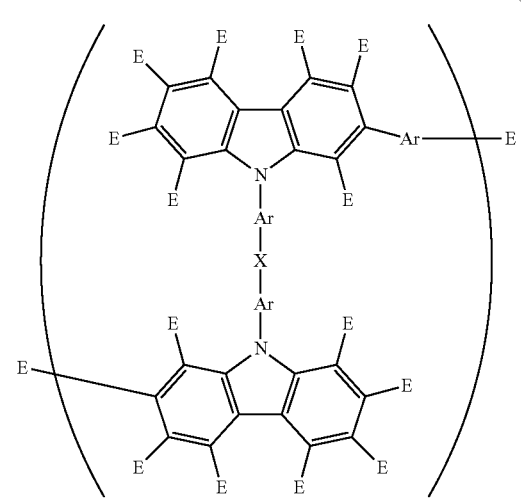
(47a)
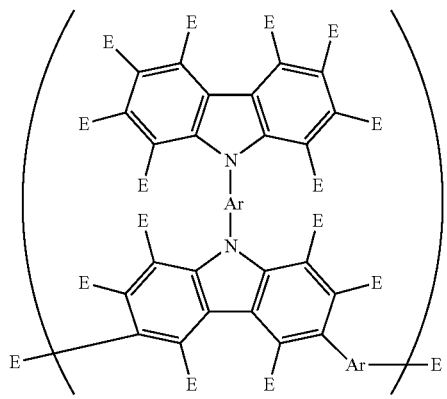
(48a)
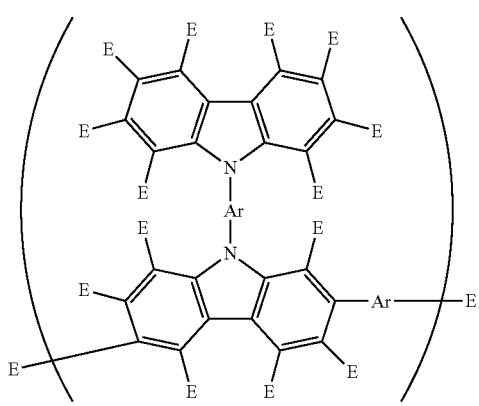
(49a)
[Chemical Formula 38]
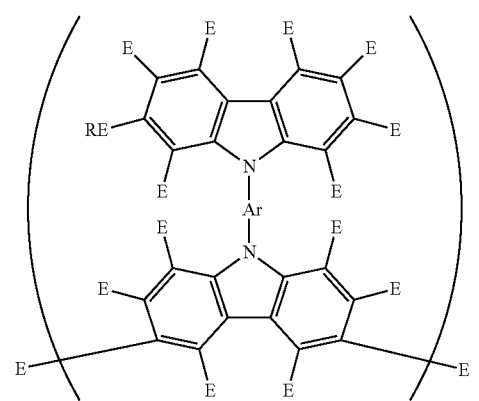
(50a)
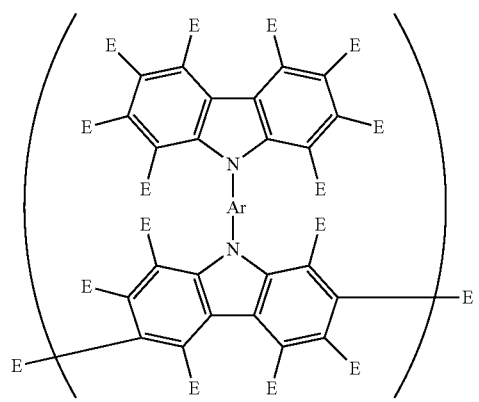
(51a)

[Chemical Formula 39]
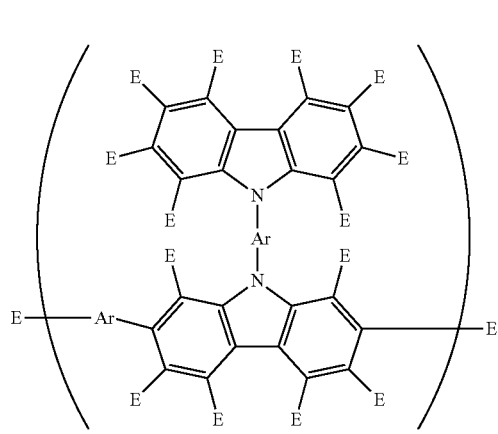 (52a)
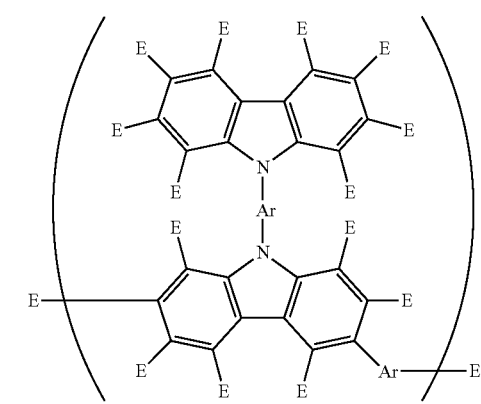 (53a)
(54a)
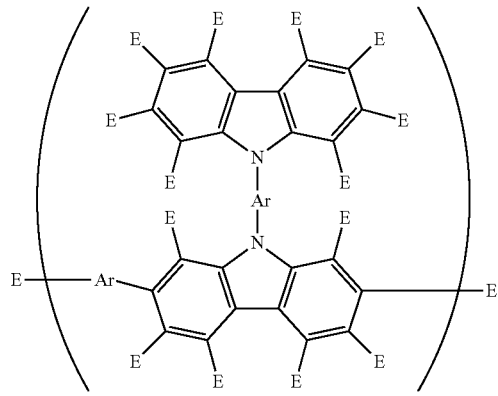 (55a)
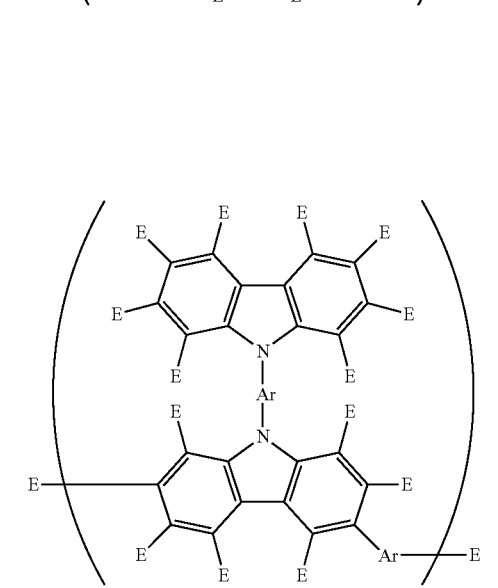 (56a)
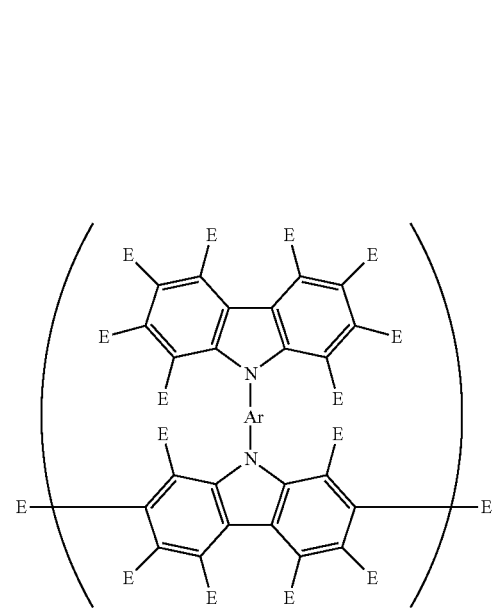 (57a)

[Chemical Formula 40]
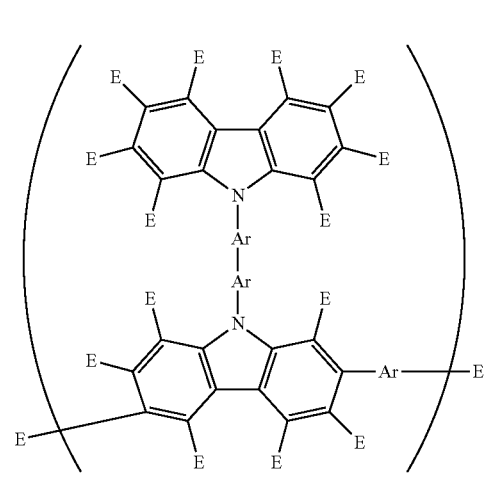 (58a)
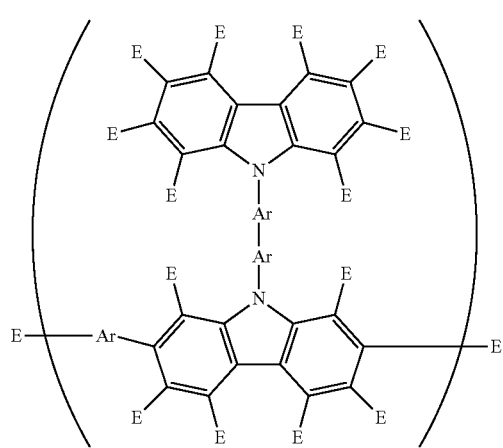 (59a)
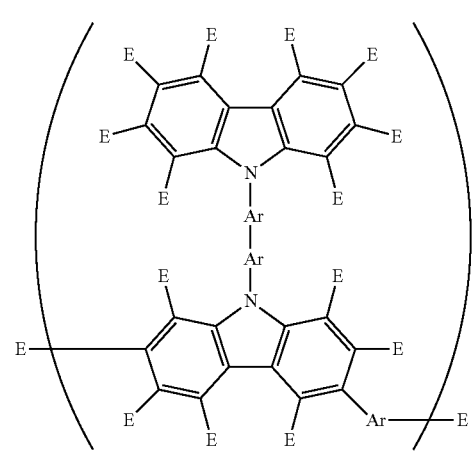 (60a)
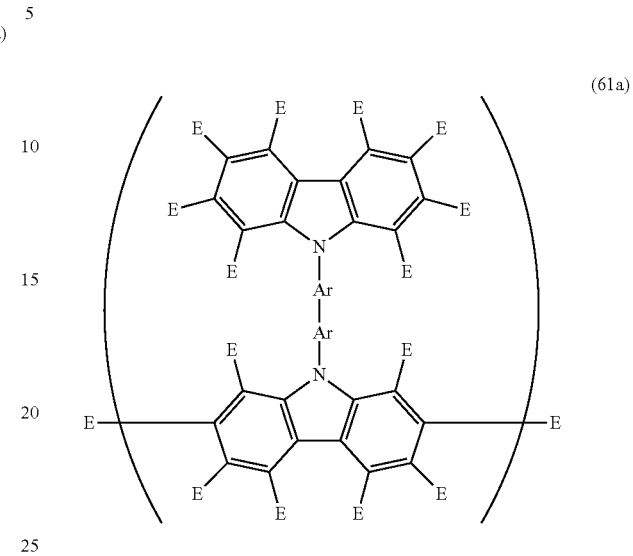 (61a)
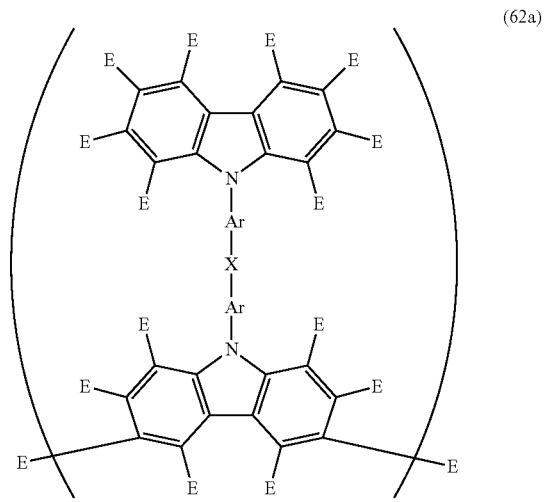 (62a)
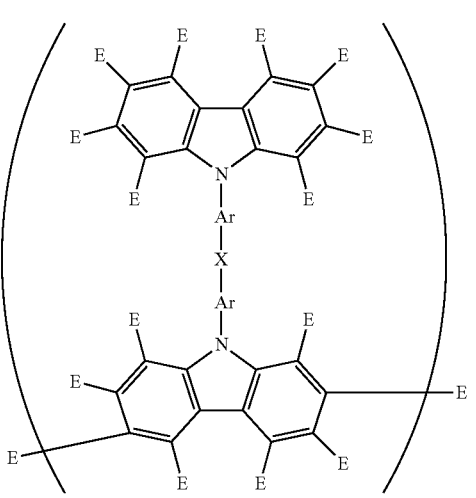 (63a)

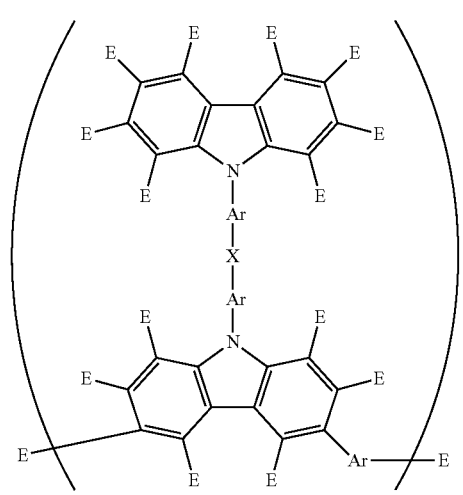
(64a)
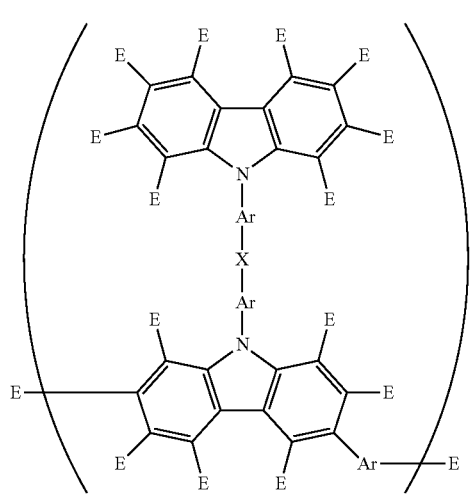
(67a)
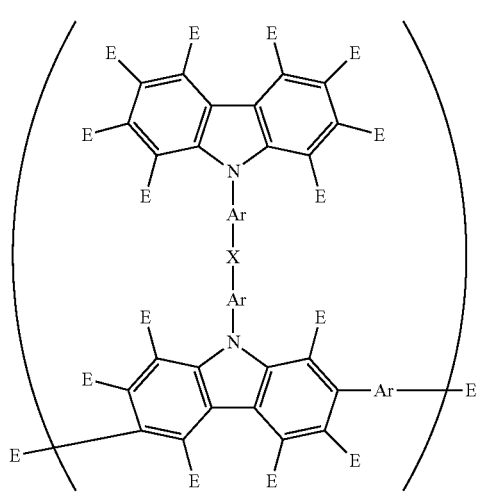
(65a)
[Chemical Formula 41]
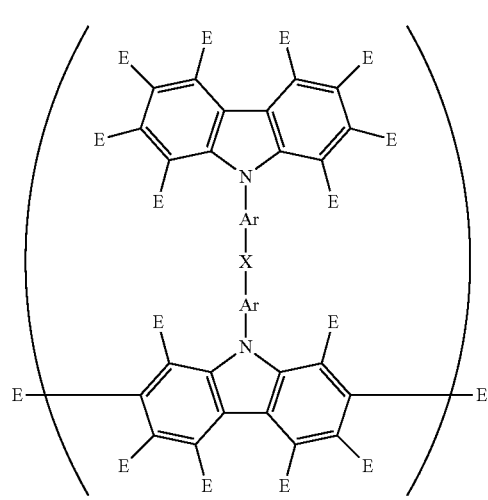
(68a)
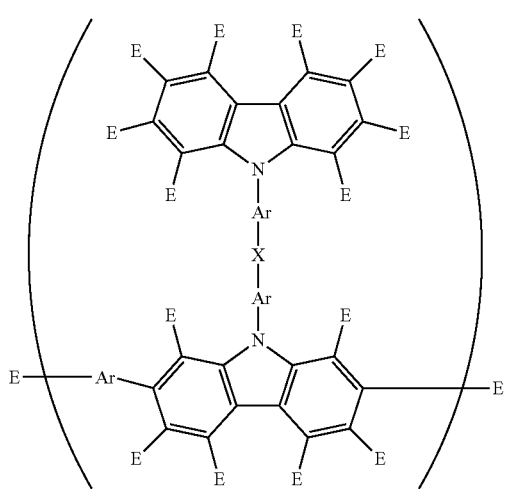
(66a)
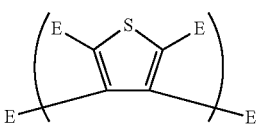
(69a)
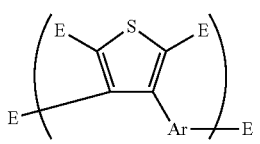
(70a)
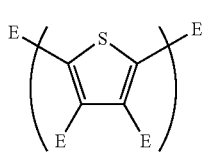
(71a)
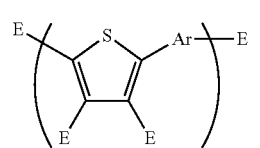
(72a)

-continued (73a) 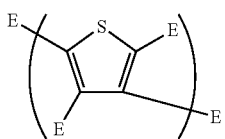

(74a) 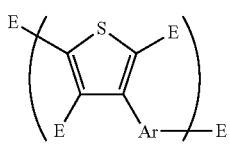

(75a) 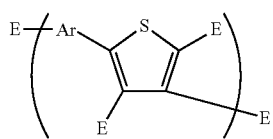

[Chemical Formula 42]

(76a) 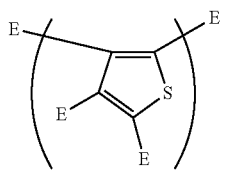

(77a) 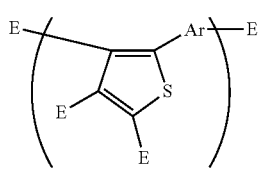

(78a) 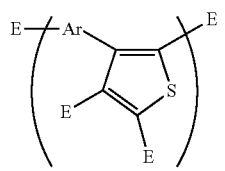

(79a) 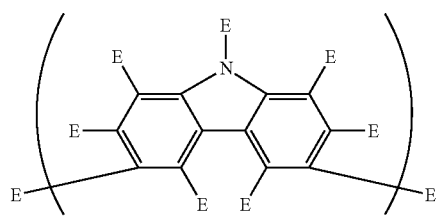

(80a) 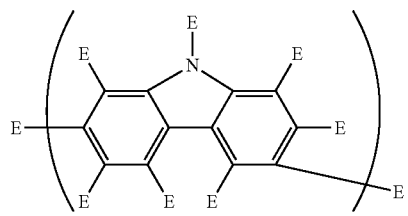

-continued (81a) 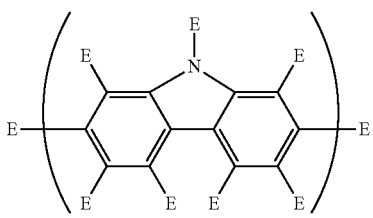

(82a) 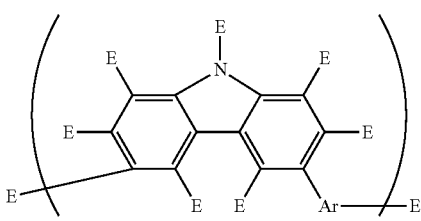

(83a) 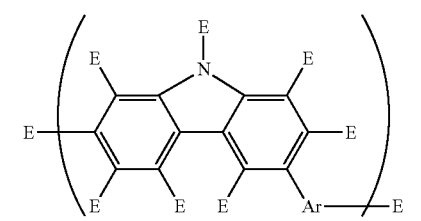

(84a) 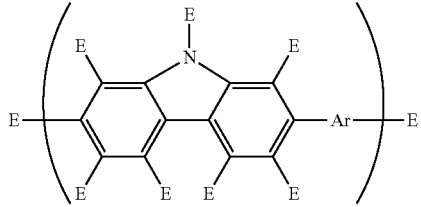

Furthermore, in order to change the solubility of the polymer or oligomer, it is preferable that the polymer or oligomer have one or more "polymerizable substituents." Here, the term "polymerizable substituent" is a substituent which is capable of forming a bond between the molecules of two or more molecules by inducing a polymerization reaction, and hereinafter, the details will be described.

Examples of the polymerizable substituent include a group having a carbon-carbon multiple bond (examples include a vinyl group, an acetylene group, a butenyl group, an acryl group, an acrylate group, an acrylamide group, a methacryl group, a methacrylate group, a methacrylamide group, an arene group, an allyl group, a vinyl ether group, a vinylamino group, a furyl group, a pyrrole group, a thiophene group, and a silol group), a group having a small-membered ring (for example, a cyclopropyl group, a cyclobutyl group, an epoxy group, an oxetane group, a diketene group, or an episulfide group), a lactone group, a lactam group, or a group containing a siloxane derivative. Also, in addition to the groups described above, combinations of groups capable of forming ester bonds or amide bonds can also be utilized. Examples thereof include a combination of an ester group and amino group, and a combination of an ester group and a hydroxyl group. The polymerizable substituent is particularly preferably an oxetane group, an epoxy group, a vinyl group, a vinyl ether group, an acrylate group, or a methacrylate group, from the viewpoints of reactivity, and an oxetane group is most preferred. From the viewpoint of increasing the degree of freedom of the polymerizable substituent and making it easier to cause a curing reaction, it is more preferable that the main chain and the polymerizable substituent of the polymer or oligomer be linked by an alkyl chain having 1 to 8 carbon atoms. Also, from the viewpoint of increasing the affinity with a hydrophilic electrode such as ITO, it is more preferable that the alkyl chain be a hydrophilic group such as ethylene glycol or diethylene glycol. Furthermore, from the viewpoint that preparation of the corresponding monomer is facilitated, the end area of the alkyl chain, that is, the linkage area to the polymerizable substituent or the linkage area to the polymer or oligomer main chain, may have an ether bond, and specific examples thereof include the ether bonds represented by the Substituent Groups (A) to (C).

Furthermore, in view of the regulation of solubility, heat resistance or electrical characteristics, the polymer or oligomer according to the present invention may also be a copolymer having, in addition to the repeating units described above, a structure represented by the following Structural Formula Group (X) as an arylene group or a heteroarylene group, as a copolymerization repeating unit. In this case, the copolymer may be a random, block or graft copolymer, or may be a polymer having an intermediate structure thereof, for example, a random copolymer having block-like properties. Also, the polymer or oligomer used in the present invention may have a branch in the main chain, thereby having three or more chain ends.

Structural Formula Group (X)

[Chemical Formula 43]

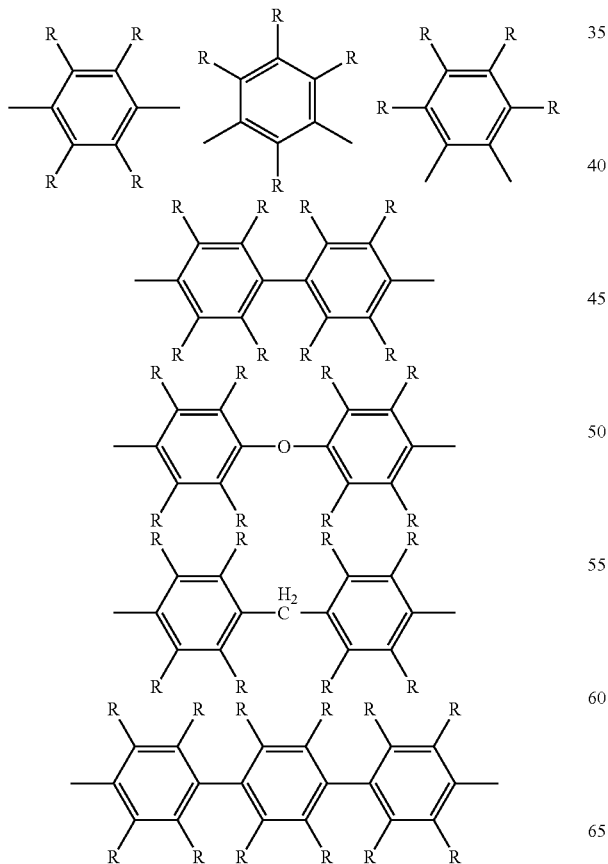

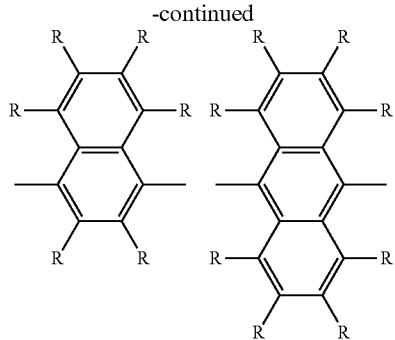

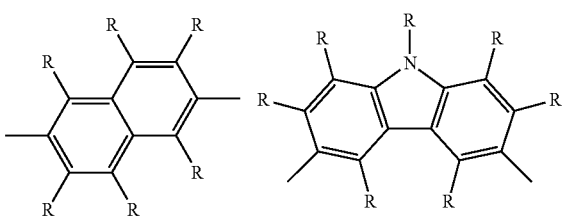

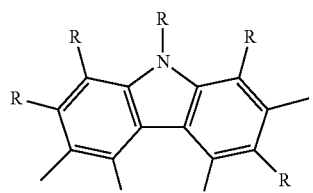

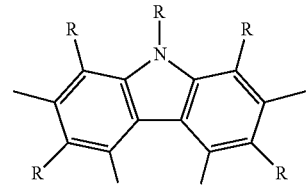

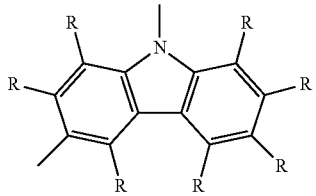

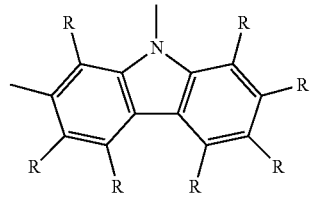

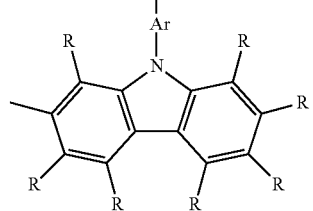

-continued

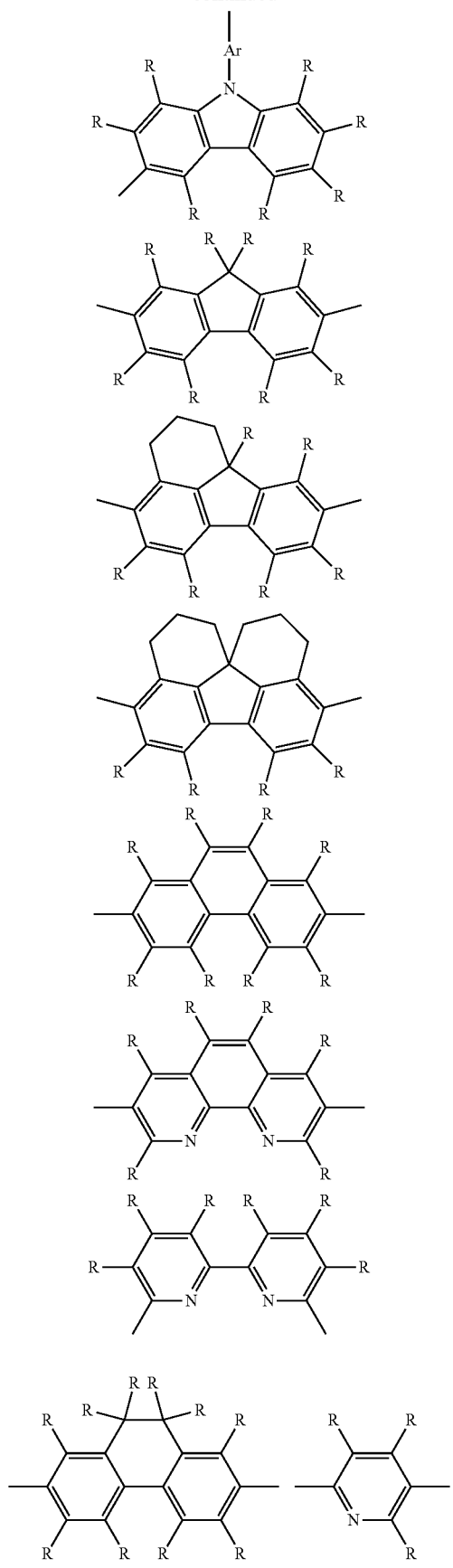

-continued

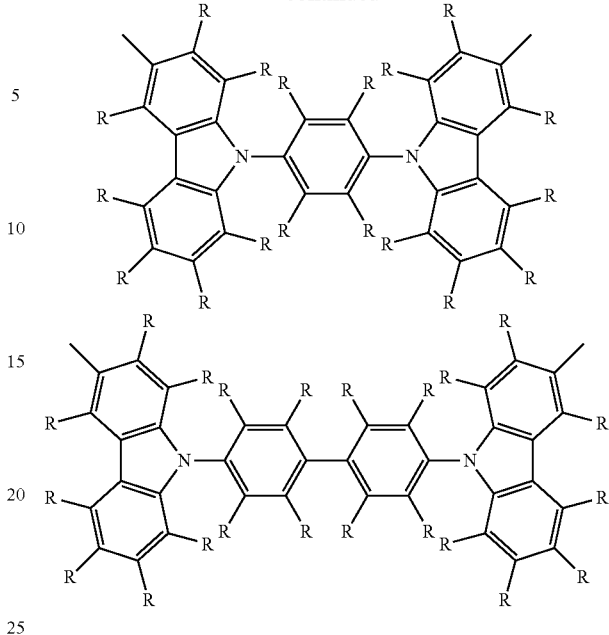

Furthermore, the ionic compound related to the present invention can be used alone as a polymerization initiator. That is, the polymerization initiator of the present invention is characterized by including at least one of the ionic compounds represented by the formulas (1b) to (3b) previously described in connection with the present invention.

The trigger that initiates polymerization may be any means that exhibits an ability to polymerize the polymerizable substituent by application of heat, light, microwaves, radiation, electron beams and the like. Although there are no particular limitations, it is preferable to initiate polymerization by light irradiation and/or heating, and it is most preferable to initiate polymerization by heating. That is, the ionic compound related to the present invention can be used as a thermal polymerization initiator, and the thermal polymerization initiator of the present invention is characterized by including at least one of the ionic compounds represented by the formulas (1b) to (3b) according to the present invention described above.

Furthermore, the ionic compound related to the present invention can be used as a polymerization initiator that imparts solvent resistance to organic thin films by a polymerization reaction.

The method of the present invention for producing an organic thin film involves application of the action of this polymerization initiator to a method for producing an organic thin film. That is, the method of the present invention for producing an organic thin film is characterized by including a process of imparting solvent resistance to an organic thin film by using the polymerization initiator of the present invention described above.

In the method of the present invention for producing an organic thin film, the conditions for using the polymerization initiator at the time of imparting solvent resistance to an organic thin film by using the polymerization initiator of the present invention are such that a thin film of a charge transporting compound is formed by using a polymerization initiator in an amount of 0.1% to 50% by mass, and then the thin film may be heated in a vacuum, in air, or in a nitrogen atmosphere. The heating temperature and time are not particularly limited as long as the polymerization reaction is allowed to proceed satisfactorily. However, with regard to the temperature, since various substrates can be applied, the temperature is preferably 300° C. or lower, more preferably 200° C. or lower, and even more preferably 150° C. or lower. The time is preferably 2 hours or less, more preferably 1 hour or less, and even more preferably 30 minutes or less, from the viewpoint of increasing productivity.

Furthermore, it is preferable that the organic electronic material of the present invention contain a polymerization initiator in order to utilize the difference in solubility caused by a polymerization reaction.

This polymerization initiator may be any compound which exhibits an ability to polymerize a polymerizable substituent by applying heat, light, microwaves, radiation, electron beams and the like, and although there are no particularly limitations, a compound which initiates polymerization by light irradiation and/or heating is preferred.

The proportion of the polymerization initiator in the charge transporting film according to the invention may be any amount by which polymerization proceeds satisfactorily and is not particularly limited; however, the proportion is preferably 0.1% by mass to 50% by mass. If the proportion is less than this, the polymerization does not efficiently proceed, and solubility may not be sufficiently changed. Furthermore, if the proportion is greater than this, a large amount of the polymerization initiator and/or degradation products remains, and thereby, the effect obtainable by cleaning is reduced.

Furthermore, the polymerization initiator of the invention may include a sensitizer for enhancing photosensitivity and/or thermosensitivity, in addition to the polymerization initiator described above.

Furthermore, from the viewpoint of imparting a charge transportability enhancing function and a polymerization initiating function, the polymerization initiator according to the invention is preferably one of the ionic compounds described above.

Furthermore, the ink composition of the invention is characterized by containing the organic electronic material of the invention described above and a solvent, and may also contain other additives, for example, a polymerization inhibitor, a stabilizer, a thickening agent, a gelling agent, a flame retardant, an oxidation inhibitor, a reduction inhibitor, an oxidizing agent, a reducing agent, a surface modifying agent, an emulsifier, a defoamant, a dispersant, and a surfactant. Examples of the solvent include water; alcohols such as methanol, ethanol and isopropyl alcohol; alkanes such as pentane, hexane and octane; cyclic alkanes such as cyclohexane; aromatic solvents such as benzene, toluene, xylene, mesitylene, tetraline and diphenylmethane; aliphatic ethers such as ethylene glycol dimethyl ether, ethylene glycol diethyl ether, and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; amide-based solvents such as N,N-dimethylformamide and N,N-dimethylacetamide; as well as dimethyl sulfoxide, tetrahydrofuran, acetone, chloroform, and methylene chloride. Preferably, aromatic solvents, aliphatic esters, aromatic esters, aliphatic ethers, and aromatic ethers can be used.

In the ink composition of the invention, the content of the organic electronic material with respect to the solvent is preferably set to 0.1% to 30% by mass, from the viewpoint that the ink composition can be applied to various coating processes.

Furthermore, the organic electronic element of the invention includes an organic thin film formed from the organic electronic material described above and/or the ink composition described above.

Similarly, the organic electroluminescent element (organic EL element) of the invention includes an organic thin film formed from the organic electronic material described above and/or the ink composition described above.

Both of these elements include excellent organic thin films formed by using the organic electronic material of the invention as the organic thin films, and have lower driving voltages and longer emission lifetimes than the conventional elements.

Hereinafter, the EL element of the invention will be described in detail.

[Organic EL Element]

The organic electronic element of the invention is characterized by including an organic thin film formed from an organic electronic material which contains charge transporting compounds and ionic compounds. The organic EL element of the invention is not particularly limited as long as it includes a light emitting layer, a polymerized layer, a positive electrode, a negative electrode, and a substrate, and may also have other layers such as a hole injection layer, an electronic injection layer, a hole transport layer and an electron transport layer. Furthermore, it is preferable to apply the organic thin film of the invention to the hole injection layer or the hole transport layer.

Hereinafter, the various layers will be described in detail.

[Light Emitting Layer]

The material used in the light emitting layer may be a low molecular weight compound, a polymer or an oligomer, and a dendrimer or the like can also be used. Examples of low molecular weight compounds which utilize fluorescence light emission include perylene, coumarin, rubrene, quinacridone, dyes for dye lasers (for example, rhodamine and DCM1), aluminum complexes (for example, Tris(8-hydroxyquinolinato)aluminum(III) ($Alq_3$)), stilbene, and derivatives thereof. Regarding polymers or oligomers which utilize fluorescence light emission, polyfluorene, polyphenylene, polyphenylenevinylene (PPV), polyvinylcarbazole (PVK), fluorene-benzothiazole copolymers, fluorene-triphenylamine copolymers, and derivatives or mixtures thereof can be suitably used.

On the other hand, due to the recent enhancement of the efficiency of organic EL elements, development of phosphorescent organic EL elements is also in active progress. In phosphorescent organic EL elements, it is possible to utilize singlet state energy as well as triplet state energy, and the internal quantum yield can be increased to 100% in principle. In the phosphorescent organic EL elements, phosphorescent light emission is extracted by doping a host material with a metal complex-based phosphorescent material containing a heavy metal such as platinum or iridium as a dopant that emits phosphorescence (see M. A. Baldo et al., Nature, Vol. 395, p. 151 (1998); M. A. Baldo et al., Applied Physics Letters, Vol. 75, p. 4 (1999); and M. A. Baldo et al., Nature, Vol. 403, p. 750 (2000)).

It is also preferable to use a phosphorescent material in the light emitting layer of the organic EL element of the invention, from the viewpoint of increasing the efficiency. As the phosphorescent material, a metal complex containing a central metal atom of Ir, Pt or the like, and the like can be suitably used. Specific examples include, as an Ir complexes, FIr(pic) [iridium(III) bis[(4,6-difluorophenyl)-pyridinato-N,$C^2$]picolinate], which emits blue light; Ir(ppy)$_3$[fac-tris(2-phenylpyridine)iridium], which emits green light (see M. A. Baldo et al., Nature, Vol. 403, p. 750 (2000)); or (btp)$_2$Ir(acac) {bis[2-(2'-benzo[4,5-a]thienyl) pyridinato-N,C3]iridium (acetylacetonate)} and Ir(piq)$_3$ [tris (1-phenylisoquinoline)iridium], which emit red light, as disclosed in Adachi et al., Appl. Phys. Lett., 78, No. 11, 2001, 1622.

Examples of Pt complexes include 2,3,7,8,12,13,17,18-octaethyl-21H,23H-phorphine platinum (PtOEP), which emits red light.

As for the phosphorescent material, a low molecular weight compound or a dendride species, for example, an iridium-cored dendrimer, can be used. Derivatives thereof can also be suitably used.

Furthermore, when the light emitting layer contains a phosphorescent material, it is preferable that the light emitting layer contains a host material in addition to the phosphorescent material.

The host material may be a low molecular weight compound or a polymeric compound, and a dendrimer or the like can also be used.

Examples of the low molecular weight compound include CBP (4,4'-Bis(Carbazol-9-yl)-biphenyl), mCP (1,3-bis(9-carbazolyl)benzene), and CDBP (4,4'-Bis(Carbazol-9-yl)-2, 2'-dimethylbiphenyl). Examples of the polymeric compound that can be used include polyvinylcarbazole, polyphenylene, and polyfluorene, and derivatives thereof can also be used.

The light emitting layer may be formed by a vapor deposition method, or may be formed by a coating method.

In the case of forming the light emitting layer by a coating method, it is more preferable because the organic EL element can be produced at low cost. In order to form a light emitting layer according to a coating method, the light emitting layer can be formed by applying a solution containing a phosphorescent material and, if necessary, a host material on a desired substrate by a known method such as a printing method, for example, an inkjet method, a casting method, an immersion method, relief printing, intaglio printing, offset printing, planographic printing, relief reverse offset printing, screen printing or gravure printing; or a spin coating method.

[Negative Electrode]

The negative electrode material is preferably a metal or a metal alloy such as, for example, Li, Ca, Mg, Al, In, Cs, Ba, Mg/Ag, LiF or CsF.

[Positive Electrode]

As the positive electrode, a metal (for example, Au) or some other material having a metal conductivity, for example, an oxide (for example, ITO: indium oxide/tin oxide), or a conductive polymer (for example, a polythiophene-polystyrenesulfonic acid compound (PEDOT:PSS)) can be used.

[Electron Transport Layer and Electron Injection Layer]

Examples of the electron transport layer and the electron injection layer include phenanthroline derivatives (for example, 2,9-dimethyl-4,7-diphenyl-1,10-phenanthroline (BCP)), bipyridine derivatives, nitro-substituted fluorene derivatives, diphenylquinone derivatives, thiopyrane dioxide derivatives, heterocyclic tetracarboxylic acid anhydrides such as naphthaleneperylene, carbodiimides, fluorenylidenemethane derivatives, anthraquinodimethane and anthrone derivatives, oxadiazole derivatives (2-(4-biphenylyl)-5-(4-tert-butylphenyl-1,3,4-oxadiazole) (PBD)), and aluminum complexes (for example, tris(8-hydroxyquinolinato)aluminum(III) (Alq$_3$)). Furthermore, thiadiazole derivatives that are obtained by substituting the oxygen atom of the oxadiazole ring in the oxadiazole derivative with a sulfur atom, and quinoxaline derivatives having a quinoxaline ring that is known as an electron-withdrawing group, can also be used.

[Substrate]

As a substrate that can be used in the organic EL element of the invention, the types of glass, plastics and the like are not particularly limited, and there is no particular limitation thereon as long as the material is transparent. However, glass, quartz, a translucent resin film and the like are preferably used. When a resin film is used, the organic EL element can be imparted with flexibility, which is particularly preferred.

Examples of the resin film include films formed from polyethylene terephthalate (PET), polyethylene naphthalate (PEN), polyether sulfone (PES), polyether imide, polyether ether ketone, polyphenylenesulfone, polyallylate, polyimide, polycarbonate (PC), cellulose triacetate (TAC), and cellulose acetate propionate (CAP).

Furthermore, in the case of using a resin film, the resin film may be used after coating the film with an organic substance such as silicon oxide or silicon nitride, in order to suppress permeation of water vapor or oxygen.

[Luminescent Color]

There is no particular limitation on the luminescent color in the organic EL element of the invention, but a white light emitting element is preferred because it can be used in various lighting devices such as home illumination, vehicle illumination, and back lights for timepieces and liquid crystals.

In regard to the method of forming a white light emitting element, since it is difficult for the present to express white light emission with a single material, white light emission is obtained by using plural luminescent materials, and causing the materials to emit plural luminescent colors all at the same time to thereby mix the colors. There is no particular limitation on the combination of plural luminescent colors, but examples thereof include a combination including three maximum emission wavelengths of blue, green and red, and combinations including two maximum emission wavelengths, which utilize the relationship of complementary colors such as blue and yellow, and yellow-green and orange. Furthermore, the control of luminescent colors can be achieved by adjusting the type and amount of the phosphorescent material.

<Display Element, Lighting Device, and Display Device>

The display element of the invention is characterized by including the organic EL element of the invention described above.

For example, a color display element may be obtained by using the organic EL element of the invention as elements corresponding to each of the pixels of red, green and blue (RGB).

In regard to the formation of images, there are available a simple matrix type in which individual organic EL elements that are arranged in a panel format on electrodes that are disposed in a matrix form, are directly driven; and an active matrix type in which a thin film transistor is disposed on each element and driven. The former is structurally simple, but since there is a limitation on the number of perpendicular pixels, this type is used in the display of characters and the like. The latter requires a low driving voltage and a small current only, and can provide bright high-precision images. Thus, this type is used for high-resolution display.

Furthermore, the lighting device of the invention is characterized by including the organic EL element of the invention described above. Furthermore, the display device of the invention is characterized by including a lighting device, and a liquid crystal element as a display means. The display device may be provided as a display device using a liquid crystal element as the display means, that is, a liquid crystal display device, by using the lighting device of the invention described above as the back light (white light emitting source). This configuration is a configuration in which only the back light is replaced with the lighting device of the invention in a known liquid crystal display device, and known technologies can be used appropriately for the liquid crystal element part.

EXAMPLES

Hereinafter, the invention will be more specifically described by way of Examples, but the invention is not intended to be limited to the following Examples.

Synthesis of Ionic Compounds

Ionic Compound Synthesis Example 1

Potassium tris(trifluoromethanesulfonyl)methide (1.01 g, 2.24 mmol) was introduced into a pear-shaped flask, and the compound was dissolved in ethyl acetate (20 mL). An ethyl acetate suspension solution (20 mL) of trityl tetrafluoroborate (0.73 g, 2.21 mmol) was slowly added dropwise to the solution, and the mixture was stirred for one hour at room temperature. The organic layer was thoroughly washed with water, and then the solvent was distilled off to dry the residue to a solid. Thus, 1.31 g of a target ionic compound A was obtained as a yellow powder. Yield: 90.5%.

The reaction scheme of this Synthesis Example is shown below.

[Chemical Formula 44]

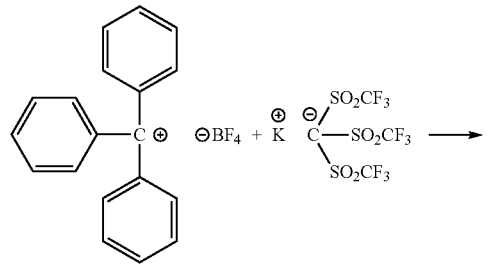

Ionic compound A

Ionic Compound Synthesis Example 2

Synthesis was carried out in the same manner as in Ionic Compound Synthesis Example 1, except that potassium tris(trifluoromethanesulfonyl)methide of the Ionic Compound Synthesis Example 1 was replaced with lithium bis(trifluoromethanesulfonyl)imide. A target ionic compound B was obtained as a yellow powder. Yield: 85.9%.

The reaction scheme of this Synthesis Example is shown below.

[Chemical Formula 45]

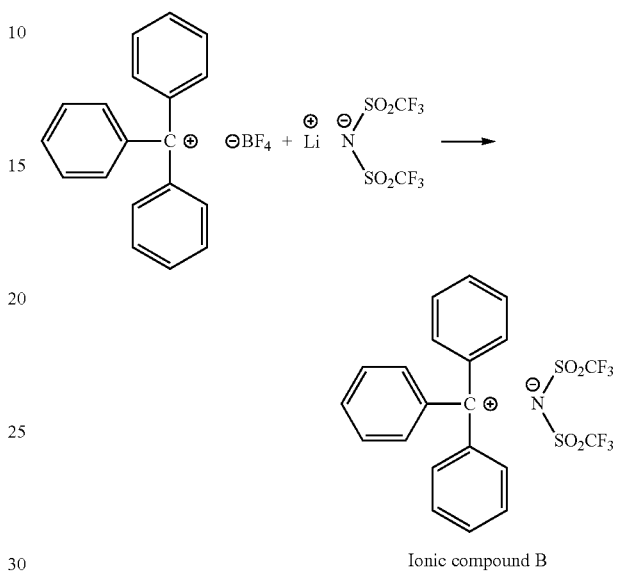

Ionic compound B

Ionic Compound Synthesis Example 3

Potassium tris(trifluoromethanesulfonyl)methide (0.57 g, 1.34 mmol) was introduced into a pear-shaped flask, and the compound was dissolved in ethyl acetate (10 mL). An ethyl acetate solution (10 mL) of diphenyliodonium hexafluorophosphate (0.60 g, 1.33 mmol) was slowly added dropwise to the solution, and the mixture was stirred for one hour at room temperature. The organic layer was thoroughly washed with water, and then the solvent was distilled off. Thus, 0.90 g of a target ionic compound C was obtained as a white powder. Yield: 97.0%.

The reaction scheme of this Synthesis Example is shown below.

[Chemical Formula 46]

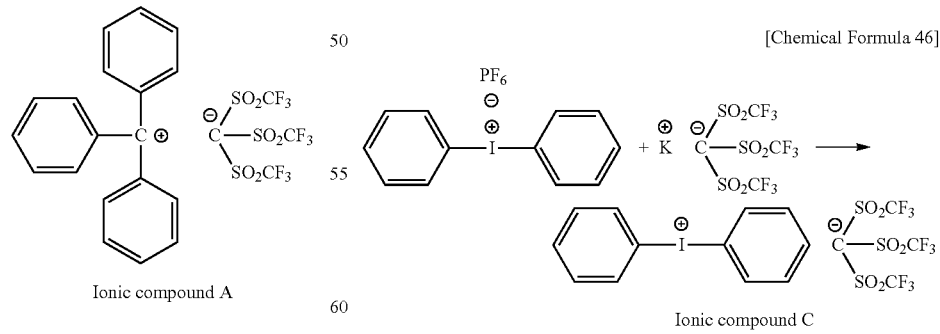

Ionic compound C

Ionic Compound Synthesis Example 4

Synthesis was carried out in the same manner, except that potassium tris(trifluoromethanesulfonyl)methide of the Ionic Compound Synthesis Example 3 was replaced with lithium bis(trifluoromethanesulfonyl)imide. A target ionic compound D was obtained as a white powder. Yield: 89.8%.

The reaction scheme of this Synthesis Example is shown below.

[Chemical Formula 47]

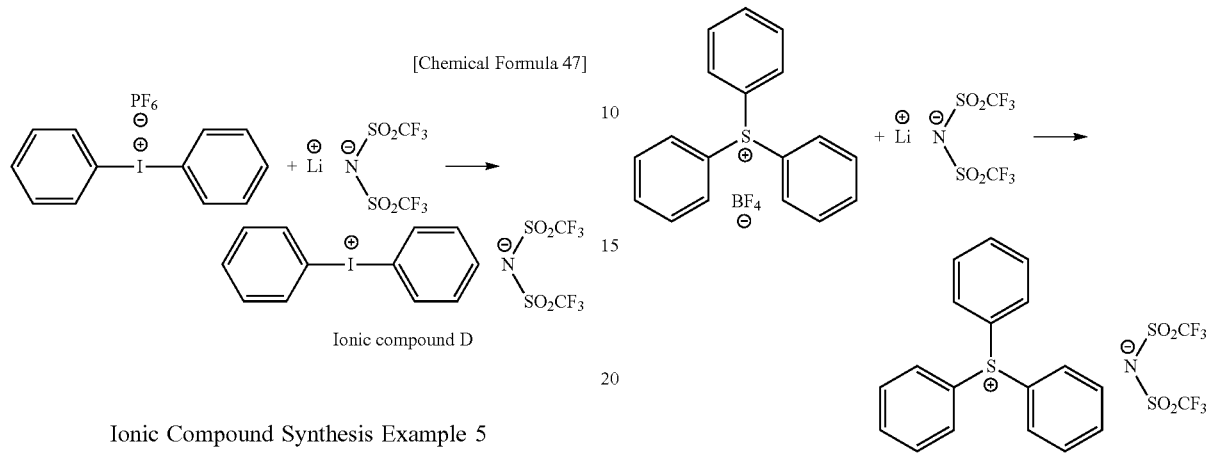

Ionic compound D

Ionic Compound Synthesis Example 5

Potassium tris(trifluoromethanesulfonyl)methide (0.76 g, 1.69 mmol) was introduced into a pear-shaped flask, and the compound was dissolved in ethyl acetate (10 mL). An ethyl acetate solution (10 mL) of triphenylsulfonium tetrafluoroborate (0.59 g, 1.69 mmol) was slowly added dropwise to the solution, and the mixture was stirred for one hour at room temperature. The organic layer was thoroughly washed with water, and then the solvent was distilled off. Thus, 1.04 g of a target ionic compound E was obtained as a white powder. Yield: 91.2%.

The reaction scheme of this Synthesis Example is shown below.

[Chemical Formula 48]

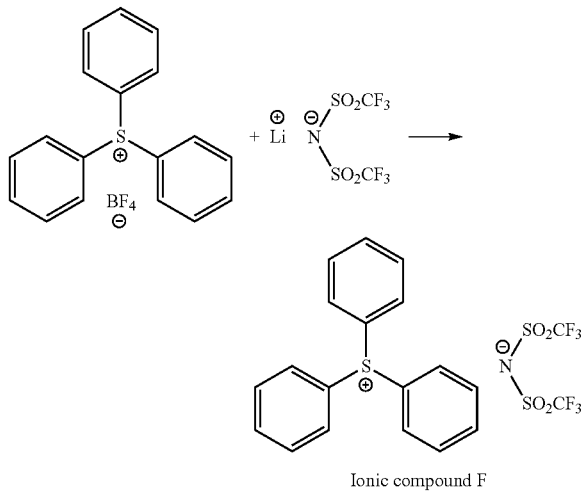

Ionic compound E

Ionic Compound Synthesis Example 6

Synthesis was carried out in the same manner, except that potassium tris(trifluoromethanesulfonyl)methide of the Ionic Compound Synthesis Example 5 was replaced with lithium bis(trifluoromethanesulfonyl)imide. A target ionic compound F was obtained as a white powder. Yield: 83.4%.

The reaction scheme of this Synthesis Example is shown below.

[Chemical Formula 49]

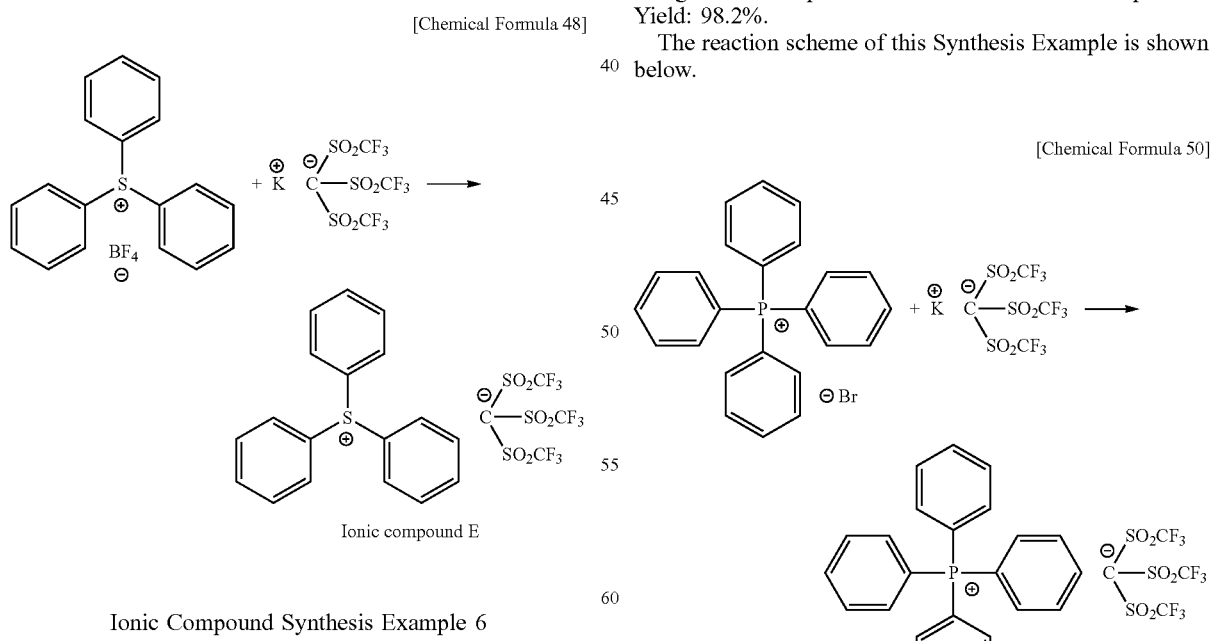

Ionic compound F

Ionic Compound Synthesis Example 7

Potassium tris(trifluoromethanesulfonyl)methide (0.52 g, 1.14 mmol) was introduced into a pear-shaped flask, and the compound was dissolved in ethyl acetate (10 mL). An ethyl acetate solution (10 mL) of tetraphenylphosphonium bromide (0.48 g, 1.14 mmol) was slowly added dropwise to the solution, and the mixture was stirred for one hour at room temperature. The organic layer was thoroughly washed with water, and then the solvent was distilled off. Thus, 0.84 g of a target ionic compound G was obtained as a white powder. Yield: 98.2%.

The reaction scheme of this Synthesis Example is shown below.

[Chemical Formula 50]

Ionic compound G

Ionic Compound Synthesis Example 8

Synthesis was carried out in the same manner, except that potassium tris(trifluoromethanesulfonyl)methide of the Ionic Compound Synthesis Example 7 was replaced with lithium bis(trifluoromethanesulfonyl)imide. A target ionic compound H was obtained as a white powder. Yield: 85.2%.

The reaction scheme of this Synthesis Example is shown below.

[Chemical Formula 51]

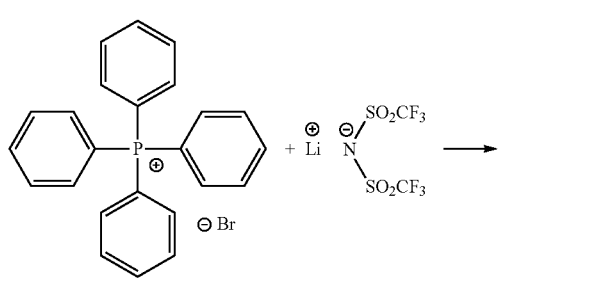

Ionic compound H

Ionic Compound Synthesis Example 9

Potassium tris(trifluoromethanesulfonyl)methide (4.50 g, 10.0 mmol) was introduced into a pear-shaped flask, and the compound was dissolved in ethyl acetate (10 mL). An ethyl acetate solution (10 mL) of trimethylphenylammonium chloride (1.72 g, 10.0 mmol) was slowly added dropwise to the solution, and the mixture was stirred for one hour at room temperature. The organic layer was thoroughly washed with water, and then the solvent was distilled off. Thus, 4.94 g of a target ionic compound I was obtained as a white powder. Yield: 90.2%.

The reaction scheme of this Synthesis Example is shown below.

[Chemical Formula 52]

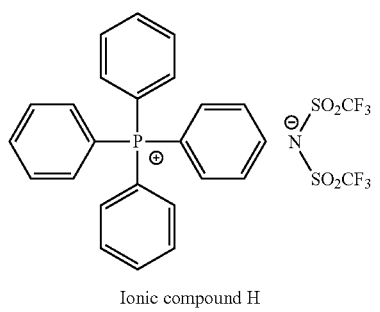

Ionic compound I

Synthesis of Monomer

Monomer Synthesis Example 1

3-Ethyl-3-hydroxymethyloxetane (50 mmol), 4-bromobenzyl bromide (50 mmol), n-hexane (200 mL), tetrabutylammonium bromide (2.5 mmol), and a 50 mass % aqueous solution of sodium hydroxide (36 g) were introduced into a round-bottom flask, and the mixture was heated under stirring for 6 hours at 70° C. under nitrogen.

The mixture was cooled to room temperature (25° C.), and then 200 mL of water was added thereto. The mixture was extracted with n-hexane. The solvent was distilled off, and then the residue was purified by silica gel column chromatography and distillation under reduced pressure. Thus, 9.51 g of a monomer A having a polymerizable substituent was obtained as a colorless oily substance. Yield: 67%.

The reaction scheme of this Synthesis Example is shown below.

[Chemical Formula 53]

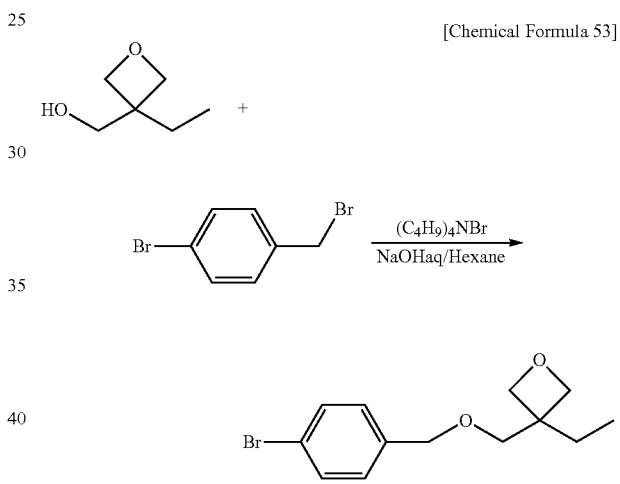

$^1$H-NMR (300 MHz, CDCl$_3$, δ ppm); 0.86 (t, J=7.5 Hz, 3H), 1.76 (t, J=7.5 Hz, 2H), 3.57 (s, 2H), 4.39 (d, J=5.7 Hz, 2H), 4.45 (d, J=5.7 Hz, 2H), 4.51 (s, 2H), 7.22 (d, J=8.4 Hz, 2H), 7.47 (d, J=8.4 Hz, 2H)

Synthesis of Charge Transporting Compound

Synthesis Example 1

2,7-Bis(4,4,5,5-tetramethyl-1,3,2-dioxaborolan-2-yl)-9,9-dioctylfluorene (0.4 mmol), 4,4'-dibromo-4'-n-butyltriphenylamine (0.32 mmol), the monomer A having a polymerizable substituent (0.16 mmol), tetrakis(triphenylphosphine)palladium (0.008 mmol), a 2 M aqueous solution of potassium carbonate (5.3 ml), Aliquat 336 (0.4 mmol) and anisole (4 ml) were introduced into a sealable container made of a fluororesin. The mixture was heated under stirring for 2 hours at 90° C. by irradiating microwaves in the container that had been sealed, in a nitrogen atmosphere.

The reaction scheme of this Synthesis Example is shown below.

[Chemical Formula 54]

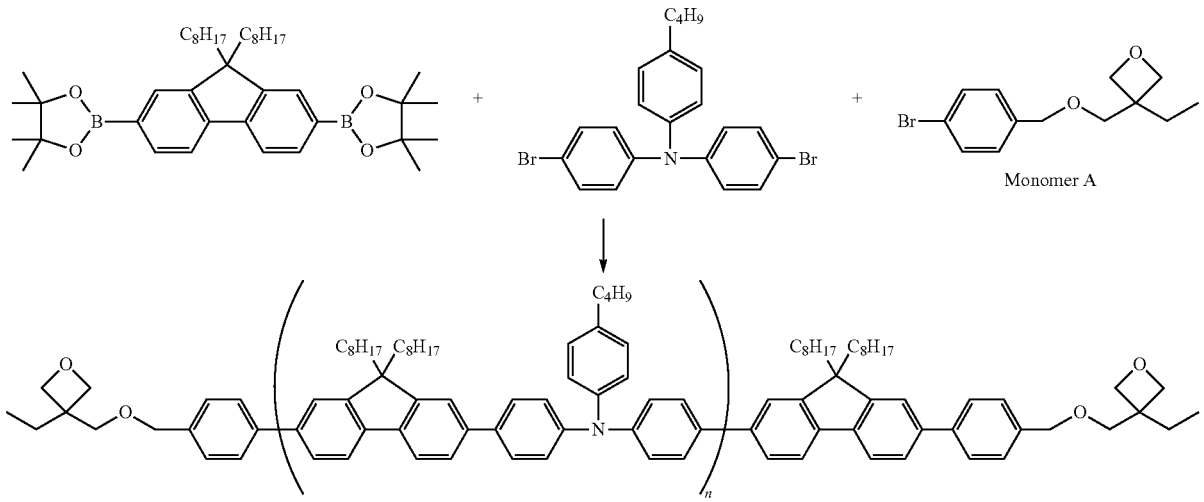

The reaction solution was poured into a solvent mixture of methanol/water (9:1), and a polymer precipitated therefrom was separated by filtration. The polymer was purified by repeating reprecipitation two times, and thus an oligomer A which contains a repeating unit having a polymerizable substituent and having hole transportability was obtained. The number average molecular weight of the oligomer A thus obtained was 4652 as calculated relative to standard polystyrene standards.

Preparation of Ink Composition

Example 1

The oligomer A (4.5 mg) obtained as described above was dissolved in toluene (465 μL), and an ethyl acetate solution of the ionic compound G (ionic compound G: 10 μg/1 μL, 50 μL) was added to the solution. Thus, an ink composition containing the organic electronic material of the present invention was prepared. There was no undissolved residue of the oligomer A and the ionic compound Q, and a uniform solution was obtained.

Comparative Example 1

An ink composition was prepared in the same manner, except that the ionic compound G used in Example 1 was replaced with tetraphenylphosphonium hexafluoroantimonate (manufactured by Alfa Easer Co.). However, undissolved residue was generated, and a uniform solution was not obtained. The ink composition was not suitable as a coating ink.

From a comparison between Example 1 and Comparative Example 1, it is understood that the organic electronic material of the present invention has high solubility in solvents, and is capable of forming a uniform solution and a uniform ink composition.

Production of Organic Thin Film Having Solvent Resistance

Example 2

The oligomer A (4.5 mg) obtained as described above was dissolved in toluene (465 μL), and an ethyl acetate solution of the ionic compound C (ionic compound C: 10 μg/1 μL, 50 μL) was added to the solution. Thus, an ink composition was prepared. By using this solution, spin coating was performed at a rate of 3000 min$^{-1}$ on a quartz glass plate, and the applied solution was heated for 10 minutes at 180° C. on a hot plate to cure. Thus, an organic thin film (film thickness: 60 nm) was formed. This organic thin film was rinsed, together with the quartz glass plate, in toluene, and the residual ratio of the thin film (residual film ratio) was determined from the ratio of the absorbances of the thin film before and after the rinsing. The residual film ratio was 98%.

Example 3

A thin film was produced in the same manner as in Example 2, except that the ionic compound C used in Example 2 was replaced with an ethyl acetate solution of the ionic compound D. The residual film ratio was determined, and it was found to be 99%.

Example 4

A thin film was produced in the same manner as in Example 2, except that the ionic compound C used in Example 2 was replaced with the ionic compound E. The residual film ratio was determined, and it was found to be 91%.

Example 5

A thin film was produced in the same manner as in Example 2, except that the ionic compound C used in Example 2 was replaced with the ionic compound F. The residual film ratio was determined, and it was found to be 70%.

Example 6

A thin film was produced in the same manner as in Example 2, except that the ionic compound C used in Example 2 was replaced with the ionic compound G. The residual film ratio was determined, and it was found to be 86%.

Example 7

A thin film was produced in the same manner as in Example 2, except that the ionic compound C used in Example 2 was replaced with the ionic compound H. The residual film ratio was determined, and it was found to be 75%.

Example 8

A thin film was produced in the same manner as in Example 2, except that the ionic compound C used in Example 2 was replaced with the following ionic compound J. The residual film ratio was determined, and it was found to be 99%.

[Chemical Formula 55]

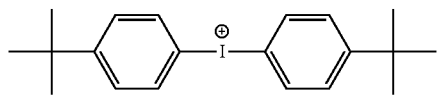
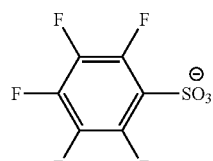

Ionic compound J

Example 9

A thin film was produced in the same manner as in Example 2, except that the ionic compound C used in Example 2 was replaced with the following ionic compound K. The residual film ratio was determined, and it was found to be 99%.

[Chemical Formula 56]

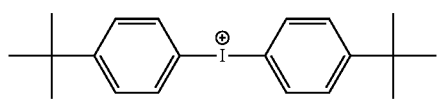

Ionic compound L

Example 10

A thin film was produced in the same manner as in Example 2, except that the ionic compound C used in Example 2 was replaced with the following ionic compound L. The residual film ratio was determined, and it was found to be 94%.

[Chemical Formula 57]

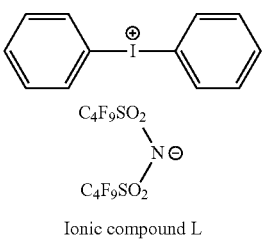

Ionic compound L

Example 11

A thin film was produced in the same manner as in Example 2, except that the ionic compound C used in Example 2 was replaced with the following ionic compound M. The residual film ratio was determined, and it was found to be 80%.

[Chemical Formula 58]

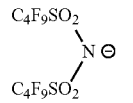

Ionic compound M

Comparative Example 2

A thin film was produced in the same manner as in Example 2, except that the ionic compound C used in Example 2 was replaced with diphenyliodonium hexafluorophosphate (manufactured by Sigma-Aldrich Co.). The residual film ratio was determined, and it was found to be 10%.

Comparative Example 3

A thin film was produced in the same manner as in Example 2, except that the ionic compound C used in Example 2 was replaced with triphenylsulfonium tetrafluoroborate (manufactured by Tokyo Chemical Industry Co., Ltd.). The residual film ratio was determined, and it was found to be 8%.

Comparative Example 4

A thin film was produced in the same manner as in Example 2, except that the ionic compound C used in Example 2 was replaced with tropylium hexafluorophosphate (manufactured by Tokyo Chemical Industry Co., Ltd.). The residual film ratio was determined, and it was found to be 13%.

The residual film ratios of the above Examples and Comparative Examples are presented in Table 1.

TABLE 1

| | Residual film ratio (%) |
|---|---|
| Example 2 | 98 |
| Example 3 | 99 |
| Example 4 | 91 |
| Example 5 | 70 |
| Example 6 | 86 |
| Example 7 | 75 |
| Example 8 | 99 |
| Example 9 | 99 |
| Example 10 | 94 |
| Example 11 | 80 |
| Comparative Example 2 | 10 |
| Comparative Example 3 | 8 |
| Comparative Example 4 | 13 |

As a result of comparisons between Examples 2 to 11 and Comparative Examples 2 to 4, the organic electronic material of the present invention can exhibit sufficient solvent resistance through curing. Furthermore, it is understood that the ionic compounds of the present invention function as polymerization initiators that can be cured at low temperatures. It is also understood that thereby, a laminated structure of organic thin films can be produced.

Production of Hole-Only Element

Example 12

On a glass substrate on which an ITO pattern had been formed at a width of 1.6 mm, a solution mixture of a toluene (525 µL) solution of the oligomer A (20 mg) and an ethyl acetate solution of the ionic compound E (ionic compound E: 10 µg/1 µL, 222 (L) was spin coated at a rate of 2000 min-1, and the applied solution mixture was heated for 10 minutes at 180(C on a hot plate. Subsequently, the glass substrate thus obtained was transferred into a vacuum deposition machine, and gold (film thickness: 30 nm) was deposited thereon.

After gold was deposited, the substrate was transferred to a dry nitrogen environment without being exposed to the atmosphere, and a sealing glass prepared by introducing 0.4-mm counterbores to a 0.7-mm alkali-free glass, and the ITO substrate were bonded by using a photocurable epoxy resin. Thus, a hole-only element was produced.

Comparative Example 5

A hole-only element was produced in the same manner as in Example 12, except that the ionic compound E used in Example 12 was not added. The subsequent experiment was carried out in air at room temperature (25(C).

Figure 2:
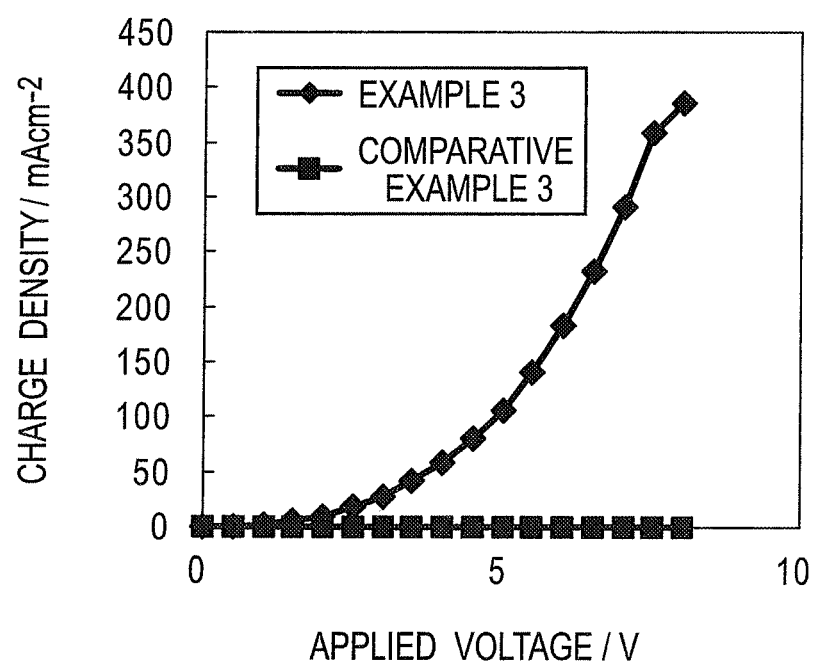
FIG. 2 is a diagram illustrating, as a graph, the relation of applied voltage and current density obtainable when a voltage is applied to a hole-only element which uses ITO as a positive electrode and Au as a negative electrode, in Comparative Example 3.

A graph of applied voltage against current density obtained when a voltage was applied to these, hole-only elements by using the ITO as a positive electrode and Au as a negative electrode is presented in FIG. 2. From FIG. 2, it can be seen that it is markedly easy for a hole current to flow in the element of Example 12, as compared with the element of Comparative Example 5.

Production of Organic EL Element

Example 13

On a glass substrate on which an ITO pattern was formed at a width of 1.6 mm, a coating solution prepared by mixing the oligomer A (4.5 mg) obtained as described above, the ionic compound E (0.45 mg), and toluene (1.2 ml) was spin coated at a rate of 3000 min-1, and then the applied coating solution was heated for 10 minutes at 180(C on a hot plate to cure. Thus, a hole injection layer (40 nm) was formed.

Subsequently, a mixture of CDBP (15 mg), FIr(pic) (0.9 mg), Ir(ppy)3 (0.9 mg), (btp)2Ir(acac) (1.2 mg), and dichlorobenzene (0.5 mL) was spin coated at a rate of 3000 rpm in nitrogen, and the mixture was dried for 5 minutes at 80(C. Thus, a light emitting layer (40 nm) was formed. Furthermore, BAlq (10 nm), Alq3 (30 nm), LiF (film thickness: 0.5 nm), and Al (film thickness: 100 nm) were deposited thereon in this order in the same manner as in Example 1, and the laminate was subjected to a sealing treatment. Thus, an organic EL element and a lighting device were produced.

A voltage was applied to this white organic EL element and the lighting device, and white light emission was observed at 3.5 V.

Comparative Example 6

A white organic EL element and a light device were produced in the same manner as in Example 13, except that none of the ionic compounds described above was added at the time of forming the hole injection layer.

A voltage was applied to this white organic EL element and the lighting device, and white light emission was observed at 10.0 V. However, the luminescence lifetime was ⅓ of the luminescence lifetime of Example 13.

Example 14

The oligomer A (10 mg) obtained as described above was dissolved in toluene (728 (L), and an ethyl acetate solution of the ionic compound C (ionic compound C: 10 (g/1 (L, 31 (L) was added thereto to prepare a coating solution. On a glass substrate on which an ITO pattern had been formed at a width of 1.6 mm, the coating solution was spin coated at a rate of 3000 min-1 in a nitrogen atmosphere, and then the coating solution was heated for 10 minutes at 180(C on a hot plate to cure. Thus, a hole injection layer (60 nm) was formed.

Subsequently, a mixture of the following yellow-green light emitting polymer (10 mg) and toluene (566 (L) was spin coated at a rate of 4000 min-1 in a nitrogen atmosphere, and then the mixture was dried for 5 minutes at 80(C. Thus, a light emitting layer (100 nm) was formed. Subsequently, the ITO glass substrate thus obtained was transferred into a vacuum deposition machine, and Ba (3 nm) and Al (100 nm) were deposited in this order.

After Al was deposited, the substrate was transferred to a dry nitrogen environment without being exposed to the atmosphere, and a sealing glass prepared by introducing 0.4-mm counterbores to a 0.7-mm alkali-free glass, and the ITO glass substrate were bonded by using a photocurable epoxy resin. Thus, an organic EL element was produced.

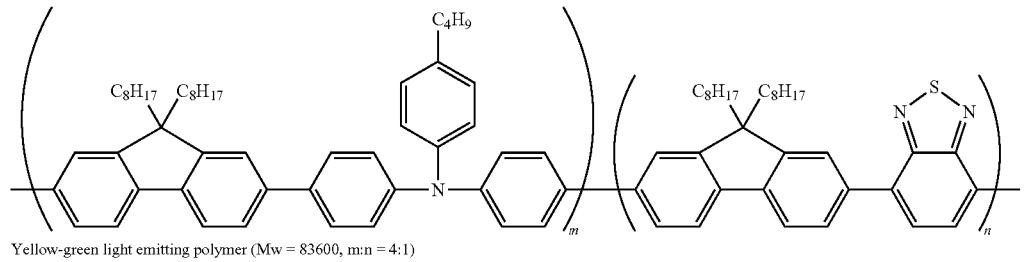

Yellow-green light emitting polymer (Mw = 83600, m:n = 4:1)

A voltage was applied to this organic EL element, and yellow-green light emission was observed at 3.5 V. The luminescence lifetime at an initial luminance of 1000 cd/m2 was 655 hours.

Comparative Example 7

An organic EL element was produced in the same manner, except that the ionic compound C used in Example 14 was replaced with the following ionic compound N, and a voltage was applied thereto. Yellow-green light emission was observed at 6.0 V, and the luminescence lifetime at an initial luminance of 1000 cd/m2 was 194 hours.

[Chemical Formula 60]

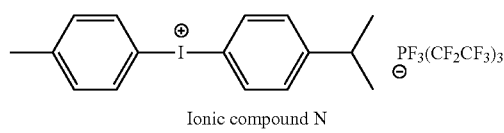

Ionic compound N

As comparisons are made between Example 13 and Comparative Example 6, and between Example 14 and Comparative Example 7, it can be seen that when the organic electronic material according to the present invention is applied, charge transportability is enhanced, and the organic EL elements and lighting devices can be driven at low voltages with long service lives.

REFERENCE SIGNS LIST

1 Light emitting layer
2 Positive electrode
3 Hole injection layer
4 Negative electrode
5 Electron injection layer
6 Hole transport layer
7 Electron transport layer
8 Substrate

The invention claimed is:

1. A method for producing a charge transport film, the method comprising:
adding at least one polymerization initiator to a charge transporting compound, the charge transporting compound including at least one of an aromatic amine comprising an aromatic ring directly bonded to a nitrogen atom, a carbazole and a thiophene compound, and
polymerizing the charge transporting compound after adding the at least one polymerization initiator to the charge transporting compound, such that polymerizing of the charge transporting compound takes place in the presence of the at least one polymerization initiator and forms the charge transport film so as to impart solvent resistance to the charge transport film,
wherein the at least one polymerization initiator includes at least one of Ionic compound A and Ionic compound J:

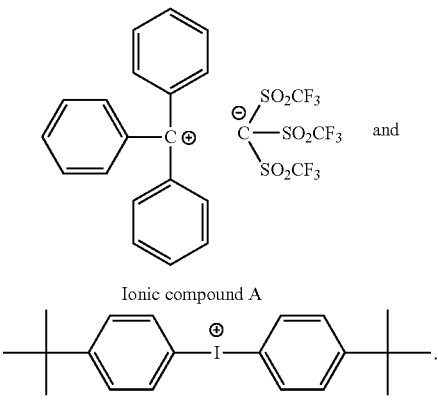

Ionic compound A

Ionic compound J

2. The method for producing a charge transport film according to claim 1, wherein the charge transporting compound is a polymer or an oligomer, and has at least one polymerizable substituent.

3. The method for producing a charge transport film according to claim 1, wherein the at least one polymerization initiator is added to the charge transporting compound in an amount of 0.1% to 50% by mass in the charge transport film.

4. A method for producing a charge transport film, the method comprising:
adding at least one polymerization initiator to a charge transporting compound, the charge transporting compound including at least one of an aromatic amine comprising an aromatic ring directly bonded to a nitrogen atom, a carbazole and a thiophene compound, and
polymerizing the charge transporting compound after adding the at least one polymerization initiator to the charge transporting compound, such that polymerizing of the charge transporting compound takes place in the presence of the at least one polymerization initiator and forms the charge transport film so as to impart solvent resistance to the charge transport film,
wherein the at least one polymerization initiator includes Ionic compound J:

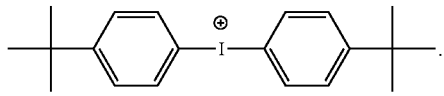

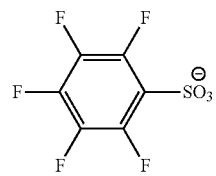

Ionic compound J

5. The method for producing a charge transport film according to claim 1, wherein the charge transport film comprises a property of a residual film ratio ranging from 75 to 99%, the residual film ratio being a ratio of an amount of a cured form of the charge transport film remaining after rinsing the cured form of the charge transport film with toluene to an amount of the cured form of the charge transport film before rinsing with toluene.

6. The method for producing a charge transport film according to claim 4, wherein the charge transport film comprises a property of a residual film ratio ranging from 75 to 99%, the residual film ratio being a ratio of an amount of a cured form of the charge transport film remaining after rinsing the cured form of the charge transport film with toluene to an amount of the cured form of the charge transport film before rinsing with toluene.

* * * * *